(12) United States Patent
Matsuzaki

(10) Patent No.: US 9,627,034 B2
(45) Date of Patent: Apr. 18, 2017

(54) ELECTRONIC DEVICE

(71) Applicant: Semiconductor Energy Laboratory Co., Ltd., Atsugi-shi, Kanagawa-ken (JP)

(72) Inventor: Takanori Matsuzaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/153,175

(22) Filed: May 12, 2016

(65) Prior Publication Data

US 2016/0336059 A1  Nov. 17, 2016

(30) Foreign Application Priority Data

May 15, 2015 (JP) .................................. 2015-099677

(51) Int. Cl.
*G11C 5/06* (2006.01)
*G11C 11/4091* (2006.01)
(Continued)

(52) U.S. Cl.
CPC ........ *G11C 11/4091* (2013.01); *G11C 11/409* (2013.01); *G11C 11/4094* (2013.01);
(Continued)

(58) Field of Classification Search
CPC .. G11C 7/065; G11C 7/12; G11C 7/18; G11C 7/22; G11C 8/08; G11C 11/4076;
(Continued)

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

EP  1737044 A  12/2006
EP  2226847 A  9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Gene Auduong
(74) *Attorney, Agent, or Firm* — Fish & Richardson P.C.

(57) ABSTRACT

Provided is an electronic device including a circuit for reading data from a memory cell that can store multilevel data. The electronic device includes a memory cell array region, N sense amplifier regions, and switching elements. The memory cell array region includes memory cells that store, when (N+1)-level data is stored, the (N+1)-level data as different potentials. Each of the N sense amplifier regions compares a read potential, which depends on a charge released to a bit line and a wiring or the like connected thereto, with a reference potential and performs amplification. Each of the switching elements electrically isolates a sense amplifier region from the other sense amplifier regions after all of the N sense amplifier regions are electrically connected to the bit line. Each of the sense amplifier regions can output a write potential to the bit line.

18 Claims, 30 Drawing Sheets

(51) Int. Cl.

| | | |
|---|---|---|
| G11C 11/4094 | (2006.01) | |
| G11C 11/4097 | (2006.01) | |
| G11C 11/409 | (2006.01) | |
| H01L 29/786 | (2006.01) | |
| H01L 27/12 | (2006.01) | |
| H01L 23/528 | (2006.01) | |
| H01L 29/24 | (2006.01) | |
| H01L 27/108 | (2006.01) | |

(52) U.S. Cl.
CPC ........ *G11C 11/4097* (2013.01); *H01L 23/528* (2013.01); *H01L 27/10808* (2013.01); *H01L 27/1225* (2013.01); *H01L 27/1255* (2013.01); *H01L 29/24* (2013.01); *H01L 29/7869* (2013.01)

(58) Field of Classification Search
CPC .......... G11C 11/4087; G11C 11/40618; G11C 11/4091; G11C 2207/104; G11C 2207/229
USPC ...... 365/51, 52, 63, 185.09, 189.01, 189.09, 365/189.07, 189.16, 222
See application file for complete search history.

(56) References Cited

U.S. PATENT DOCUMENTS

| | | | |
|---|---|---|---|
| 6,294,274 | B1 | 9/2001 | Kawazoe et al. |
| 6,356,485 | B1 * | 3/2002 | Proebsting ............. G11C 7/065 257/E21.659 |
| 6,456,548 | B2 * | 9/2002 | Sudo ...................... G11C 7/065 365/191 |
| 6,456,549 | B1 * | 9/2002 | Sudo ...................... G11C 7/065 365/191 |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2012/0106281 | A1 * | 5/2012 | Kim ........................ G11C 7/06 365/203 |
| 2013/0155790 | A1 | 6/2013 | Atsumi |
| 2015/0294710 | A1 | 10/2015 | Onuki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-192083 A | 8/1989 |
| JP | 05-251705 A | 9/1993 |
| JP | 08-264794 A | 10/1996 |
| JP | 11-110974 A | 4/1999 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |

(56) References Cited

FOREIGN PATENT DOCUMENTS

| JP | 2004-273614 A | 9/2004 |
|---|---|---|
| JP | 2004-273732 A | 9/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel displats", AM-FPD '08 digest of Technical Papers, Jul. 2, 2008, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display). 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials). 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc3O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by Dc Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Lewsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using sincle-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev.B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 203, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

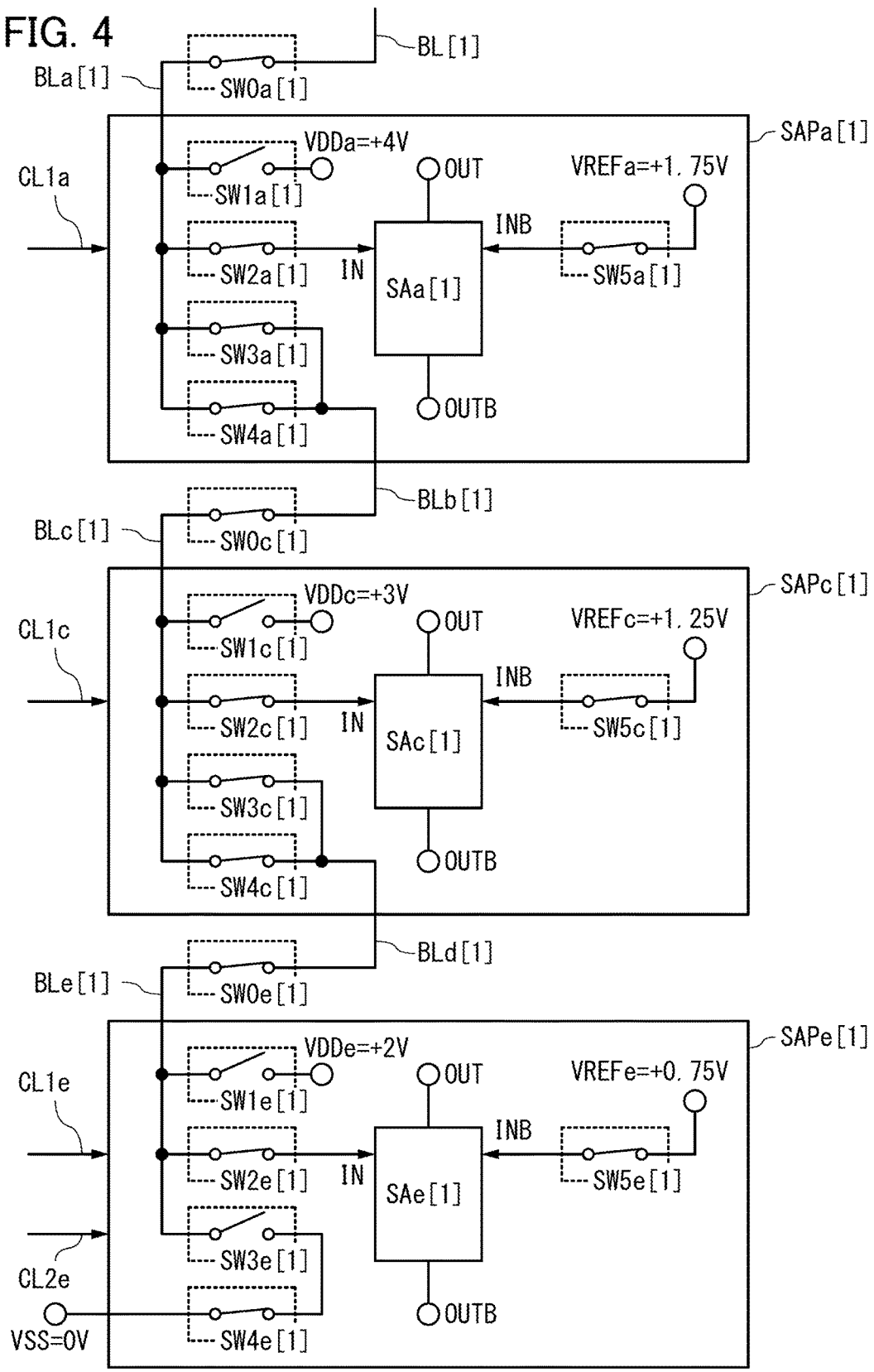

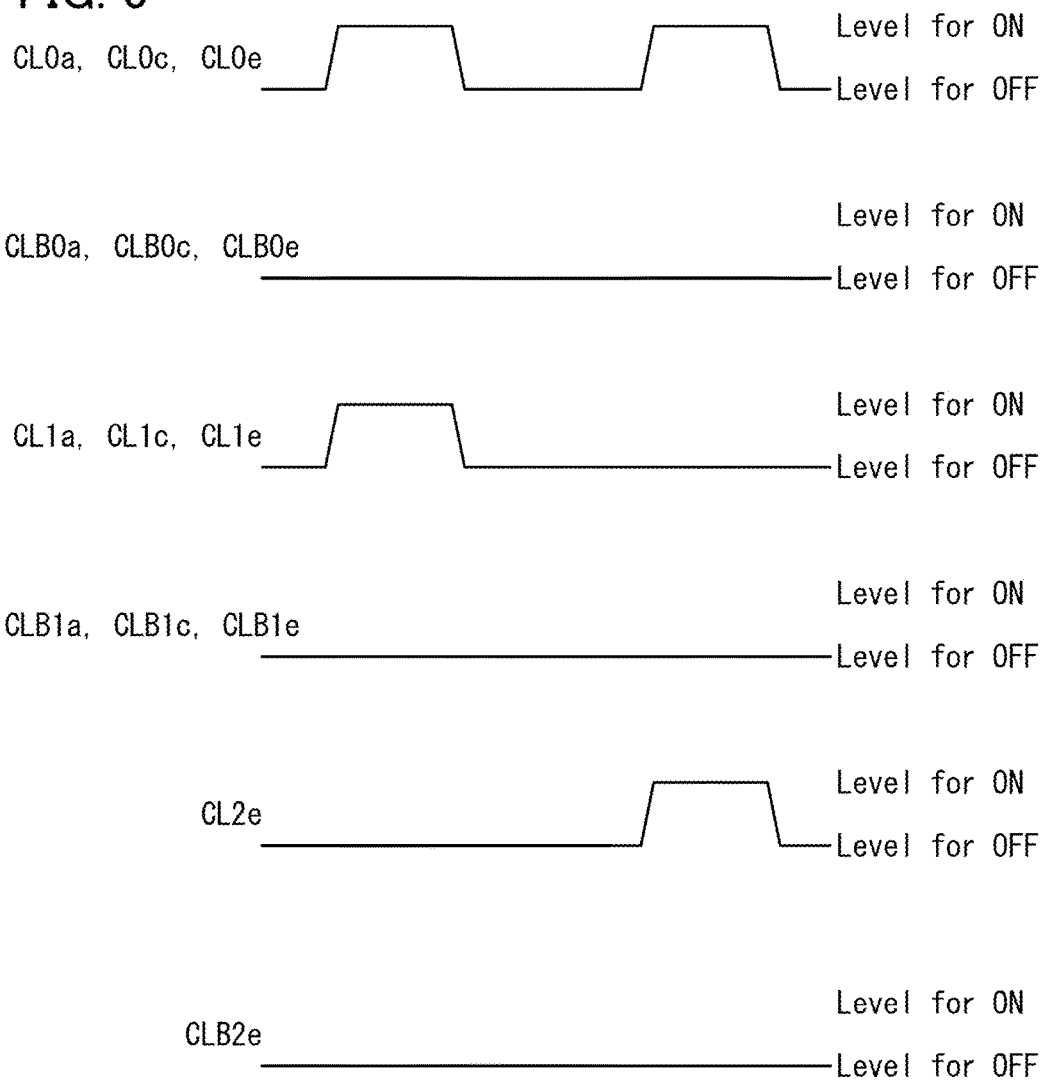

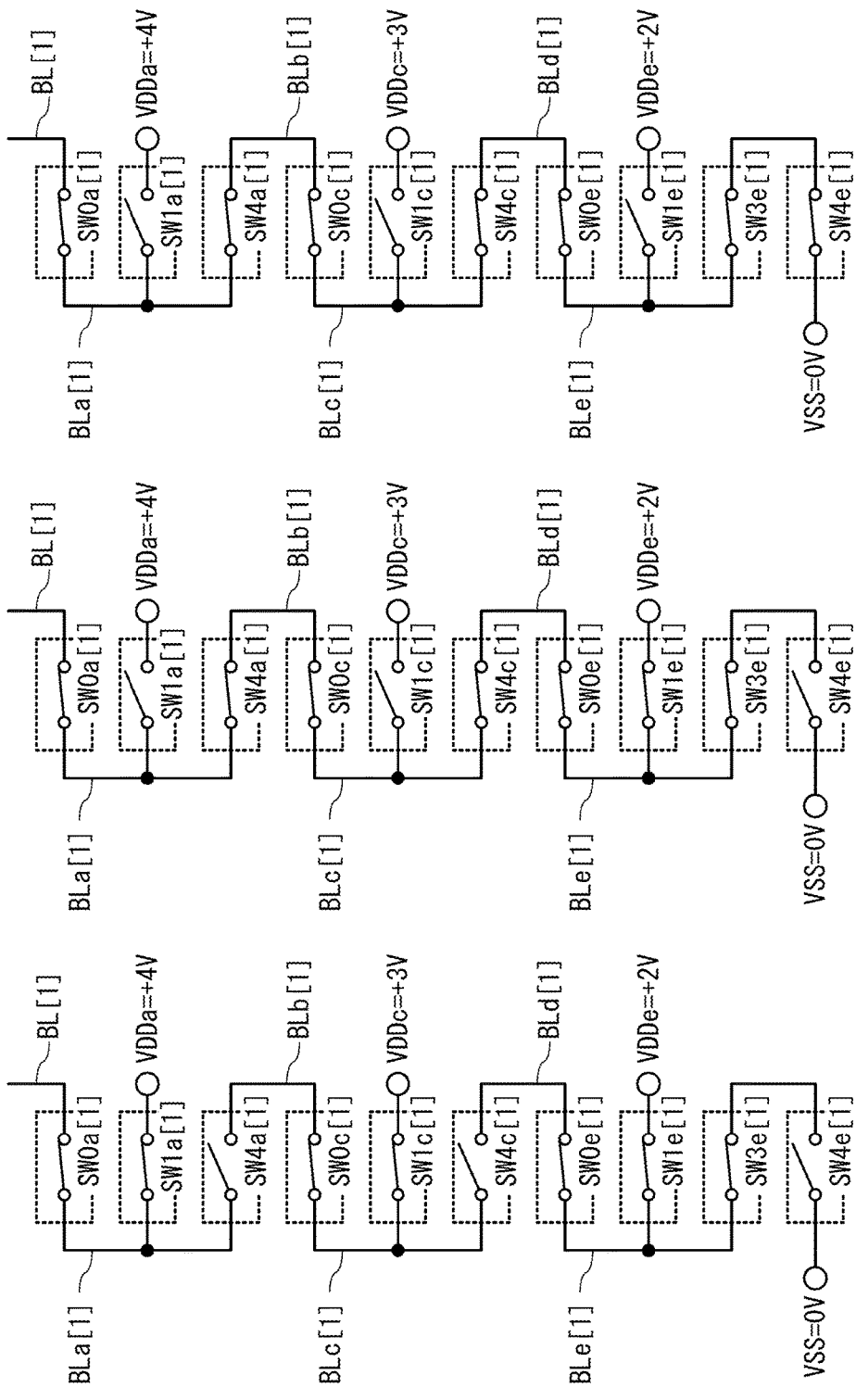

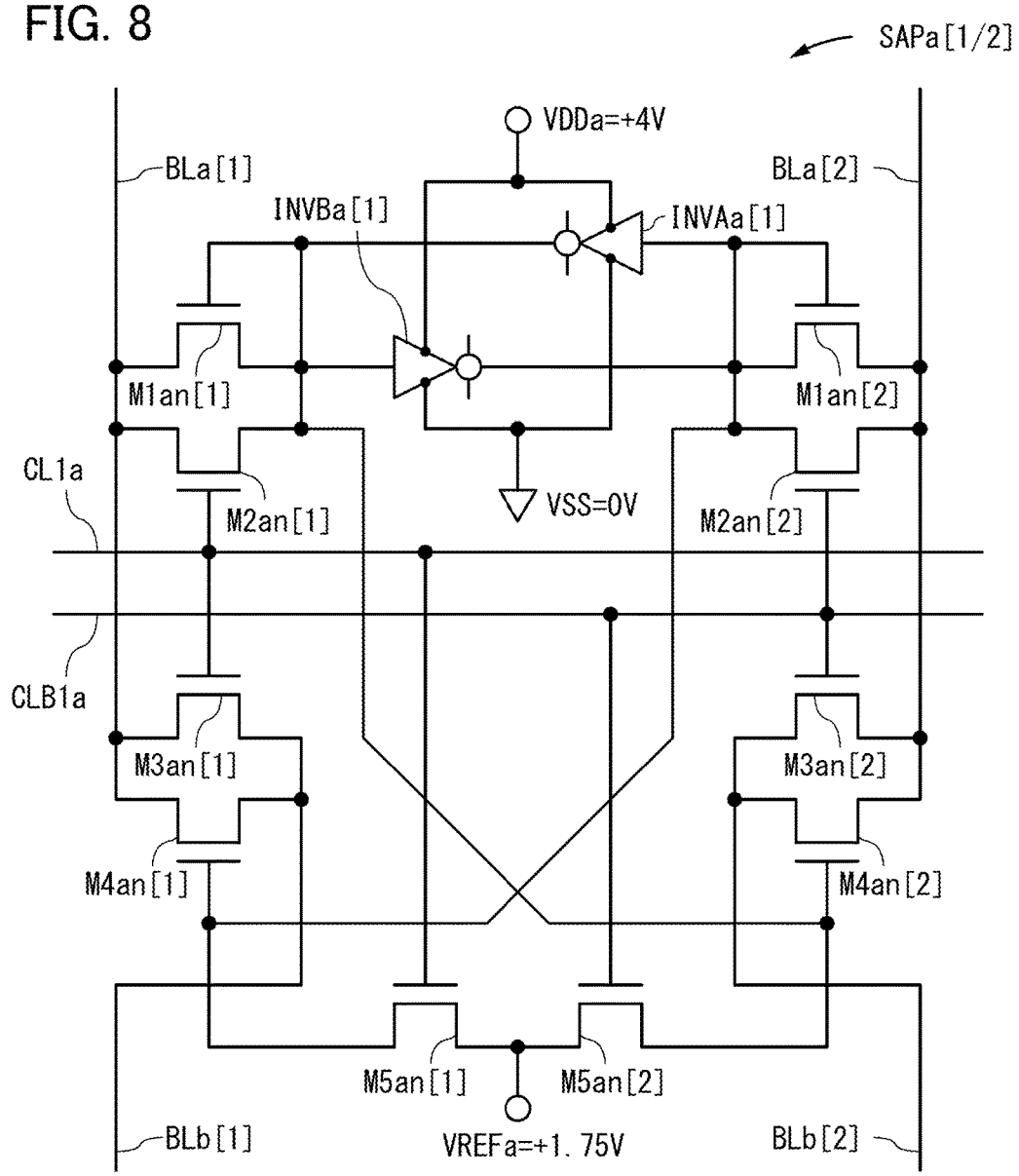

FIG. 21A
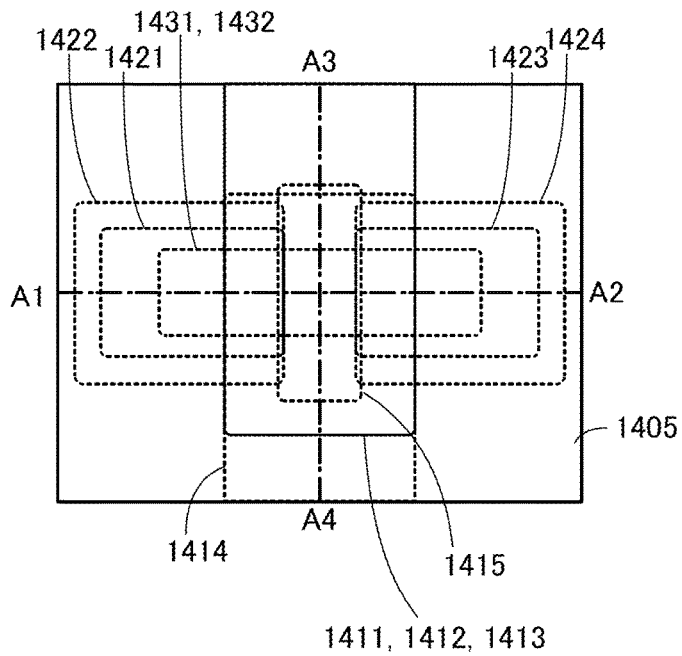
FIG. 21B
FIG. 21C
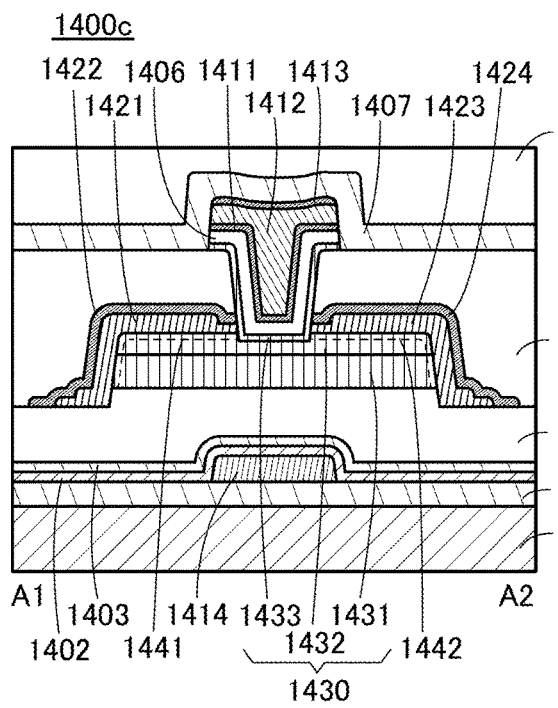
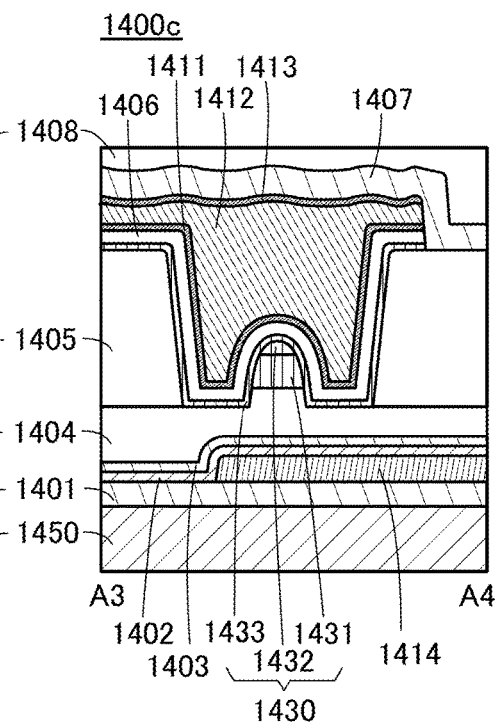

FIG. 24A
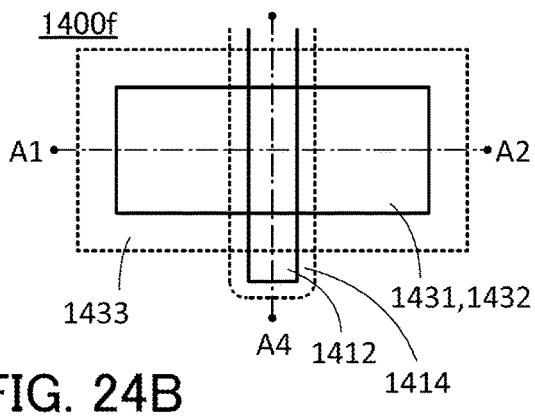
FIG. 24B
FIG. 24C
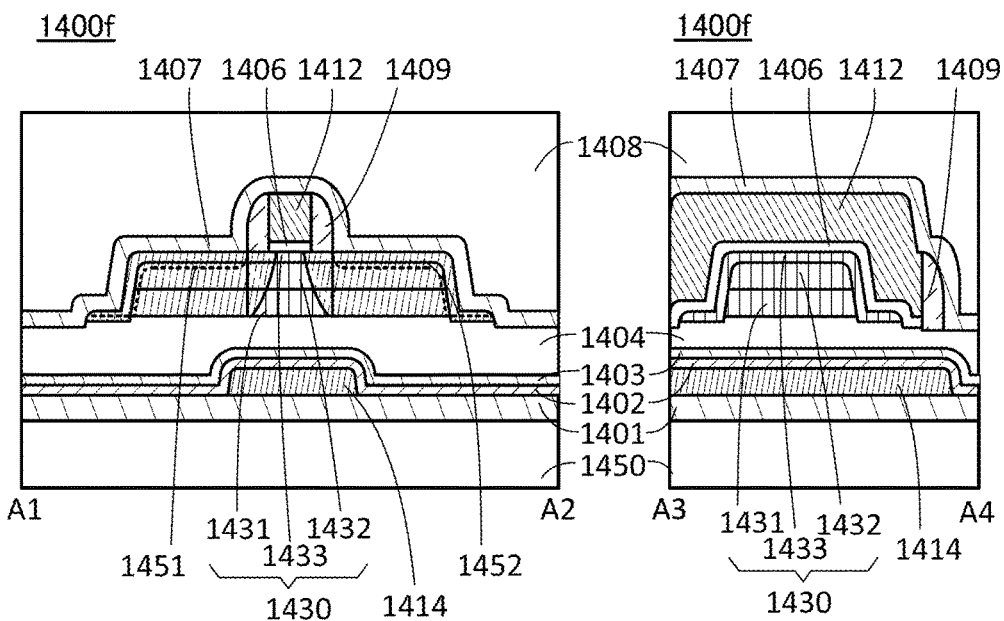
FIG. 24D
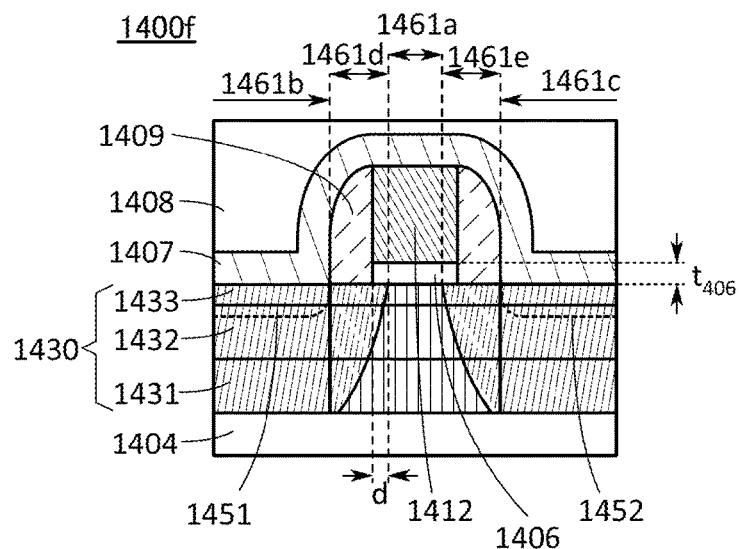

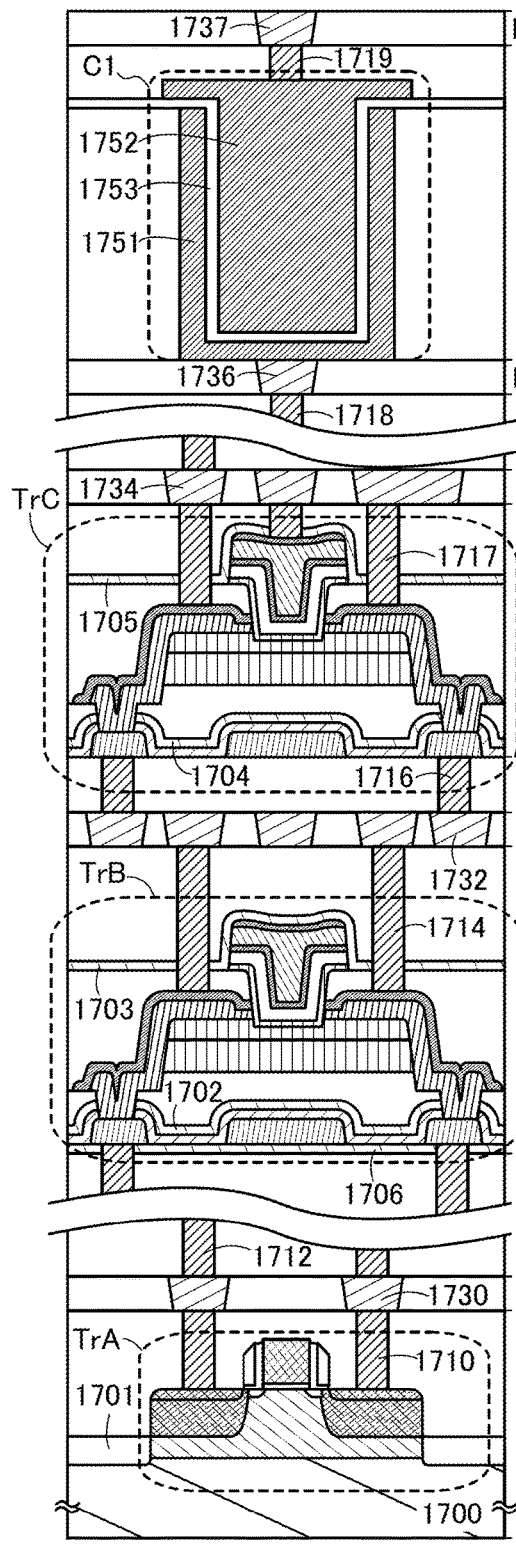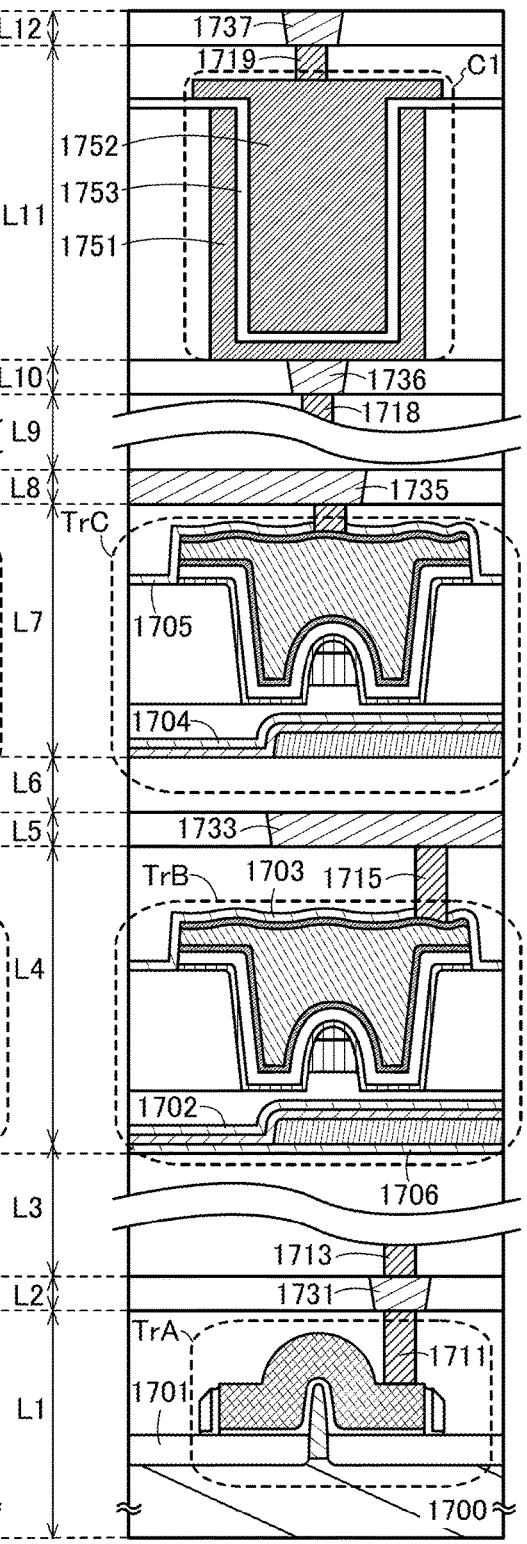

ELECTRONIC DEVICE

BACKGROUND OF THE INVENTION

1. Field of the Invention

This disclosure relates to an electronic device including a memory cell.

2. Description of the Related Art

A multilevel memory in which data with more than one bit can be stored in one memory cell and a multibit memory in which data with two or more bits can be stored in one memory cell are each a promising technology for increasing the degree of integration of a memory. The technology has already been employed in flash memories.

Patent Document 1 and Patent Document 2 each disclose a technique relating to reading of multilevel data and rewriting of the read data in a one-transistor one-capacitor DRAM cell (1T1C-DRAM).

For example, Patent Document 2 discloses a technique comprising the steps of supplying the potential of a bit line at the time when the charge of a memory cell is released (i.e., a read potential) to a plurality of sense amplifiers, electrically isolating the sense amplifiers from each other, amplifying and outputting a difference between the reference potential of each sense amplifier and the read potential in each sense amplifier, and supplying an output of only a specific sense amplifier to the bit line.

REFERENCE

Patent Documents

[Patent Document 1] Japanese Published Patent Application No. H1-192083
[Patent Document 2] Japanese Published Patent Application No. H11-110974

SUMMARY OF THE INVENTION

Disclosed are an electronic device including a memory with a novel structure and the driving method thereof.

Provided is an electronic device including a bit line, first to N-th switching elements, and first to N-th sense amplifier regions. The first to the N-th sense amplifier regions each include a first terminal. The first to the (N−1)-th sense amplifier regions each include a second terminal. The first terminal of the n-th sense amplifier region, the second terminal of the n-th sense amplifier region, the first terminal of the (n+1)-th sense amplifier region, and the second terminal of the (n+1)-th sense amplifier region are arranged in this order in a circuit diagram. The first switching element is between the bit line and the first terminal of the first sense amplifier region. The first switching element is configured to electrically connect or electrically isolate the bit line and the first terminal of the first sense amplifier region. The (n+1)-th switching element is between the second terminal of the n-th sense amplifier region and the first terminal of the (n+1)-th sense amplifier region. The (n+1)-th switching element is configured to electrically connect or electrically isolate the second terminal of the n-th sense amplifier region and the first terminal of the (n+1)-th sense amplifier region. The first to the N-th sense amplifier regions each include a sense amplifier and a switch that operates in accordance with an output of the sense amplifier. The switch is configured to electrically connect or electrically isolate the first terminal and the second terminal. At the time when the sense amplifiers terminate an amplification process, (A) the bit line is electrically connected to the first terminal of the m-th sense amplifier region and the first terminal and the second terminal are electrically isolated from each other in each of the m-th to the (N−1)-th sense amplifier regions, or (B) the bit line is electrically connected to the first terminal of the N-th sense amplifier region. A potential of the bit line corresponds to a read potential. Note that N is an integer greater than or equal to 2, n is an integer greater than or equal to 1 and less than or equal to (N−1), and m is an integer that is determined in accordance with the read potential and is greater than or equal to 1 and less than or equal to (n−1).

Provided is the electronic device in which each of the first to the (N−1)-th sense amplifier regions is configured to supply a write potential to the first terminal in accordance with one of or both a first output signal and a second output signal of the sense amplifier.

Provided is the electronic device in which each of the first to the (N−1)-th sense amplifier regions is configured to electrically connect or electrically isolate the first terminal and the second terminal in accordance with one of or both a first output signal and a second output signal of the sense amplifier.

Provided is the electronic device in which the first terminal and the second terminal are configured to be electrically isolated from each other when the write potential is supplied to the first terminal.

Provided is the electronic device in which the write potential of the n-th sense amplifier region is configured to be higher than the write potential of the (n+1)-th sense amplifier region.

Provided is the electronic device in which a potential of the first terminal is configured to be input to a first input terminal of the sense amplifier in a first period, and a reference potential is configured to be input to a second input terminal of the sense amplifier in a second period. The first period and the second period overlap with each other.

Provided is the electronic device in which the reference potential of the n-th sense amplifier region is configured to be higher than the write potential of the (n+1)-th sense amplifier region.

Provided is the electronic device in which the write potential is configured to be equal to the first output signal of the sense amplifier.

Embodiments can be referred to for other solutions.

As described later, an electronic device including a DRAM from which multilevel data can be read at high speed or a memory equivalent to the DRAM can be provided.

BRIEF DESCRIPTION OF THE DRAWINGS

FIG. 4 illustrates a configuration example of an R/W circuit.

FIG. 5 illustrates an operation example of an R/W circuit.

FIGS. 6A to 6C each illustrate an operation example of an R/W circuit.

FIG. 8 illustrates a configuration example of a sense amplifier region.

FIGS. 21A to 21C are a top view and cross-sectional views illustrating a structural example of a transistor.

FIGS. 24A to 24D are a top view and cross-sectional views illustrating a structural example of a transistor.

FIGS. 26A and 26B are cross-sectional views illustrating a structural example of a transistor.

DETAILED DESCRIPTION OF THE INVENTION

Figure 1:
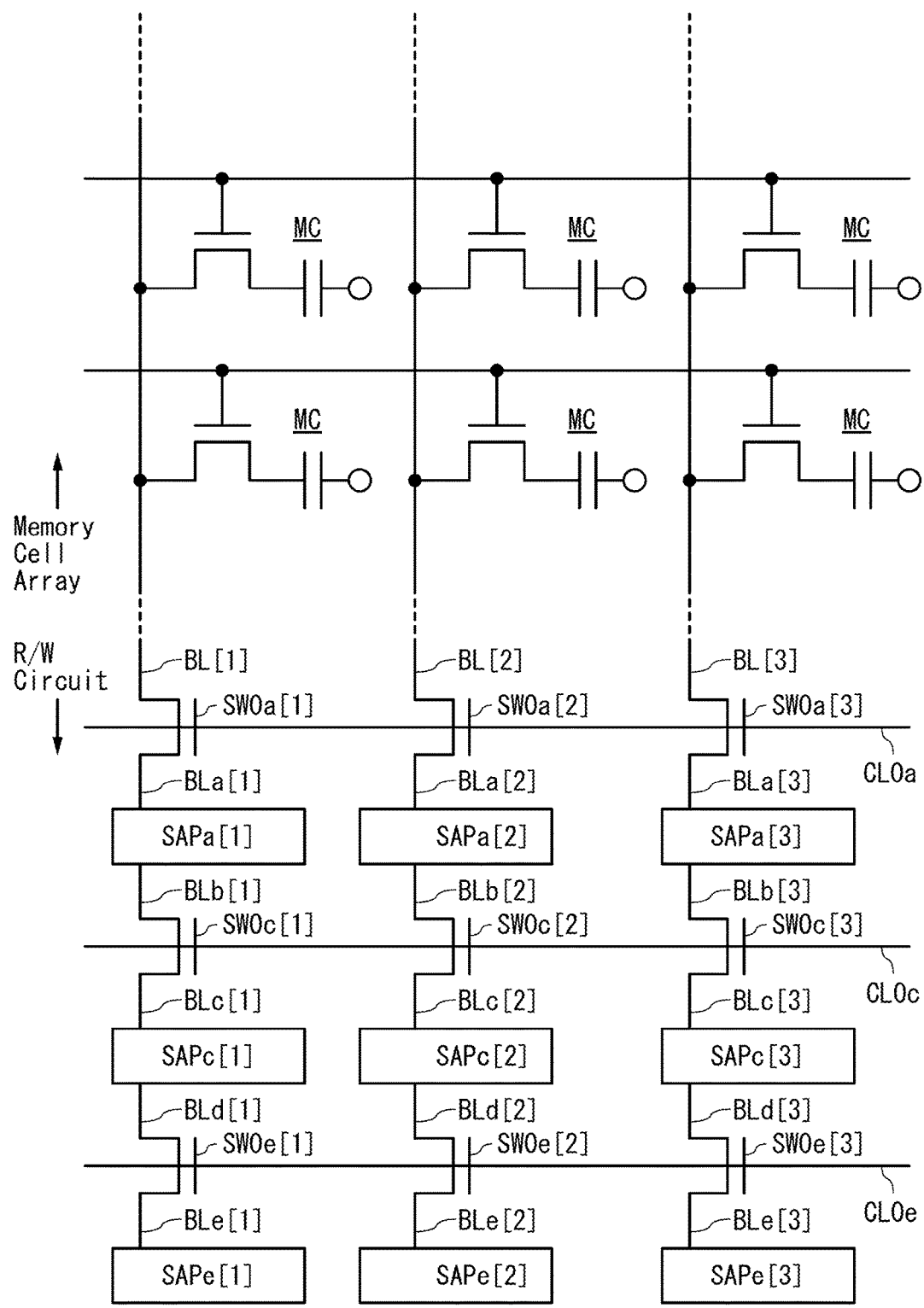
FIG. 1 illustrates a configuration example of an electronic device.

Embodiments will be described below in detail with reference to the drawings. Note that the embodiments are not limited to the following description, and it will be easily understood by those skilled in the art that various changes and modifications can be made without departing from the spirit and scope and that, for example, techniques in this disclosure can be combined and a technique in this disclosure and a technique other than that can be combined.

In this disclosure, drawings illustrate only the requisite minimum for simplicity in some cases. It is needless to say that any of a variety of circuit elements (including a switch, a transistor, a capacitor, a resistor, and an inductor) can be added to increase convenience, operability, performance, or the like, or to achieve other objectives. Furthermore, circuit elements whose operation can be individually controlled may be achieved through a description of a plurality of circuit elements that operate at the same time.

Therefore, this disclosure should not be interpreted as being limited to the following description of the embodiments. In the following embodiments, the same portions or portions having similar functions are denoted by the same reference numerals in different drawings, and explanation thereof will not be repeated, in some cases.

Although a specific number of bits, a specific potential, or a specific voltage is used for easy understanding in embodiments below, a circuit can be appropriately operated even with a different number of bits, a different potential, or a different voltage. Note that in drawings, for example, "[1]" indicates an object in the first column and "[1/2]" indicates an object used for both the first column and the second column. For example, a "bit line BL[2]" is a bit line in the second column, and a "sense amplifier region SAPc[1/2]" is a sense amplifier region SAPc used for both the first column and the second column. In the case where the column is not specified, a "bit line BL" or a "sense amplifier region SAPc" is used, for example.

A technique described in any of the following embodiments can be combined with a technique described in the embodiment, a technique described in another embodiment, or another technique.

Embodiment 1

Described in this embodiment is an electronic device including a circuit for reading data from a memory cell that can store multilevel data. The electronic device in this embodiment includes a memory cell array region, N sense amplifier regions, and switching elements. The memory cell array region includes memory cells that store, when (N+1)-level data is stored, the (N+1)-level data as different potentials. Each of the N sense amplifier regions compares a read potential, which depends on a charge released to a bit line (and a wiring or the like connected thereto), with a reference potential and performs amplification. Each of the switching elements electrically isolates the N sense amplifier regions from one another after all of the N sense amplifier regions are electrically connected to the bit line. Each of the sense amplifier regions can output a write potential to the bit line. The closer the sense amplifier region is to the bit line, the higher the write potential and the reference potential used therein are.

Configuration Example 1 of Electronic Device

FIG. 1 is a block diagram illustrating part of an electronic device described in this embodiment. The electronic device includes a memory cell array region (upper half of FIG. 1) and a read/write circuit (R/W circuit) region (lower half of FIG. 1). Although a memory cell array in FIG. 1 includes memory cells MC of a 1T1C (one cell transistor and one capacitor) type, memory cells used in the electronic device are not limited thereto as long as a source and a drain of one cell transistor are between one bit line and one capacitor.

Described in the following example is an R/W circuit from which 4-level data can be read. Thus, the R/W circuit includes three sense amplifier regions (a sense amplifier region SAPa, a sense amplifier region SAPc, and a sense amplifier region SAPe). The sense amplifier region SAPa, the sense amplifier region SAPc, and the sense amplifier region SAPe each include a sense amplifier.

The R/W circuit includes a switch SW0$a$ between a bit line BL and the sense amplifier region SAPa, a switch SW0$c$ between the sense amplifier region SAPa and the sense amplifier region SAPc, and a switch SW0$e$ between the sense amplifier region SAPc and the sense amplifier region SAPe. The switch SW0$a$, the switch SW0$c$, and the switch SW0e are controlled by a control line CL0a, a control line CL0c, and a control line CL0e, respectively.

Accordingly, the bit line BL and the sense amplifier region SAPa can be electrically connected to or electrically isolated from each other using the switch SW0a, the sense amplifier region SAPa and the sense amplifier region SAPc can be electrically connected to or electrically isolated from each other using the switch SW0c, and the sense amplifier region SAPc and the sense amplifier region SAPe can be electrically connected to or electrically isolated from each other using the switch SW0e.

Note that in FIG. 1, a wiring between the switch SW0a and the sense amplifier region SAPa is a wiring BLa, a wiring between the sense amplifier region SAPa and the switch SW0c is a wiring BLb, a wiring between the switch SW0c and the sense amplifier region SAPc is a wiring BLc, a wiring between the sense amplifier region SAPc and the switch SW0e is a wiring BLd, and a wiring between the switch SW0e and the sense amplifier region SAPe is a wiring BLe.

As described above, the switch SW0a can be used to electrically connect/isolate the bit line BL to/from the sense amplifier region SAPa. However, the switch SW0a is not necessarily provided because the bit line BL and the sense amplifier region SAPa can be electrically connected to each other all the time.

The control line CL0a, the control line CL0c, and the control line CL0e may be supplied with the same signal so that, for example, the switch SW0a, the switch SW0c, and the switch SW0e are on or off at the same time. In that case, the control line CL0a, the control line CL0c, and the control line CL0e are practically the same.

Configuration Example 2 of Electronic Device

Figure 2:
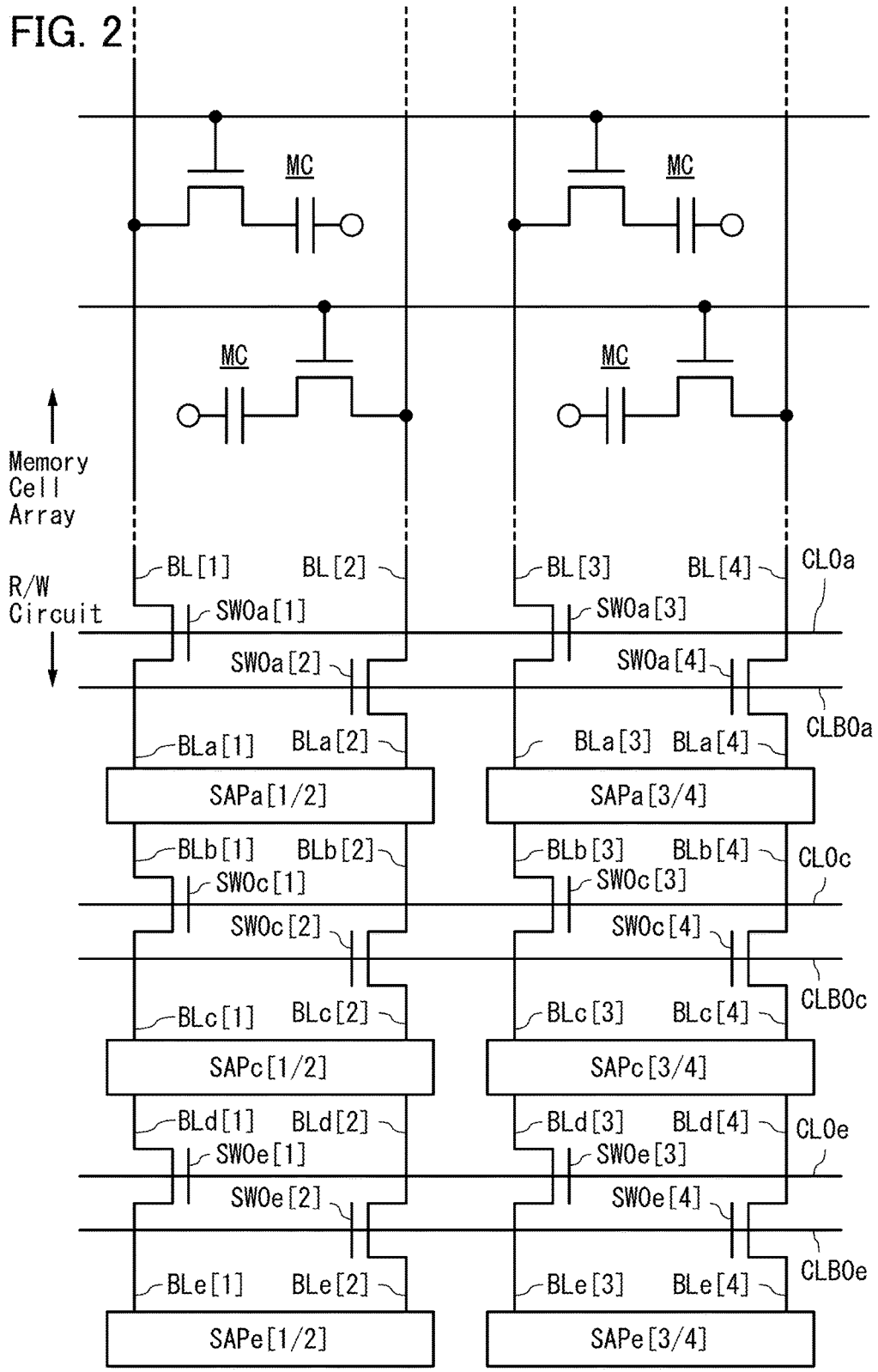
FIG. 2 illustrates a configuration example of an electronic device.

FIG. 2 illustrates another example of an electronic device. In the electronic device illustrated in FIG. 2, one sense amplifier region (e.g., the sense amplifier region SAPa[1/2]) can be used for reading data from memory cells connected to two bit lines (the bit line BL[1] and the bit line BL[2]).

Note that the switch SW0a[1] provided between the bit line BL[1] and the wiring BLa[1] and the switch SW0a[2] provided between the bit line BL[2] and the wiring BLa[2] can be controlled independently of each other. Similarly, the switch SW0c[1] provided between the wiring BLb[1] and the wiring BLc[1] and the switch SW0c[2] provided between the wiring BLb[2] and the wiring BLc[2] can be controlled independently of each other. Furthermore, the switch SW0e[1] provided between the wiring BLd[1] and the wiring BLe[1] and the switch SW0e[2] provided between the wiring BLd[2] and the wiring BLe[2] can be controlled independently of each other.

In other words, the switch SW0a[1] is controlled by the control line CL0a and the switch SW0a[2] is controlled by a control line CLB0a. Similarly, the switch SW0c[1] is controlled by the control line CL0c, the switch SW0c[2] is controlled by a control line CLB0c, the switch SW0e[1] is controlled by the control line CL0e, and the switch SW0e[2] is controlled by a control line CLB0e.

Typically, the switch SW0a[1], the switch SW0c[1], and the switch SW0e[1] are configured not to be on at the same time as the switch SW0a[2], the switch SW0c[2], and the switch SW0e[2], respectively.

For example, the switches SW0a[1], SW0c[1], and SW0e[1] are configured to operate with the same signal, the switches SW0a[2], SW0c[2], and SW0e[2] are configured to operate with the same signal, and the switches SW0a[1] and SW0a[2] are configured not to be on at the same time.

Note that the switch SW0a[1] and the switch SW0a[2] are not necessarily provided because the bit line BL[1] and the bit line BL[2] can be electrically connected to the sense amplifier region SAPa[1/2] all the time in the electronic device illustrated in FIG. 2.

Configuration Example 3 of Electronic Device

Figure 3:
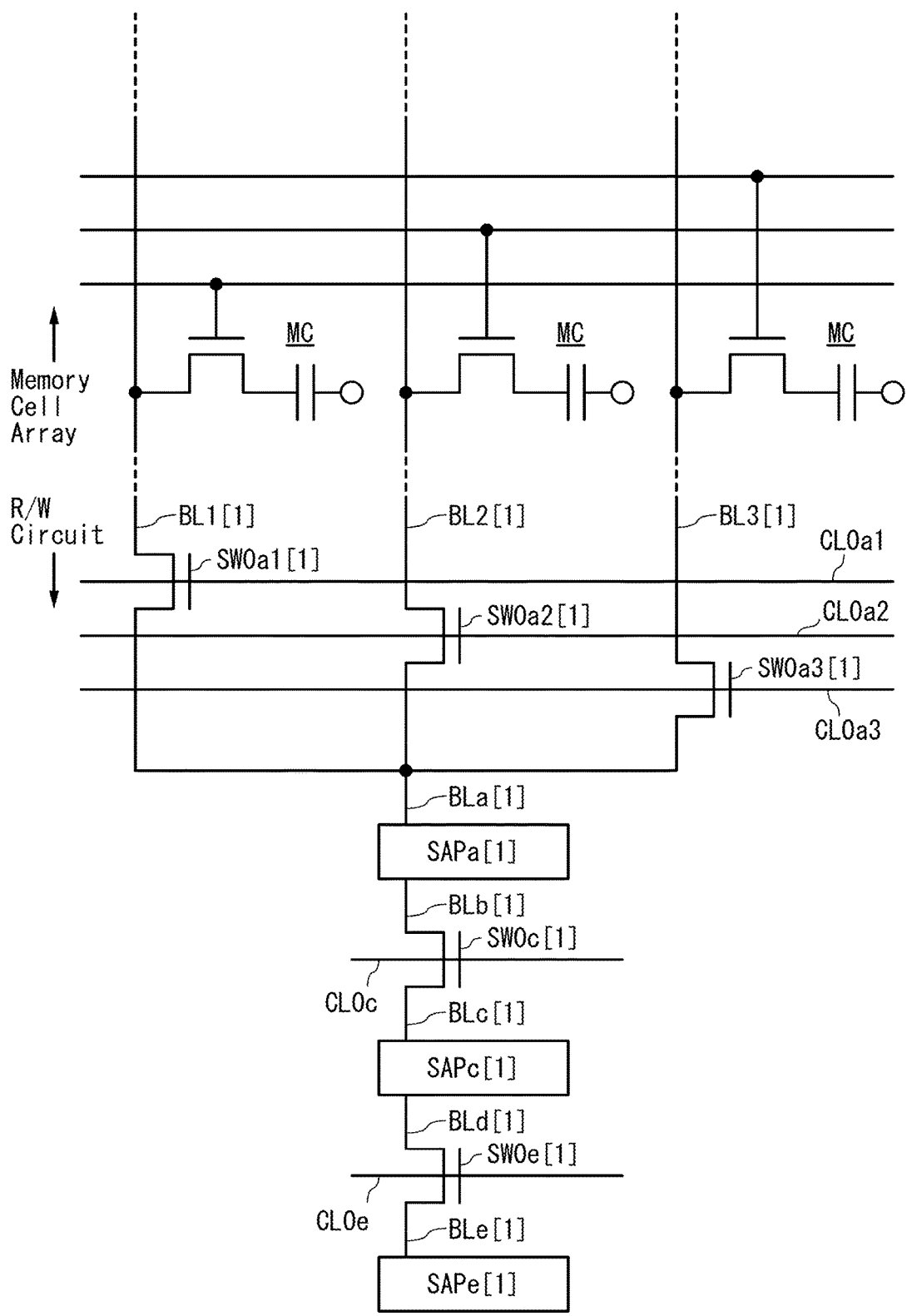
FIG. 3 illustrates a configuration example of an electronic device.

FIG. 3 illustrates another configuration example of an electronic device. In the electronic device illustrated in FIG. 3, one of three bit lines (a bit line BL1, a bit line BL2, and a bit line BL3) is selected using switches (a switch SW0a1, a switch SW0a2, and a switch SW0a3) provided between the wiring BLa and the respective bit lines.

The switch SW0a1, the switch SW0a2, and the switch SW0a3 are independently controlled by a control line CL0a1, a control line CL0a2, and a control line CL0a3, respectively. Typically, the switch SW0a1, the switch SW0a2, and the switch SW0a3 are configured so that two or more of them are not to be on at the same time.

Selecting one of a plurality of short bit lines arbitrarily for data reading is advantageous in preventing an error because of the small capacitance of the bit lines. A specific example is described below. A memory device with a general configuration in which one bit line connected to 256 memory cells is included, and a memory device with a configuration in which four bit lines each connected to 64 memory cells are included and in which connections between the four bit lines and sense amplifiers can be switched are compared to each other. Both memory devices have 256-bit memory capacity.

The capacitance of the bit line at the time of data reading is substantially smaller in the latter than in the former. Thus, the reading accuracy of the latter is increased. This is regardless of whether the memory device is a multilevel memory device or not; however, the latter configuration is advantageous in reading multilevel data because reading of multilevel data requires detection of a slight potential change. In the case where leakage current from a capacitor of the memory cell MC is high in the latter case, the number of bit lines that can be selected is limited.

FIG. 3 illustrates an example where one bit line is selected from three. A bit line can be selected from more than three bit lines when leakage current from a capacitor can be sufficiently suppressed and the refresh frequency can be decreased. One of the factors of leakage current from a capacitor is leakage current between a source and a drain of a cell transistor in an off state (off-state current). Thus, a transistor (OS transistor) described later containing an oxide (wide-gap oxide) for a semiconductor is suitable because its off-state current is extremely low.

Configuration Example 1 of R/W Circuit

FIG. 4 illustrates a configuration example of the R/W circuit included in the electronic device illustrated in FIG. 1. As described above, the R/W circuit includes the sense amplifier region SAPa, the sense amplifier region SAPc, and the sense amplifier region SAPe.

The sense amplifier region SAPa includes a sense amplifier SAa. The sense amplifier SAa includes a signal potential input terminal IN, a reference potential input terminal INB, an output terminal OUT, and an inverted output terminal OUTB. In many cases, the signal potential input terminal IN and the reference potential input terminal INB are united with the output terminal OUT and the inverted output terminal OUTB, respectively.

The sense amplifier region SAPa includes a switch SW1a, a switch SW2a, a switch SW3a, a switch SW4a, and a switch SW5a. The switch SW3a and the switch SW4a are provided in parallel between the wiring BLa and the wiring BLb.

The switch SW1a and the switch SW4a operate in accordance with one or both of the potentials of the output terminal OUT and the inverted output terminal OUTB. That is, the switch SW1a and the switch SW4a operate in accordance with a relative potential difference between the signal potential input terminal IN and the reference potential input terminal INB of the sense amplifier SAa.

The switch SW1a and the switch SW4a are configured to perform opposite operations. Thus, when the switch SW1a is on, the switch SW4a is off and when the switch SW1a is off, the switch SW4a is on.

Typically, the switch SW1a is on (the switch SW4a is off) when the potential of the signal potential input terminal IN before the sense amplifier is activated is higher than the potential of the reference potential input terminal INB and is off (the switch SW4a is on) when it is lower.

When the switch SW1a is on, part of or the whole write potential VDDa (e.g., +4 V) is supplied to the wiring BLa through the switch SW1a. Note that the write potential may be one of the potentials of the output terminal OUT and the inverted output terminal OUTB. When the switch SW4a is on, the wiring BLa is electrically connected to the wiring BLb.

The switch SW2a, the switch SW3a, and the switch SW5a are controlled by a control line CL1a. In the example described here, the three switches are configured to operate in the same way. That is, the switch SW2a, the switch SW3a, and the switch SW5a are configured to be all on or all off. However, the three switches may be controlled independently of each other.

When the switch SW2a is on, the potential of the wiring BLa is supplied to the signal potential input terminal IN through the switch SW2a. When the switch SW3a is on, the wiring BLa is electrically connected to the wiring BLb. When the switch SW5a is on, a reference potential VREFa (e.g., +1.75 V) is input to the reference potential input terminal INB through the switch SW5a.

The configuration of the sense amplifier region SAPc is the same as that of the sense amplifier region SAPa except for potentials used therein. A switch SW1c, a switch SW2c, a switch SW3c, a switch SW4c, and a switch SW5c of the sense amplifier region SAPc correspond to the switch SW1a, the switch SW2a, the switch SW3a, the switch SW4a, and the switch SW5a of the sense amplifier region SAPa, respectively. The switch SW2c, the switch SW3c, and the switch SW5c are configured to be controlled by a control line CL1c.

A write potential VDDc of the sense amplifier region SAPc is lower than the write potential VDDa and is, for example, +3 V. Furthermore, a reference potential VREFc is lower than the reference potential VREFa and is, for example, +1.25 V.

The configuration of the sense amplifier region SAPe is slightly different from that of the sense amplifier region SAPa and that of the sense amplifier region SAPc. In addition, potentials used in the sense amplifier region SAPe are different from those used in the sense amplifier regions SAPa and SAPc. The sense amplifier region SAPe includes a switch SW1e, a switch SW2e, a switch SW3e, a switch SW4e, and a switch SW5e.

The switch SW1e, the switch SW2e, and the switch SW5e correspond to the switch SW1a, the switch SW2a, and the switch SW5a of the sense amplifier region SAPa (or the switch SW1c, the switch SW2c, and the switch SW5c of the sense amplifier region SAPc), respectively, and operate similarly.

A write potential VDDe of the sense amplifier region SAPe is lower than the write potential VDDc and is, for example, +2 V. Furthermore, a reference potential VREFe is lower than the reference potential VREFc and is, for example, +0.75 V.

Similarly to the switch SW1a and the switch SW4a, the switch SW1e and the switch SW4e operate in accordance with one or both of the potentials of the output terminal OUT and the inverted output terminal OUTB. The switch SW1e and the switch SW4e are configured to perform opposite operations.

The switch SW2e and the switch SW5e are controlled by a control line CL1e. In the example described here, the two switches are configured to operate in the same way. Unlike the switch SW3a and the switch SW3c, the switch SW3e is configured to operate independently of the switch SW2e and the switch SW5e. Typically, the switch SW3e is configured not to be on at the same time as the switch SW2e and the switch SW5e. For example, the switch SW3e is off when the switch SW2e and the switch SW5e are on, and the switch SW2e and the switch SW5e are off when the switch SW3e is on. Here, the switch SW3e is controlled by a control line CL2e.

The switch SW3e and the switch SW4e are provided in series between the wiring BLe and a node at a low power supply potential VSS (e.g., 0 V). Although the switch SW3e is provided on the wiring BLe side in FIG. 4, the positions of the switch SW3e and the switch SW4e may be reversed.

The control line CL1a, the control line CL1c, and the control line CL1e may be supplied with the same signal. The switch SW2a, the switch SW3a, the switch SW5a, the switch SW2c, the switch SW3c, the switch SW5c, the switch SW2e, and the switch SW5e may be turned on or off at the same time, for example. In that case, the control line CL1a, the control line CL1c, and the control line CL1e are practically the same.

FIG. 4 illustrates an operation example immediately after the charge of a memory cell is released to the bit line BL. At this time, the bit line BL, the wiring BLa, the wiring BLb, the wiring BLc, and the wiring BLd are electrically connected to other. Thus, the switch SW0a, the switch SW0c, the switch SW0e, the switch SW3a, and the switch SW3c are turned on. Note that the switch SW3e is turned off.

Although the sense amplifier SAa, a sense amplifier SAc, and a sense amplifier SAe are inactive, the potential of the bit line BL (a read potential) at this time is input to signal potential input terminals IN of the sense amplifiers through the switches SW2a, SW2c, and SW2e, which are on.

At the same time, potentials of +1.75 V, +1.25 V, and +0.75 V are input to the reference potential input terminals INB of the sense amplifier SAa, the sense amplifier SAc, and the sense amplifier SAe, respectively. The above is illustrated in FIG. 4.

Here, the potential (written potential) of a capacitor on the bit line side in one memory cell is +4 V, +3 V, +2 V, or 0 V. After the charge of the memory cell is released to the bit line BL (and a wiring or the like electrically connected thereto), the read potential becomes +2 V, +1.5 V, +1 V, and 0 V in the case where the written potential is +4 V, +3 V, +2 V, and 0 V, respectively. In other words, the potential of the bit line BL (and the wiring or the like electrically connected thereto) before the charge of the memory cell is released is 0 V. The bit line BL (and the wiring or the like electrically connected thereto) may be precharged to a different potential (e.g., +2 V) before the charge of the memory cell is released.

Note that data when the written potentials are +4 V, +3 V, +2 V, and 0 V are expressed using a binary system as data "11", data "10", data "01", and data "00", respectively.

Next, the switch SW0a, the switch SW0c, the switch SW0e, the switch SW2a, the switch SW2c, the switch SW2e, the switch SW3a, and the switch SW3c are turned off. As a result, the bit line BL, the wiring BLa, the wiring BLb, the wiring BLc, the wiring BLd, and the wiring BLe are electrically isolated from one another.

After that, each of the sense amplifier SAa, the sense amplifier SAc, and the sense amplifier SAe is activated so that the potential difference between the signal potential input terminal IN and the reference potential input terminal INB is amplified. Accordingly, the states (on or off) of the switch SW1a, the switch SW1c, the switch SW1e, the switch SW4a, the switch SW4c, and the switch SW4e are determined.

When the read potential is +1.5 V, for example, the switches SW1c and SW1e are on and the switches SW4c and SW4e are off because the potential of the signal potential input terminal IN is higher than the potential of the reference potential input terminal INB in the sense amplifier SAe and the sense amplifier SAc.

As a result, the write potential VDDc is supplied to the wiring BLc through the switch SW1c and the write potential VDDe is supplied to the wiring BLe through the switch SW1e. Since the switch SW3c, the switch SW4c, the switch SW3e, and the switch SW4e are off, the wiring BLc, the wiring BLd, and the wiring BLe are electrically isolated from one another.

In contrast, the potential of the signal potential input terminal IN is lower than the potential of the reference potential input terminal INB in the sense amplifier SAa and the switch SW1a is off. Thus, the write potential VDDa is not supplied to the wiring BLa. Meanwhile, the switch SW4a is on, so that the wiring BLa is electrically connected to the wiring BLb.

In such a manner, the states of the switches in the sense amplifier region SAPa, the sense amplifier region SAPc, and the sense amplifier region SAPe change depending on the read potentials.

Then, the switch SW0a, the switch SW0c, and the switch SW0e are turned on, so that the bit line BL, the wiring BLa, the wiring BLb, and the wiring BLc are electrically connected to one another. Thus, the potential of the bit line BL is at the write potential VDDc (e.g., +3 V). This potential corresponds to data stored in the memory cell from which data has been read (a charge has been released); in other words, the potential is rewritten to the memory cell. Thus, data "10" is rewritten to the memory cell.

Meanwhile, since the switch SW3c, the switch SW4c, and the switch SW4e are off, the wiring BLc and the wiring BLe are electrically isolated from the wiring BLe and the node at the low power supply potential VSS, respectively.

In this manner, data reading and data rewriting are performed. FIG. 5 is a timing chart illustrating the above operations. Signals input from the outside to the R/W circuit are supplied to the control line CL0a, the control line CL0c, the control line CL0e, the control line CL1a, the control line CL1c, the control line CL1e, and the control line CL2e.

Specifically, for data reading, signals for turning on switches controlled by the control line CL0a, the control line CL0c, the control line CL0e, the control line CL1a, the control line CL1c, and the control line CL1e are supplied to the control lines in a first period. Subsequently, signals for turning off the switches are supplied in a second period. In the second period, the sense amplifiers are activated. After that, for data rewriting, signals for turning on switches controlled by the control line CL0a, the control line CL0c, the control line CL0e, and the control line CL2e are supplied to the control lines in a third period, and then signals for turning off the switches are supplied.

In the circuit illustrated in FIG. 2, in addition to the above configuration, the control line CLB0a, the control line CLB0c, the control line CLB0e, a control line CLB1a, a control line CLB1c, a control line CLB1e, and a control line CLB2e are provided (details will be described later). Although FIG. 5 illustrates signals supplied to the control lines CLB0a, CLB0c, CLB0e, CLB1a, CLB1c, CLB1e, and CLB2e, signals for turning on switches related to the control lines are not supplied to the control lines.

Note that in the circuit illustrated in FIG. 3, signals with which two or more of the switch SW0a1, the switch SW0a2, and the switch SW0a3 are not to be on at the same time are supplied to the control line CL0a1, the control line CL0a2, and the control line CL0a3 (not illustrated in FIG. 5).

Described above is an example where the read potential is +1.5 V (the potential written to the memory cell is +3 V and data retained in the memory cell is data "10"); the same applies to the case of different data. FIG. 6A, FIG. 6B, and FIG. 6C illustrate the states of the switches in the R/W circuit after data "11", data "01", and data "00" are read, respectively.

In the case of data "11" (a read potential of +2 V and a written potential of +4 V), for example, the switches SW1a, SW1c, and SW1e are on and the switches SW4a, SW4c, and SW4e are off, whereby the write potential VDDa (e.g., +4 V) is supplied to the bit line BL through the switch SW1a.

In the case of data "01" (a read potential of +1 V and a written potential of +2 V), the switches SW4a, SW4c, and SW1e are on and the switches SW1a, SW1c, and SW4e are off, whereby the write potential VDDe (e.g., +2 V) is supplied to the bit line BL through the switch SW1e (and the switches SW4a and SW4c).

In the case of data "00" (a read potential of 0 V and a written potential of 0 V), the switches SW4a, SW4c, and SW4e are on and the switches SW1a, SW1c, and SW1e are off, whereby the low power supply potential VSS (e.g., 0 V) is supplied to the bit line BL through the switch SW4e (and the switches SW4a and SW4c).

As described above, the R/W circuit includes the bit line BL, the switch SW0a, the switch SW0c, the switch SW0e, the sense amplifier region SAPa, the sense amplifier region SAPc, and the sense amplifier region SAPe. The sense amplifier region SAPa, the sense amplifier region SAPc, and the sense amplifier region SAPe include first terminals connected to the wiring BLa, the wiring BLc, and the wiring BLe, respectively. The sense amplifier region SAPa and the sense amplifier region SAPc include second terminals connected to the wiring BLb and the wiring BLd, respectively. The first terminal and the second terminal of the sense amplifier region SAPa and the first terminal and the second terminal of the sense amplifier region SAPc are arranged in this order in the circuit diagram. Similarly, the first terminal and the second terminal of the sense amplifier region SAPc and the first terminal and the second terminal of the sense amplifier region SAPe are arranged in this order in the circuit diagram. The switch SW0a is between the bit line BL and the first terminal of the sense amplifier region SAPa. The bit line BL and the first terminal of the sense amplifier region SAPa can be electrically connected to or electrically isolated from each other using the switch SW0a. The switch SW0c is between the second terminal of the sense amplifier region SAPa and the first terminal of the sense amplifier region SAPc. The second terminal of the sense amplifier region SAPa and the first terminal of the sense amplifier region SAPc can be electrically connected to or electrically isolated from each other using the switch SW0c. The switch SW0e is between the second terminal of the sense amplifier region SAPc and the first terminal of the sense amplifier region SAPe. The second terminal of the sense amplifier region SAPc and the first terminal of the sense amplifier region SAPe can be electrically connected to or electrically isolated from each other using the switch SW0e. Each of the sense amplifier region SAPa, the sense amplifier region SAPc, and the sense amplifier region SAPe includes a sense amplifier and switches (an n-channel transistor M1an, an n-channel transistor M2an, an n-channel transistor M3an, an n-channel transistor M4an, and the like described later) that operate in accordance with the output of the sense amplifier.

The first terminals and the second terminals can be electrically connected to or electrically isolated from each other with the use of the switches. At the time when the sense amplifiers terminate an amplification process, any of the following occurs.

(A) The bit line BL and the first terminal of the sense amplifier region SAPa are electrically connected to each other, and the first terminal and the second terminal are electrically isolated from each other in the sense amplifier region SAPa and in the sense amplifier region SAPc (this state corresponds to the case of data "11").

(B) The bit line BL and the first terminal of the sense amplifier region SAPc are electrically connected to each other, and the first terminal and the second terminal of the sense amplifier region SAPc are electrically isolated from each other (this state corresponds to the case of data "10").

(C) The bit line BL and the first terminal of the sense amplifier region SAPe are electrically connected to each other, and the first terminal and the second terminal of the sense amplifier region SAPe are electrically isolated from each other (this state corresponds to the case of data "01").

(D) The bit line BL and the second terminal of the sense amplifier region SAPe are electrically connected to each other (this state corresponds to the case of data "00").

As a result, the potential of the bit line BL corresponds to the read potential (a potential corresponding to data read to the bit line BL is written). Table 1 lists the read potentials (the potentials of the bit line BL just before amplification), the potentials of the output terminals OUT of the sense amplifiers SAa, SAc, and SAe after amplification, and the potentials of the bit line BL at the time of rewriting.

TABLE 1

| Data | Before amplification BL[1] | After amplification | | | At the time of rewriting BL[1] |
| --- | --- | --- | --- | --- | --- |
| | | OUT of SAa[1] | OUT of SAc[1] | OUT of SAe[1] | |
| "11" | +2.0 V | +4.0 V | +3.0 V | +2.0 V | +4.0 V |
| "10" | +1.5 V | 0 V | +3.0 V | +2.0 V | +3.0 V |
| "01" | +0.5 V | 0 V | 0 V | +2.0 V | +2.0 V |
| "00" | 0 V | 0 V | 0 V | 0 V | 0 V |

Table 2 lists the states of the switches SW1a, SW4a, SW1c, SW4c, SW1e, and SW4e (determined by the potentials of the output terminals OUT of the sense amplifiers SAa, SAc, and SAe) after amplification.

TABLE 2

| Data | At the time of reading BL[1] | After amplification | | | | | |
| --- | --- | --- | --- | --- | --- | --- | --- |
| | | SW1a[1] | SW4a[1] | SW1c[1] | SW4c[1] | SW1e[1] | SW4e[1] |
| "11" | +2.0 V | ON | OFF | ON | OFF | ON | OFF |
| "10" | +1.5 V | OFF | ON | ON | OFF | ON | OFF |
| "01" | +0.5 V | OFF | ON | OFF | ON | ON | OFF |
| "00" | 0 V | OFF | ON | OFF | ON | OFF | ON |

Embodiment 2

Configuration Example 1 of Sense Amplifier Region

Figures 7A, 7B:
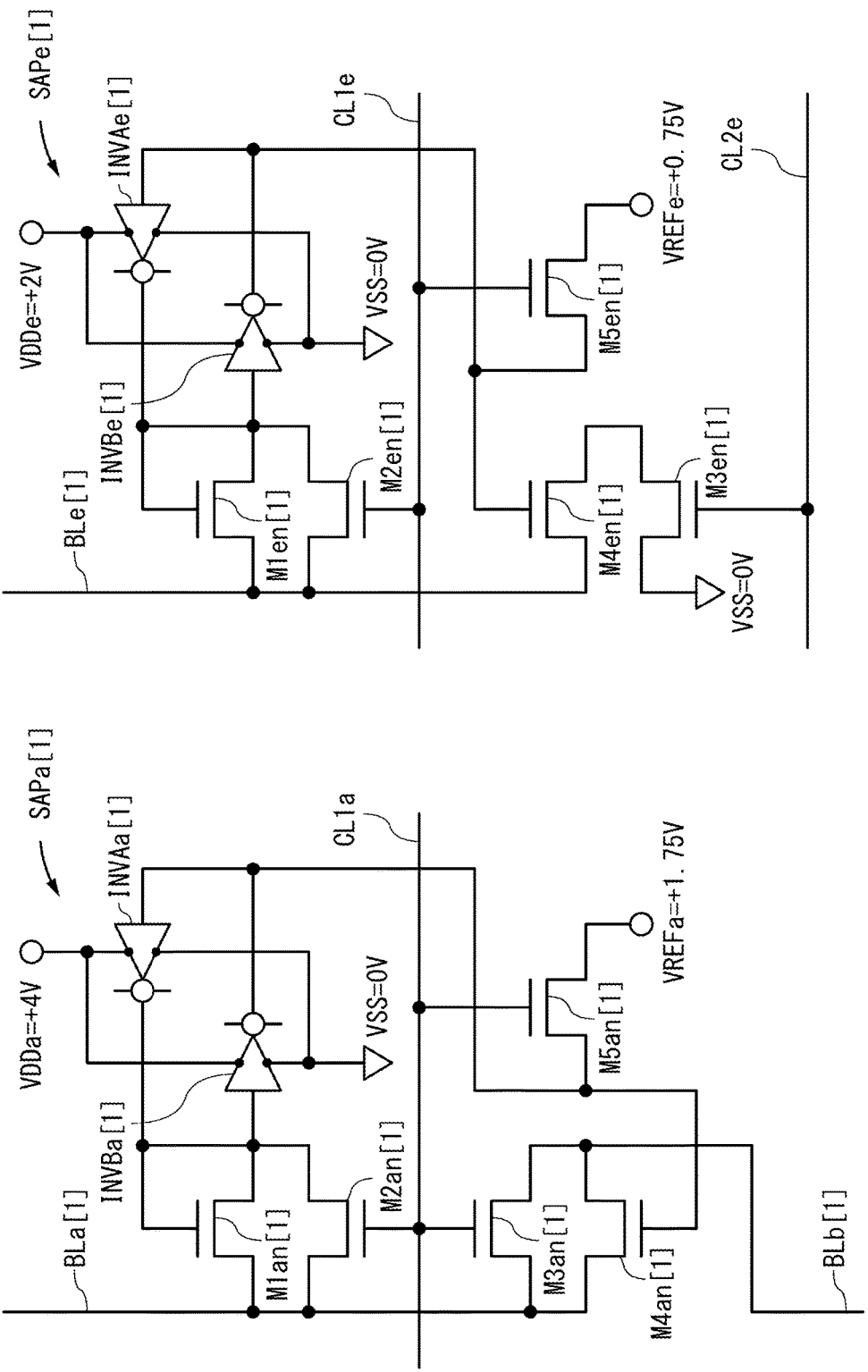
FIGS. 7A and 7B each illustrate a configuration example of a sense amplifier region.

FIG. 7A and FIG. 7B illustrate examples of circuits that can be used for the sense amplifier region SAPa[1] and the sense amplifier region SAPe[1] in FIG. 1, respectively.

In FIG. 7A, an inverter INVAa[1] and an inverter INVBa[1] form an inverter loop in which an output signal of each inverter is input to the other inverter, and serve as a sense amplifier. In other words, the inverter INVAa[1] and the inverter INVBa[1] correspond to the sense amplifier SAa[1] in FIG. 4. Note that VDDa (e.g., +4 V) and VSS (e.g., 0 V) are supplied to the inverter INVAa[1] and the inverter INVBa[1], respectively, as power supply potentials.

The power supply potentials supplied to the inverter INVAa[1] and the inverter INVBa[1] may be fixed or variable. In the case of using a clocked inverter as the inverter INVAa[1] (the inverter INVBa[1]), for example, to activate the inverter INVAa[1] (the inverter INVBa[1]), a switch transistor (not illustrated) provided between the inverter INVAa[1] (the inverter INVBa[1]) and a power source is turned on. To inactivate the inverter, the switch transistor is turned off.

The inverters can be activated or inactivated also by changing the power supply potentials supplied to the inverters. The inverter INVAa[1] (the inverter INVBa[1]) can be activated in the following manner, for example: the potentials of a first power source terminal and a second power source terminal of the inverter INVAa[1] (the inverter INVBa[1]) are kept at the same potential (e.g., the same potential as the reference potential VREFa), and then the potential of the first power source terminal and the potential of the second power source terminal are continuously changed to the write potential VDDa and the low power supply potential VSS, respectively.

The n-channel transistor M1an[1], the n-channel transistor M2an[1], the n-channel transistor M3an[1], the n-channel transistor M4an[1], and the n-channel transistor M5an[1] correspond to the switch SW1a[1], the switch SW2a[1], the switch SW3a[1], the switch SW4a[1], and the switch SW5a[1] in FIG. 4, respectively.

The sense amplifier region SAPc[1] illustrated in FIG. 1 and FIG. 4 can have a configuration similar to that illustrated in FIG. 7A. Note that VDDc (e.g., +3 V) and VSS (e.g., 0 V) are supplied to the inverters as power supply potentials.

An inverter INVAe[1] and an inverter INVBe[1] in FIG. 7B correspond to the sense amplifier SAe[1] in FIG. 4. Note that VDDe (e.g., +2 V) and VSS (e.g., 0 V) are supplied to the inverter INVAe[1] and the inverter INVBe[1], respectively, as power supply potentials.

An n-channel transistor M1en[1], an n-channel transistor M2en[1], an n-channel transistor M3en[1], an n-channel transistor M4en[1], and an n-channel transistor M5en[1] correspond to the switch SW1e[1], the switch SW2e[1], the switch SW3e[1], the switch SW4e[1], and the switch SW5e[1] in FIG. 4, respectively.

In the above description, the n-channel transistor M1an[1], the n-channel transistor M2an[1], the n-channel transistor M3an[1], the n-channel transistor M4an[1], the n-channel transistor M5an[1], the n-channel transistor M1en[1], the n-channel transistor M2en[1], the n-channel transistor M3en[1], the n-channel transistor M4en[1], the n-channel transistor M5en[1], and the like may be silicon transistors.

Note that some or all of the transistors may be OS transistors. Since an OS transistor has a high maximum voltage that can be applied between a source and a drain or between the source and a gate (has high withstand voltage) when used, driving voltage can be set high. Thus, the potential change of the bit line due to data can be made large, which is advantageous to multilevel data reading. The same can be applied to the cell transistor of the memory cell MC.

Configuration Example 2 of Sense Amplifier Region

Figure 9:
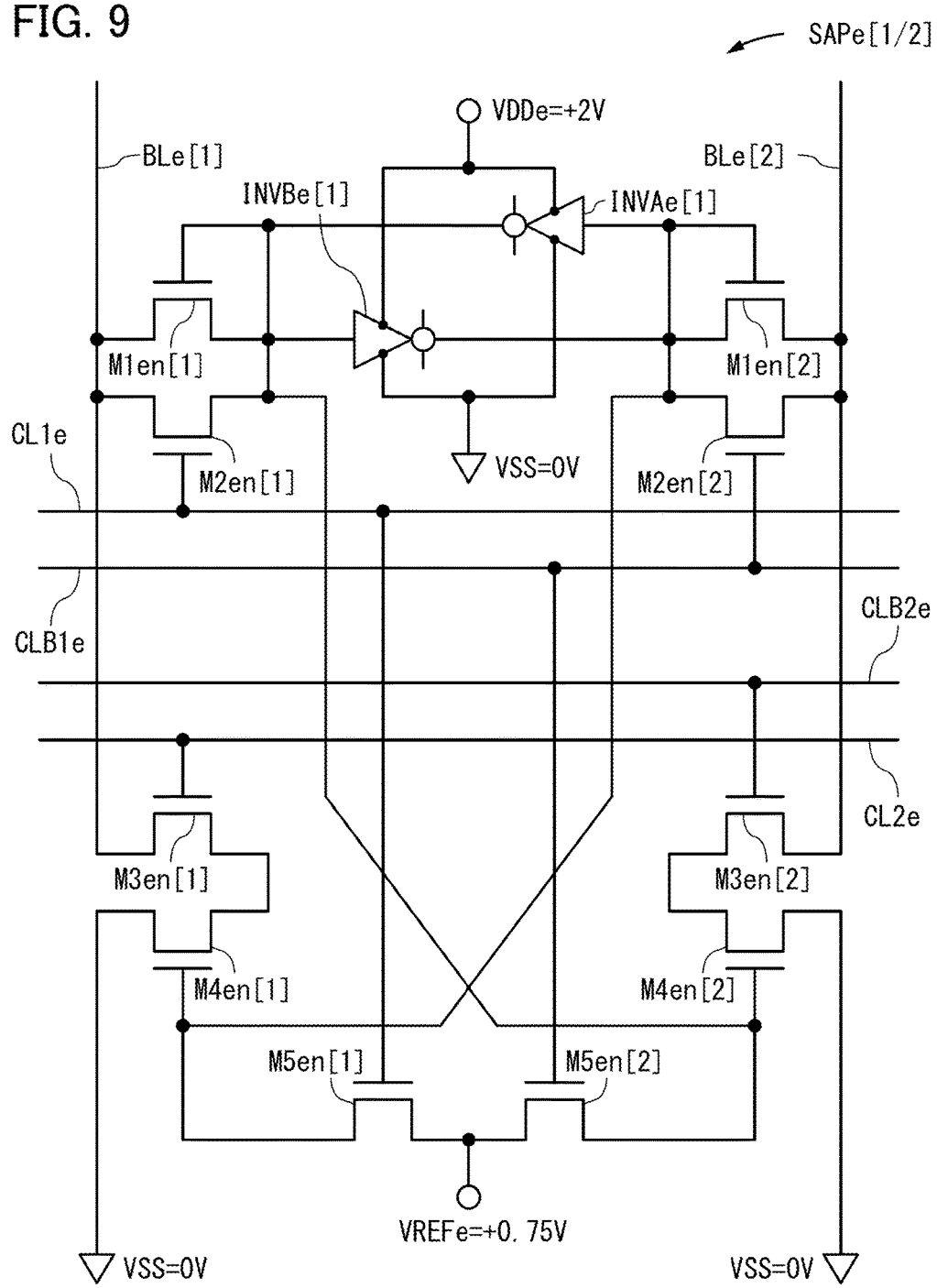
FIG. 9 illustrates a configuration example of a sense amplifier region.

FIG. 8 and FIG. 9 illustrate examples of circuits that can be used for the sense amplifier region SAPa[1/2] and the sense amplifier region SAPe[1/2] in FIG. 2, respectively. The sense amplifier region SAPa[1/2] in FIG. 2 has a configuration similar to that of a combination of two sense amplifier regions SAPa[1] illustrated in FIG. 4. In the sense amplifier region SAPa[1/2], switches and the like are located symmetrically with respect to the sense amplifier SAa[1] (i.e., the inverter INVAe[1] and the inverter INVBe[1]). The same applies to the sense amplifier region SAPe[1/2] in FIG. 2.

As in the switch SW0a[1] and the switch SW0a[2] in FIG. 2, the n-channel transistor M2an[1] and the n-channel transistor M2an[2] in the sense amplifier region SAPa[1/2] in FIG. 8 are configured not to be on at the same time. The same applies to the n-channel transistors M3an[1] and M3an[2] and the n-channel transistors M5an[1] and M5an[2].

Thus, the n-channel transistors M2an[1], M3an[1], and M5an[1] are controlled by the control line CL1a, and the n-channel transistors M2an[2], M3an[2], and M5an[2] are controlled by the control line CLB1a, for example.

The same applies to the sense amplifier region SAPe[1/2]. As illustrated in FIG. 9, the n-channel transistor M2en[1], the n-channel transistors M3en[1], and the n-channel transistors M5en[1] are configured not to be on at the same time as an n-channel transistor M2en[2], an n-channel transistor M3en[2], and an n-channel transistor M5en[2], respectively.

Thus, the n-channel transistors M2en[1] and M5en[1] are controlled by the control line CL1e, and the n-channel transistors M2en[2] and M5en[2] are controlled by the control line CLB1e, for example. The n-channel transistor M3en[1] and the n-channel transistor M3en[2] are controlled by the control line CL2e and the control line CLB2e, respectively.

The sense amplifier region SAPc[1/2] in FIG. 2 can have a configuration similar to that of the sense amplifier region SAPa[1/2] in FIG. 8. Note that VDDc (e.g., +3 V) and VSS (e.g., 0 V) are supplied to the inverters as power supply potentials.

Configuration Example 3 of Sense Amplifier Region

Figure 10:
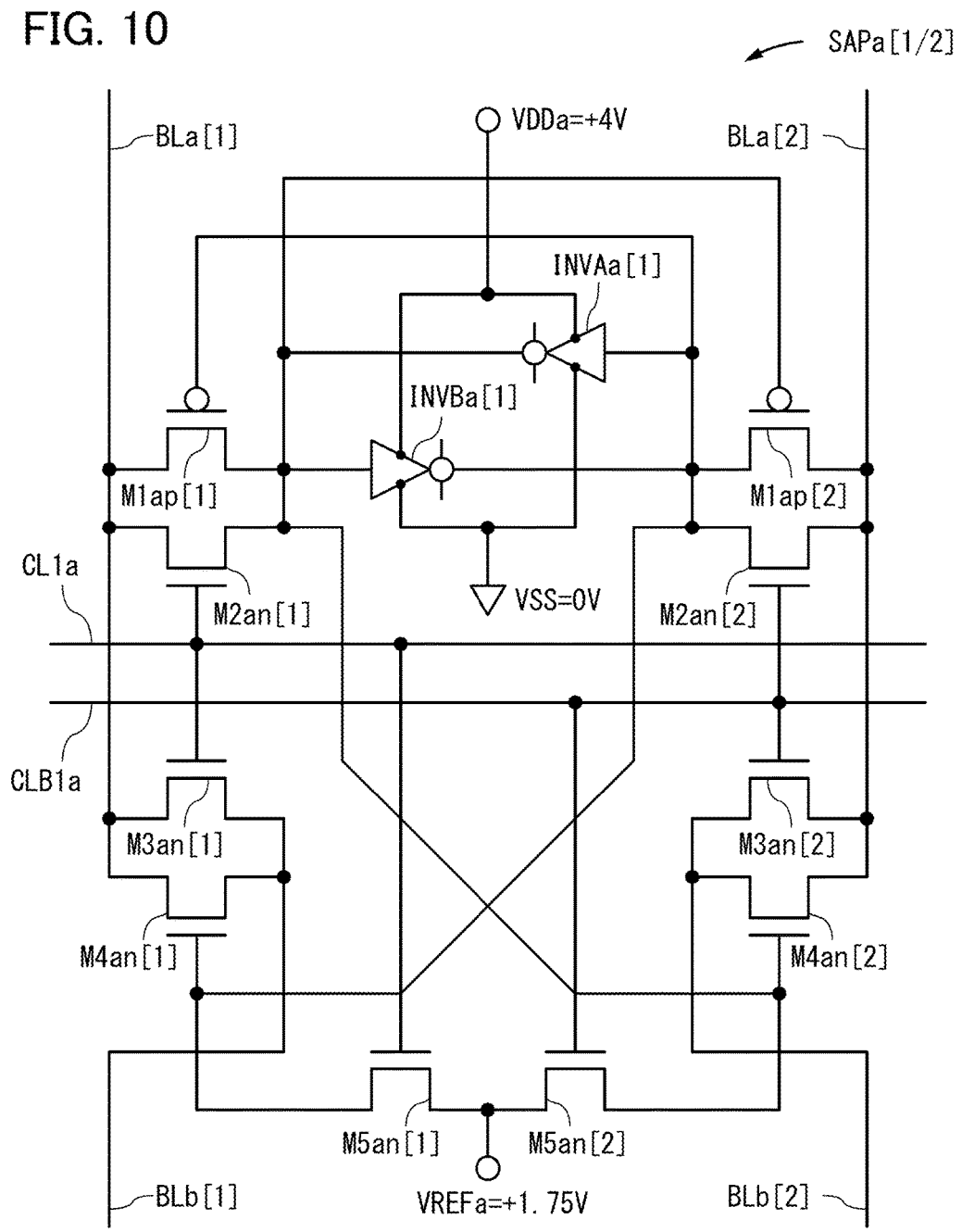
FIG. 10 illustrates a configuration example of a sense amplifier region.

Although n-channel transistors are used in the above example, some or all of the transistors may be p-channel transistors. FIG. 10 illustrates an example where the n-channel transistor M1an[1] and the n-channel transistor M1an[2] in the sense amplifier region SAPa[1/2] illustrated in FIG. 8 are replaced by a p-channel transistor M1ap[1] and a p-channel transistor M1ap[2], respectively. The same can be applied to the sense amplifier region SAPc and the sense amplifier region SAPe.

The n-channel transistor M1an[1] in FIG. 8 corresponds to the switch SW1a[1] in FIG. 4. A p-channel transistor can have a similar function. In the case of using a p-channel transistor to perform operation similar to that of an n-channel transistor, the p-channel transistor M1ap[1] needs to be controlled in accordance with the output signal of the inverter INVBa[1]. Thus, a gate of the p-channel transistor M1ap[1] is connected to an output terminal of the inverter INVBa[1]. Similarly, a gate of the p-channel transistor M1ap[2] is connected to an output terminal of the inverter INVAa[1].

Configuration Example 4 of Sense Amplifier Region

Figure 11:
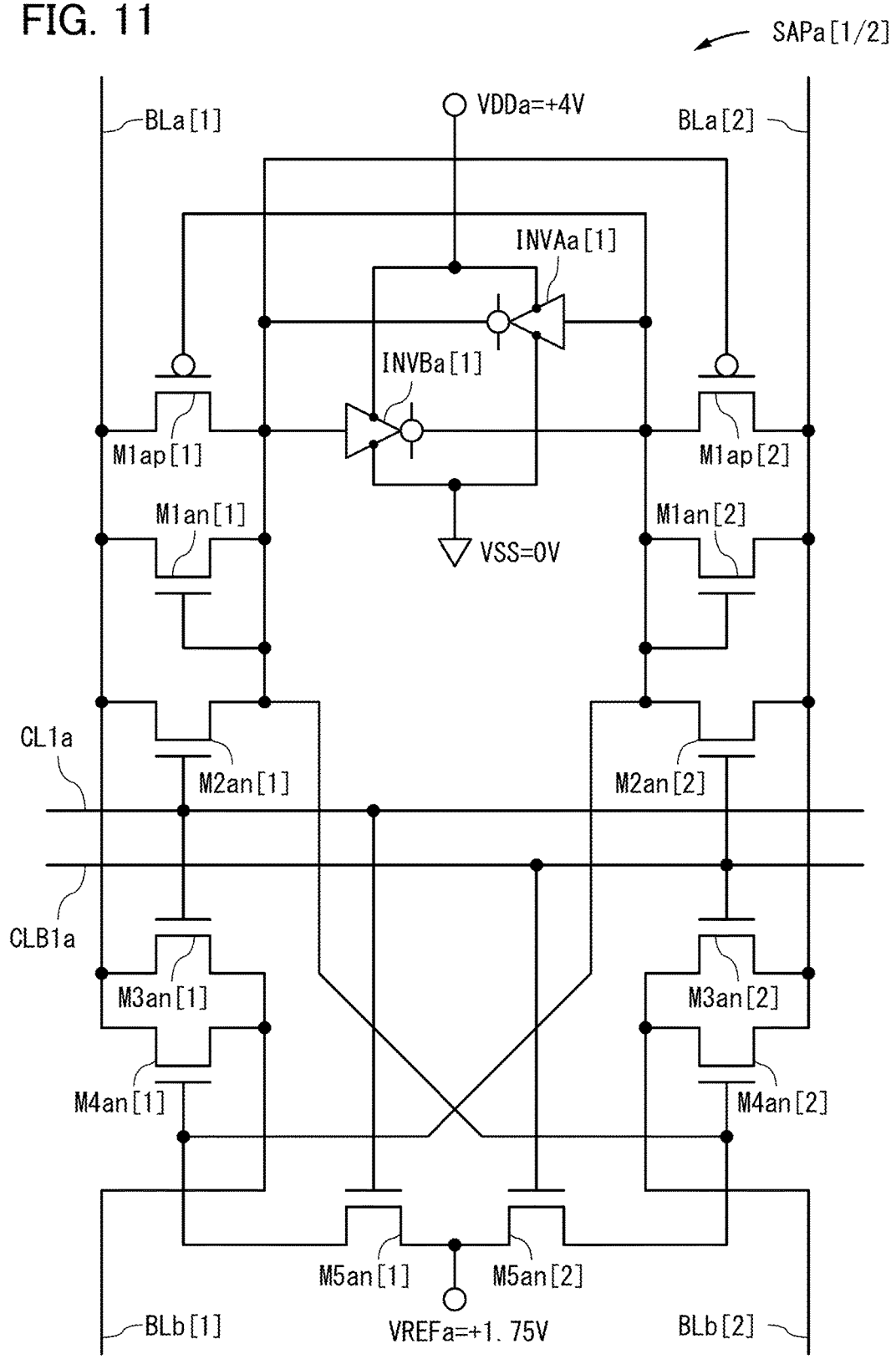
FIG. 11 illustrates a configuration example of a sense amplifier region.

A function that corresponds to that of the switch SW1a[1] in FIG. 4 can be obtained using what is called a transfer gate circuit. FIG. 11 illustrates an example of such a case. In FIG. 11, the n-channel transistor M1an[1] and the p-channel transistor M1ap[1] form a transfer gate circuit that can have a function corresponding to that of the switch SW1a[1].

Note that a transfer gate circuit may be used in a portion corresponding to the switch SW4a[1] or the switch SW4a[2], or another portion. The same can be applied to the sense amplifier region SAPc and the sense amplifier region SAPe.

Configuration Example 5 of Sense Amplifier Region

In the sense amplifier region SAPa[1] illustrated in FIG. 7A, the n-channel transistor M3an[1] is used for electrically connecting the wiring BLa[1] and the wiring BLb[1] to each other at the initial stage of reading.

The n-channel transistor M4an[1] provided in parallel to the n-channel transistor M3an[1] can also electrically connect the wiring BLa[1] and the wiring BLb[1] to each other when the potential of a gate of the n-channel transistor M4an[1] is temporarily at an appropriate value. Thus, no problem arises in the operation of the R/W circuit even without the n-channel transistor M3an[1], in some cases.

Figures 12A, 12B:
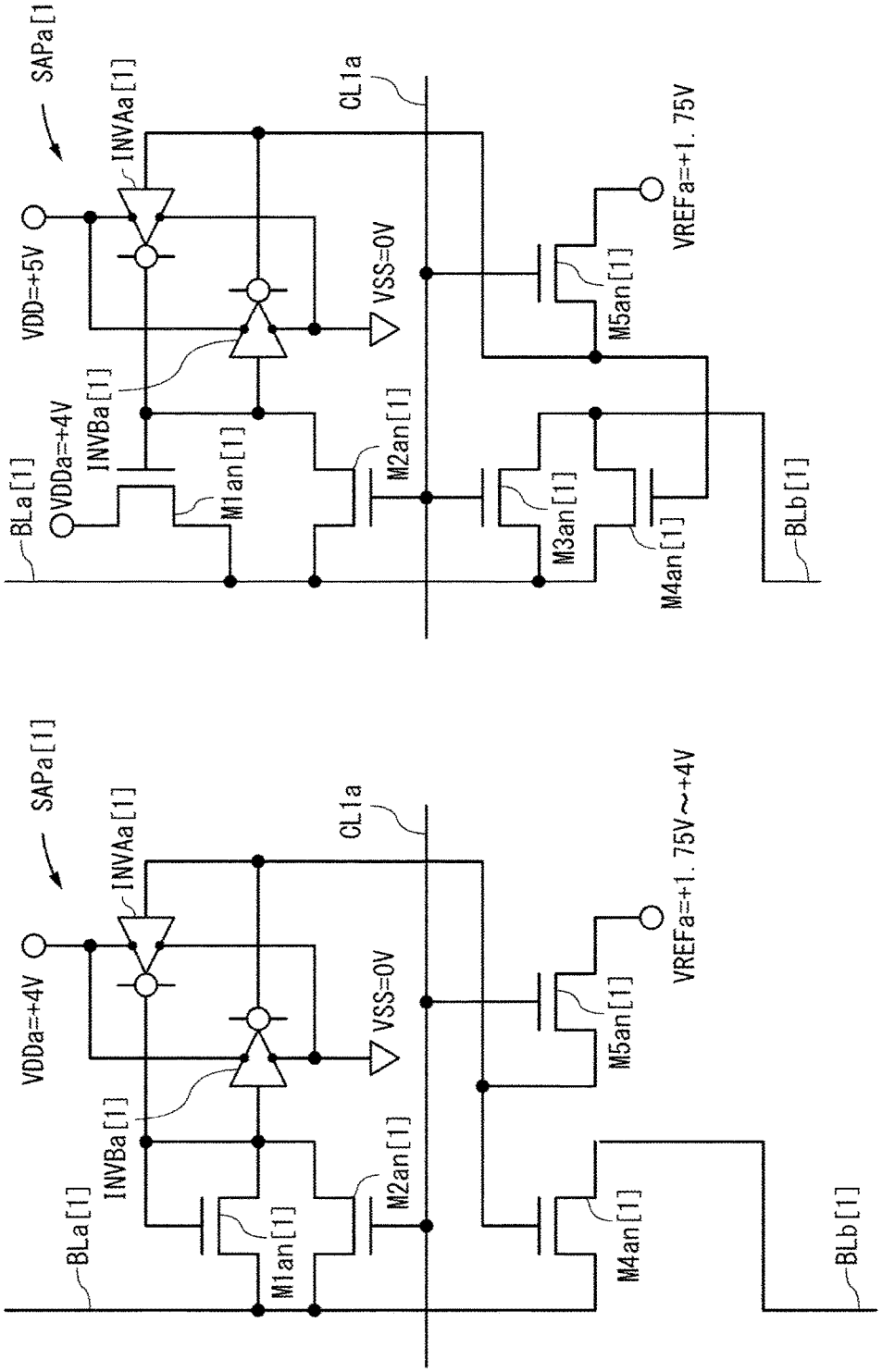
FIGS. 12A and 12B each illustrate a configuration example of a sense amplifier region.

In the sense amplifier region SAPa[1] illustrated in FIG. 12A, only the n-channel transistor M4an[1] is provided between the wiring BLa[1] and the wiring BLb[1]. Here, the threshold voltage of the n-channel transistor M4an[1] is +0.5 V. The reference potential VREFa can be changed from +1.75 V to a higher potential (e.g., +4 V).

For example, the reference potential VREFa is set to +4 V in a period during which the n-channel transistor M2an[1] and the n-channel transistor M5an[1] are on. Note that a potential of +4 V (or part thereof) is supplied to the gate of the n-channel transistor M4an[1] through the n-channel transistor M5an[1]. In the case where data "11" is read, for example, the read potential is +2 V, and the n-channel transistor M4an[1] can electrically connect the wiring BLa[1] and the wiring BLb[1] to each other.

After that, the reference potential VREFa is set to +1.75 V. In this state, a potential of +1.75 V (or part thereof) is supplied to the gate of the n-channel transistor M4an[1] through the n-channel transistor M5an[1]. Although the n-channel transistor M4an[1] might be insufficiently on, it is not a problem because the wiring BLa[1] and the wiring BLb[1] are not needed to be electrically connected to each other at this point.

After that, the n-channel transistor M2an[1] and the n-channel transistor M5an[1] are turned off and the sense amplifier SAa[1] (the inverter INVAa[1] and the inverter INVBa[1]) is activated, whereby a difference between the read potential and the final reference potential (+1.75 V) is amplified.

The same can be applied to the sense amplifier region SAPc and the sense amplifier region SAPe. Note that the reference potential VREFc can be at any potential from +1.25 V to +4 V, and the reference potential VREFe can be at any potential from +0.75 V to +4 V, for example.

Configuration Example 6 of Sense Amplifier Region

In the above examples, an output signal of the sense amplifier is supplied to a gate and one of a source and a drain of the n-channel transistor M1an, or the output signal of the sense amplifier is supplied to one of a source and a drain of the p-channel transistor M1ap and an inverted output signal of the sense amplifier is supplied to a gate of the p-channel transistor M1ap. As in an example illustrated in FIG. 12B, a potential not related to the sense amplifier may be supplied to one of the source and the drain of the n-channel transistor M1an (or the p-channel transistor M1ap).

In the sense amplifier region SAPa[1] illustrated in FIG. 12B, a high power supply potential VDD (e.g., +5 V) and the low power supply potential VSS (e.g., 0 V) are supplied to the inverter INVAa[1] and the inverter INVBa[1]. The output potential of the inverter INVAa[1] is supplied to the gate of the n-channel transistor M1an[1].

Thus, when the read potential (potential of the wiring BLa[1]) of the sense amplifier SAa[1] (the inverter INVAa[1] and the inverter INVBa[1]) before amplification is higher than the reference potential VREFa (+1.75 V), the n-channel transistor M1an[1] is turned on after the amplification. Then, the write potential VDDa (e.g., +4 V) is supplied to the wiring BLa[1] through the n-channel transistor M1an[1].

The same can be applied to the sense amplifier region SAPc and the sense amplifier region SAPe. Note that power supply potentials supplied to the sense amplifier SAc and the sense amplifier SAe may be equal to a power supply potential supplied to the sense amplifier SAa, for example.

Embodiment 3

The circuit configuration of the sense amplifier region SAPe, which is at the last stage of the R/W circuit, can be made simple. The sense amplifier region SAPe at least needs to supply a result of reading operation, for example, +2 V or 0 V, to the bit line BL. Thus, if the sense amplifier SAe outputs +2 V or 0 V as a result of amplification, the potential can be used as the output potential of the sense amplifier region SAPe.

Figure 13:
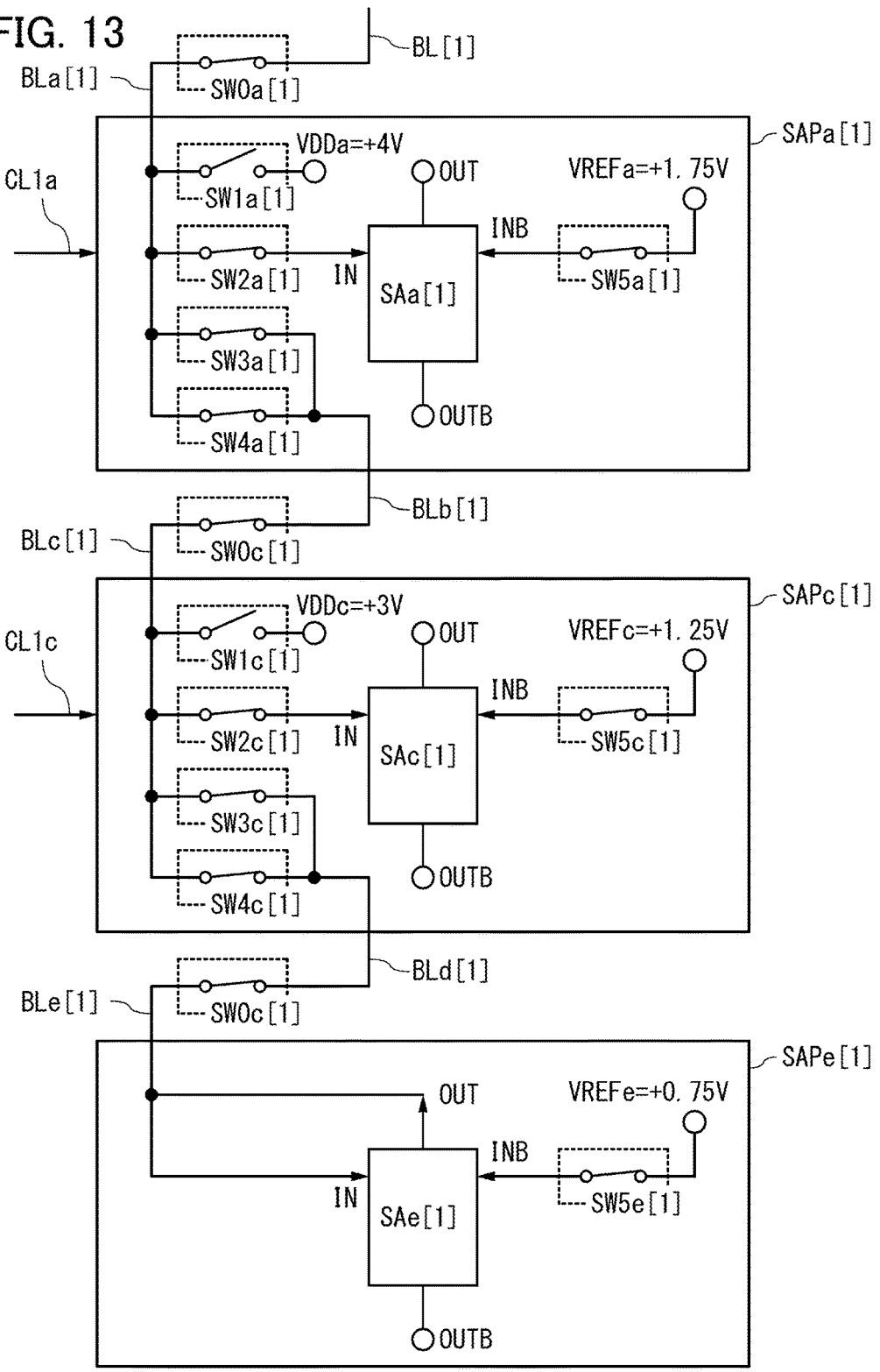
FIG. 13 illustrates a configuration example of an R/W circuit.

FIG. 13 illustrates an example of such a case. The configurations of the sense amplifier regions SAPa and SAPc in FIG. 13 are the same as those illustrated in FIG. 4. The sense amplifier region SAPe is simplified and is composed of only the sense amplifier SAe and the switch SW5e. The output of the sense amplifier SAe is directly supplied to the wiring BLe (without passing through a switch).

Figure 14:
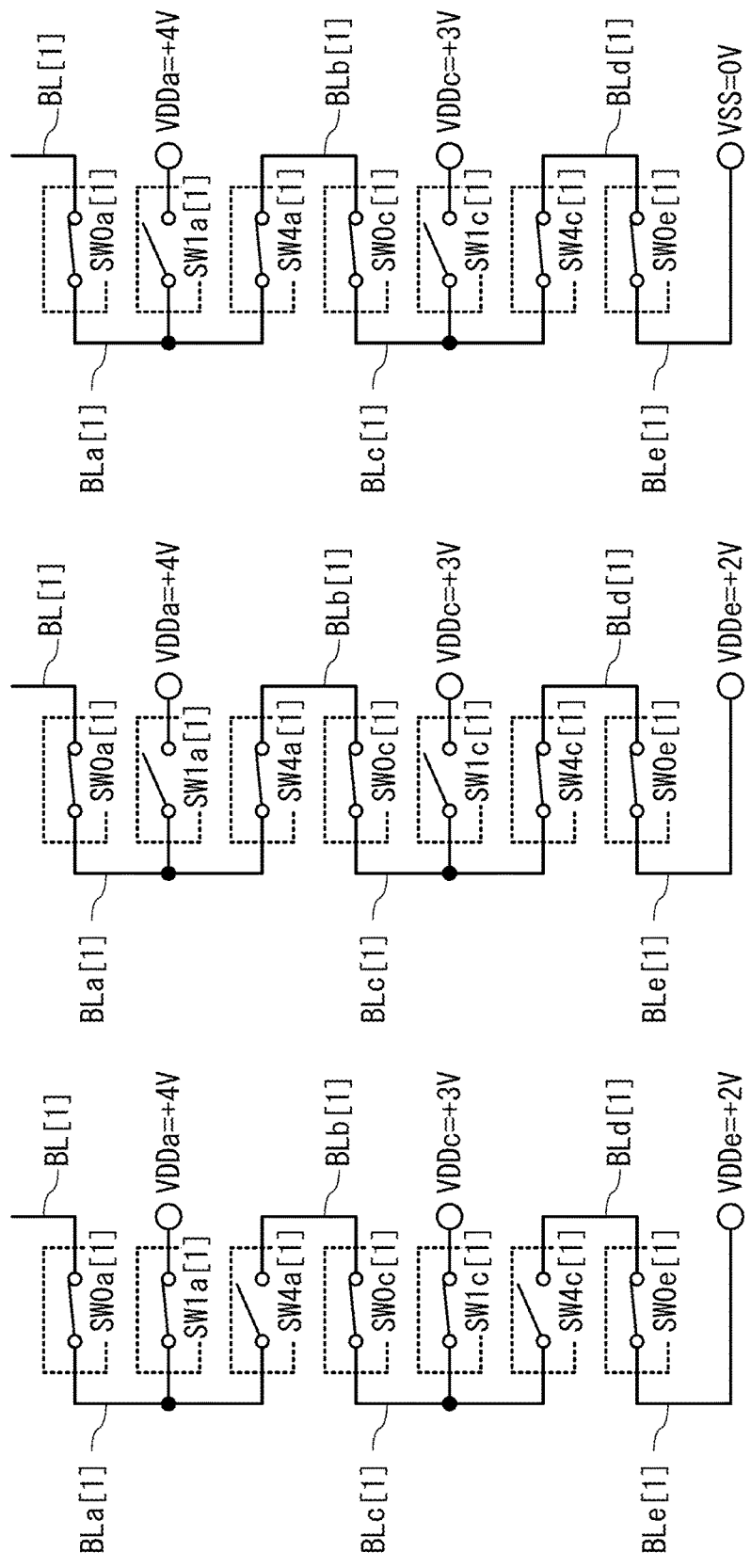
FIGS. 14A to 14C each illustrate an operation example of an R/W circuit.

FIGS. 14A to 14C illustrate, similarly to FIGS. 6A to 6C, the states of the switches in the R/W circuit after data "11", data "01", and data "00" are read out. In the case of data "11", the switch SW4a is off; thus, the write potential VDDa (e.g., +4 V) is supplied to the bit line BL through the switch SW1a, which is on. In the case of data "10", which is not illustrated, the switch SW1a and the switch SW4c are off; thus, the write potential VDDc (e.g., +3 V) is supplied to the bit line BL through the switch SW1c, which is on.

Figure 15:
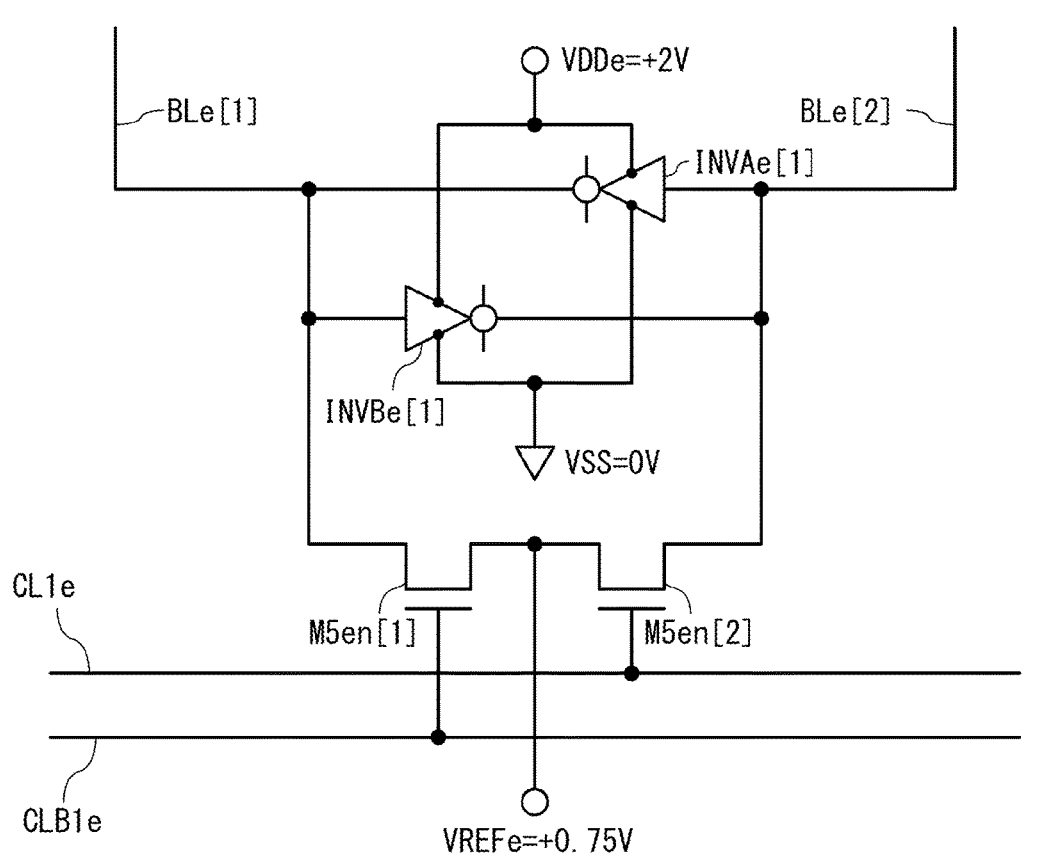
FIG. 15 illustrates a configuration example of a sense amplifier region.

In contrast, in the cases of data "01" and data "00" illustrated in FIGS. 14B and 14C, the bit line BL, the wiring BLa, the wiring BLb, the wiring BLc, the wiring BLd, and the wiring BLe are electrically connected to one another. Since the switches SW1a and SW1c are off, only an output signal of the sense amplifier SAe is supplied to the bit line BL. The write potential VDDe (e.g., +2 V) in the case of data "01" and the low power supply potential VSS (e.g., 0 V) in the case of data "00" are supplied to the bit line BL. FIG. 15 illustrates a circuit example of the sense amplifier region SAPe[1/2] based on the above design concept.

Embodiment 4

Figure 16:
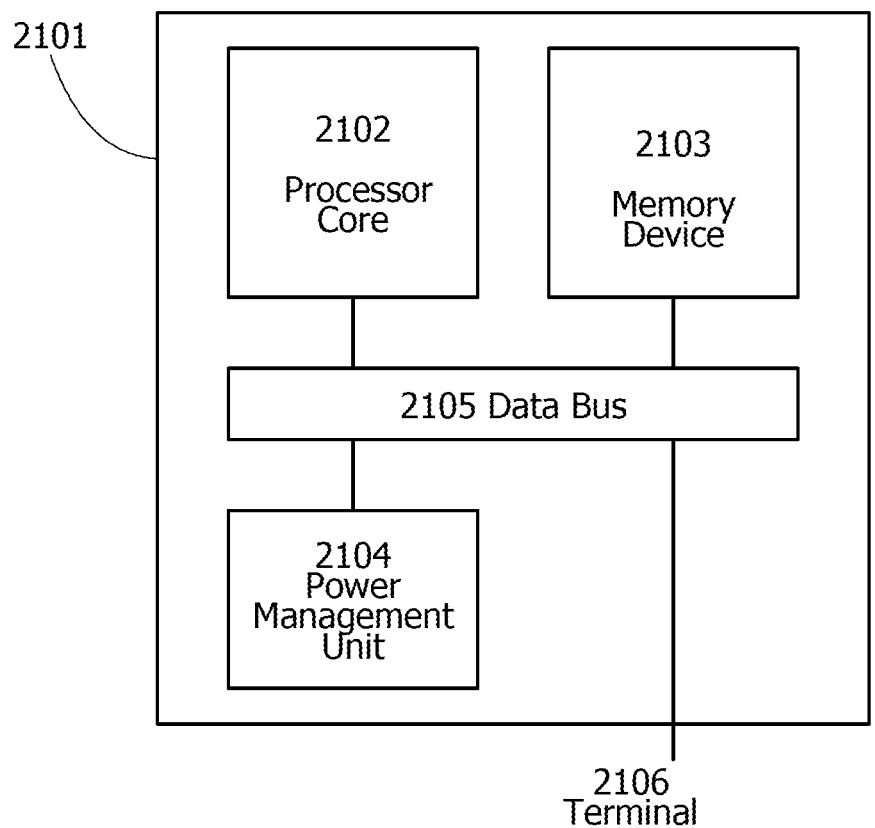
FIG. 16 is a block diagram illustrating an example of a CPU.

In this embodiment, a central processor unit (CPU) including the memory cell and the R/W circuit described in the above embodiments will be described. FIG. 16 is a block diagram illustrating a configuration example of the CPU.

A CPU 2100 illustrated in FIG. 16 includes, over a substrate 2101, a processor core 2102, a memory device 2103, a PMU 2104, and a data bus 2105. As the substrate 2101, a semiconductor substrate, an SOI substrate, a glass substrate, or the like is used.

The processor core 2102 has a function of performing a variety of arithmetic operations such as four arithmetic operations and logic operations.

The memory device 2103 has a function of temporarily storing frequently used data, data used for arithmetic operations, data of arithmetic operation results, and the like during the operation of the CPU 2100. Thus, the memory device 2103 serves as a main memory or a cache memory of the CPU 2100. The R/W circuit and the memory cell array described in the above embodiments are provided in the memory device 2103.

The PMU 2104 controls power supply to the circuits such as the processor core 2102, the memory device 2103, and the PMU 2104. Note that FIG. 16 does not illustrate wirings through which power is supplied to each circuit from the PMU 2104. The external power may be directly supplied to each circuit without through the PMU 2104.

Data is communicated between the processor core 2102 and the memory device 2103, the PMU 2104, or the like through the data bus 2105. Note that when the CPU 2100 is started up, power is directly supplied to the processor core 2102 from the PMU 2104 in some cases.

The data bus 2105 is electrically connected to a terminal 2106 of the CPU 2100. When the CPU 2100 performs calculations, a program code is input to the terminal 2106 and sent to the processor core 2102 through the data bus 2105; then, arithmetic operation is performed.

Alternatively, an internal circuit of the CPU 2100 may be electrically connected to the outside so that data is directly communicated without through the data bus 2105. For example, data may be directly transmitted to the PMU 2104 to control the processor core 2102.

The CPU 2100 is only an example with a simplified configuration, and an actual CPU may have various configurations depending on the application. For example, a CPU may have the following configuration: a plurality of cores, each of which includes an arithmetic circuit, operate in parallel. The number of bits that the CPU can process in an internal arithmetic circuit or a data bus can be, for example, 8, 16, 32, or 64.

Furthermore, the use of an OS transistor in the R/W circuit or the memory cell array enables the reading and writing (or rewriting) operation speed to be increased, leading to a CPU with a high processing speed. The OS transistor has an extremely low off-state current and thus consumes less power. Accordingly, the power consumption of the CPU can be reduced.

Embodiment 5

In this embodiment, transistors that can be used in the above embodiments will be described.

Structure Example 1 of Transistor

Figure 17A:
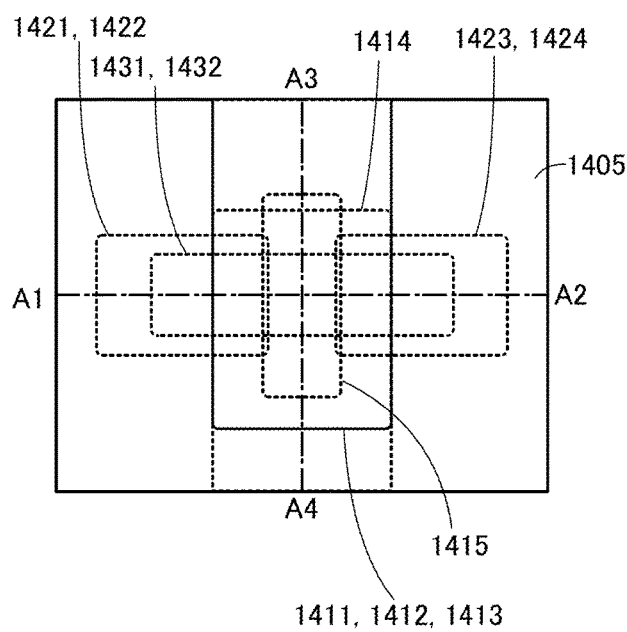
FIGS. 17A to 17C are a top view and cross-sectional views illustrating a structural example of a transistor.
Figure 17B:
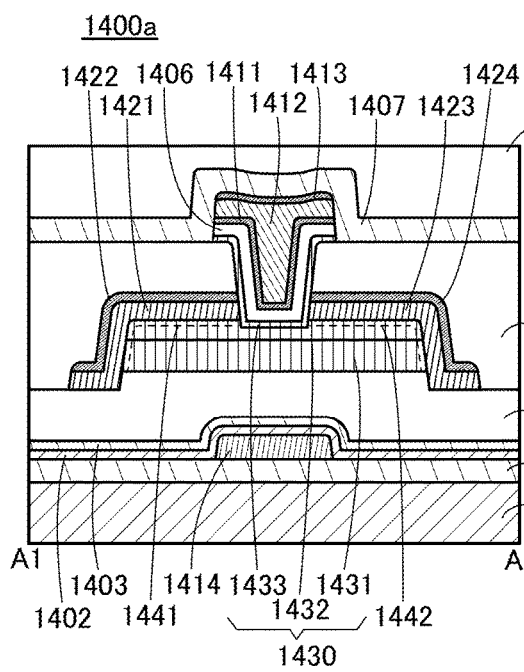
Figure 17C:
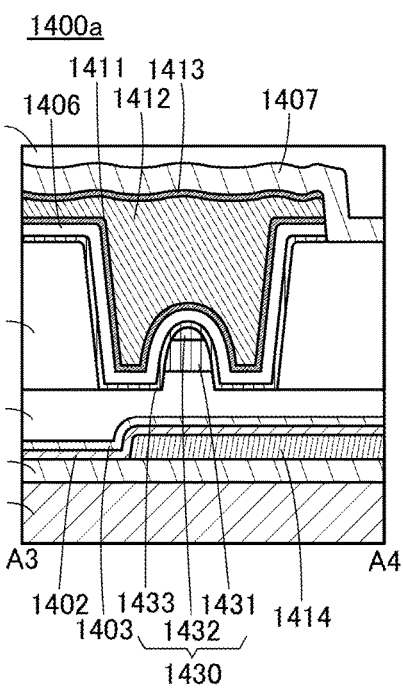

FIGS. 17A to 17C are a top view and cross-sectional views of a transistor 1400a. FIG. 17A is a top view, FIG. 17B is a cross-sectional view taken along dashed-dotted line A1-A2 in FIG. 17A, and FIG. 17C is a cross-sectional view taken along dashed-dotted line A3-A4 in FIG. 17A. Note that for simplification of the drawing, some components are not illustrated in the top view in FIG. 17A. Note that the dashed-dotted line A1-A2 and the dashed-dotted line A3-A4 are sometimes referred to as a channel length direction of the transistor 1400a and a channel width direction of the transistor 1400a, respectively.

The transistor 1400a includes a substrate 1450, an insulating film 1401 over the substrate 1450, a conductive film 1414 over the insulating film 1401, an insulating film 1402 covering the conductive film 1414, an insulating film 1403 over the insulating film 1402, an insulating film 1404 over the insulating film 1403, a metal oxide 1431 and a metal oxide 1432 which are stacked in this order over the insulating film 1404, a conductive film 1421 touching top and side surfaces of the metal oxide 1432, a conductive film 1423 also touching the top and side surfaces of the metal oxide 1432, a conductive film 1422 over the conductive film 1421, a conductive film 1424 over the conductive film 1423, an insulating film 1405 over the conductive films 1422 and 1424, a metal oxide 1433 touching the metal oxides 1431 and 1432, the conductive films 1421 to 1424, and the insulating film 1405, an insulating film 1406 over the metal oxide 1433, a conductive film 1411 over the insulating film 1406, a conductive film 1412 over the conductive film 1411, a conductive film 1413 over the conductive film 1412, an insulating film 1407 covering the conductive film 1413, and an insulating film 1408 over the insulating film 1407. Note that the metal oxides 1431 to 1433 are collectively referred to as a metal oxide 1430.

The metal oxide 1432 is a semiconductor and functions as a channel of the transistor 1400a. Such a transistor containing a metal oxide as a semiconductor is also referred to as an OS transistor.

Furthermore, the metal oxides 1431 and 1432 include a region 1441 and a region 1442. The region 1441 is formed in the vicinity of a region where the conductive film 1421 is in contact with the metal oxides 1431 and 1432. The region 1442 is formed in the vicinity of a region where the conductive film 1423 is in contact with the metal oxides 1431 and 1432.

The regions 1441 and 1442 serve as low-resistance regions. The region 1441 contributes to a decrease in the contact resistance between the conductive film 1421 and the metal oxides 1431 and 1432. The region 1442 also contributes to a decrease in the contact resistance between the conductive film 1423 and the metal oxides 1431 and 1432.

The conductive films 1421 and 1422 serve as one of source and drain electrodes of the transistor 1400a. The conductive films 1423 and 1424 serve as the other of the source and drain electrodes of the transistor 1400a.

The conductive film 1422 is configured to allow less oxygen to pass therethrough than the conductive film 1421. It is thus possible to prevent a decrease in the conductivity of the conductive film 1421 due to oxidation. The conductive film 1424 is also configured to allow less oxygen to pass therethrough than the conductive film 1423. It is thus possible to prevent a decrease in the conductivity of the conductive film 1423 due to oxidation.

The conductive films 1411 to 1413 serve as a first gate electrode of the transistor 1400a. The conductive films 1411 and 1413 are configured to allow less oxygen to pass therethrough than the conductive film 1412. It is thus possible to prevent a decrease in the conductivity of the conductive film 1412 due to oxidation.

The insulating film 1406 serves as a first gate insulating film of the transistor 1400a.

The conductive film 1414 serves as a second gate electrode of the transistor 1400a. The potential applied to the conductive films 1411 to 1413 may be the same as or different from that applied to the conductive film 1414. The conductive film 1414 may be omitted in some cases.

The insulating films 1401 to 1404 serve as a base insulating film of the transistor 1400a. The insulating films 1402 to 1404 also serve as a second gate insulating film of the transistor 1400a.

The insulating films 1405, 1407, and 1408 serve as a protective insulating film or an interlayer insulating film of the transistor 1400a.

As illustrated in FIG. 17C, the side surface of the metal oxide 1432 is surrounded by the conductive film 1411. With this structure, the metal oxide 1432 can be electrically surrounded by an electric field of the conductive film 1411. Such a transistor structure in which a semiconductor is electrically surrounded by an electric field of a gate electrode is referred to as a surrounded channel (s-channel) structure. With such a structure, a channel is formed in the entire metal oxide 1432 (bulk). In the s-channel structure, a large amount of current can flow between a source and a drain of a transistor, increasing the on-state current of the transistor.

The s-channel structure, because of its high on-state current, is suitable for a semiconductor device such as LSI which requires a miniaturized transistor. A semiconductor device including the miniaturized transistor can have a high integration degree and high density.

In the transistor 1400a, a region serving as a gate electrode is formed so as to fill an opening 1415 formed in the insulating film 1405 or the like, that is, in a self-aligned manner.

As illustrated in FIG. 17B, the conductive films 1411 and 1422 have a region where they overlap with each other with the insulating film positioned therebetween. The conductive films 1411 and 1423 also have a region where they overlap with each other with the insulating film positioned therebetween. These regions serve as the parasitic capacitance caused between the gate electrode and the source or drain electrode and might decrease the operation speed of the transistor 1400a. This parasitic capacitance can be reduced by providing the insulating film 1405 in the transistor 1400a. The insulating film 1405 preferably contains a material with a low relative dielectric constant.

Figure 18A:
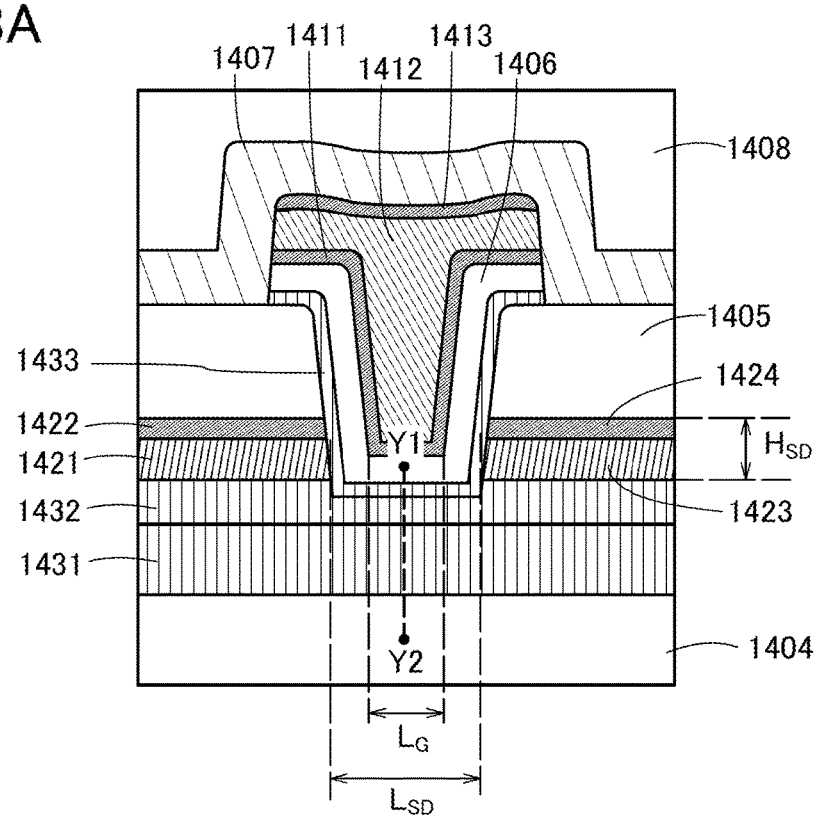
FIGS. 18A and 18B are a cross-sectional view and an energy band diagram illustrating a structural example of a transistor.

FIG. 18A is an enlarged view of the center portion of FIG. 17B. In FIG. 18A, a width $L_G$ indicates the length of a region where the bottom surface of the conductive film 1411 faces parallel to the top surface of the metal oxide 1432 with the insulating film 1406 and the metal oxide 1433 positioned therebetween. The width $L_G$ is the line width of the gate electrode. In FIG. 18A, a width $L_{SD}$ indicates the length between the conductive films 1421 and 1423. The width $L_{SD}$ is the length between the source electrode and the drain electrode.

The width $L_{SD}$ is generally determined by the minimum feature size. As illustrated in FIG. 18A, the width $L_G$ is smaller than the width $L_{SD}$. This means that in the transistor 1400a, the line width of the gate electrode can be made smaller than the minimum feature size; specifically, the width $L_G$ can be greater than or equal to 5 nm and less than or equal to 60 nm, and preferably greater than or equal to 5 nm and less than or equal to 30 nm.

In FIG. 18A, a height $H_{SD}$ indicates the total thickness of the conductive films 1421 and 1422, or the total thickness of the conductive films 1423 and 1424. The thickness of the insulating film 1406 is preferably less than or equal to the height $H_{SD}$, in which case the electric field of the gate electrode can be applied to the entire channel formation region. The thickness of the insulating film 1406 is less than or equal to 30 nm, preferably less than or equal to 10 nm.

The parasitic capacitance between the conductive films 1422 and 1411 and the parasitic capacitance between the conductive films 1424 and 1411 are inversely proportional to the thickness of the insulating film 1405. For example, the thickness of the insulating film 1405 is preferably three times or more, and further preferably five times or more the thickness of the insulating film 1406, in which case the parasitic capacitance is negligibly small. As a result, the transistor 1400a can operate at high frequencies.

Components of the transistor 1400a will be described below.

<<Metal Oxide Layer>>

First, a metal oxide that can be used as the metal oxides 1431 to 1433 will be described. The transistor 1400a preferably has a low off-state current. Examples of the transistor with a low off-state current include a transistor including an oxide semiconductor in a channel formation region.

The metal oxide 1432 is an oxide semiconductor containing indium (In), for example. The metal oxide 1432 can have high carrier mobility (electron mobility) by containing indium, for example. The metal oxide 1432 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 1432 preferably contains zinc (Zn). When containing zinc, the metal oxide is easily crystallized in some cases.

Note that the metal oxide 1432 is not limited to the oxide semiconductor containing indium. The metal oxide 1432 may be an oxide semiconductor that does not contain indium and contains at least one of zinc, gallium, and tin (e.g., a zinc tin oxide or a gallium tin oxide).

For the metal oxide 1432, an oxide semiconductor with a wide energy gap is used, for example. The energy gap of the metal oxide 1432 is, for example, greater than or equal to 2.5 eV and less than or equal to 4.2 eV, preferably greater than or equal to 2.8 eV and less than or equal to 3.8 eV, and further preferably greater than or equal to 3 eV and less than or equal to 3.5 eV.

The metal oxides 1431 and 1433 include, for example, one or more, or two or more elements other than oxygen included in the metal oxide 1432. Since the metal oxides 1431 and 1433 include one or more, or two or more elements other than oxygen included in the metal oxide 1432, an interface state is less likely to be formed at an interface between the metal oxides 1431 and 1432 and an interface between the metal oxides 1432 and 1433.

In the case of using an In-M-Zn oxide as the metal oxide 1431, when the total proportion of In and M is assumed to be 100 atomic %, the proportions of In and M are preferably set to be lower than 50 atomic % and higher than 50 atomic %, respectively, and further preferably lower than 25 atomic % and higher than 75 atomic %, respectively. When the metal oxide 1431 is formed by a sputtering method, a sputtering target with the above composition is preferably used. For example, In:M:Zn is preferably 1:3:2 or 1:3:4.

In the case of using an In-M-Zn oxide as the metal oxide 1432, when the total proportion of In and M is assumed to be 100 atomic %, the proportions of In and M are preferably set to be higher than 25 atomic % and lower than 75 atomic %, respectively, and further preferably higher than 34 atomic % and lower than 66 atomic %, respectively. When the metal oxide 1432 is formed by a sputtering method, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the metal oxide 1432 may be 4:2:3 or in the neighborhood of 4:2:3.

In the case of using an In-M-Zn oxide as the metal oxide 1433, when the total proportion of In and M is assumed to be 100 atomic %, the proportions of In and M are preferably set to be lower than 50 atomic % and higher than 50 atomic %, respectively, and further preferably lower than 25 atomic % and higher than 75 atomic %, respectively. For example, In:M:Zn is preferably 1:3:2 or 1:3:4. The metal oxide 1433 may be a metal oxide that is the same type as that of the metal oxide 1431.

The metal oxide 1431 or the metal oxide 1433 does not necessarily contain indium in some cases. For example, the metal oxide 1431 or the metal oxide 1433 may be gallium oxide.

Figure 18B:
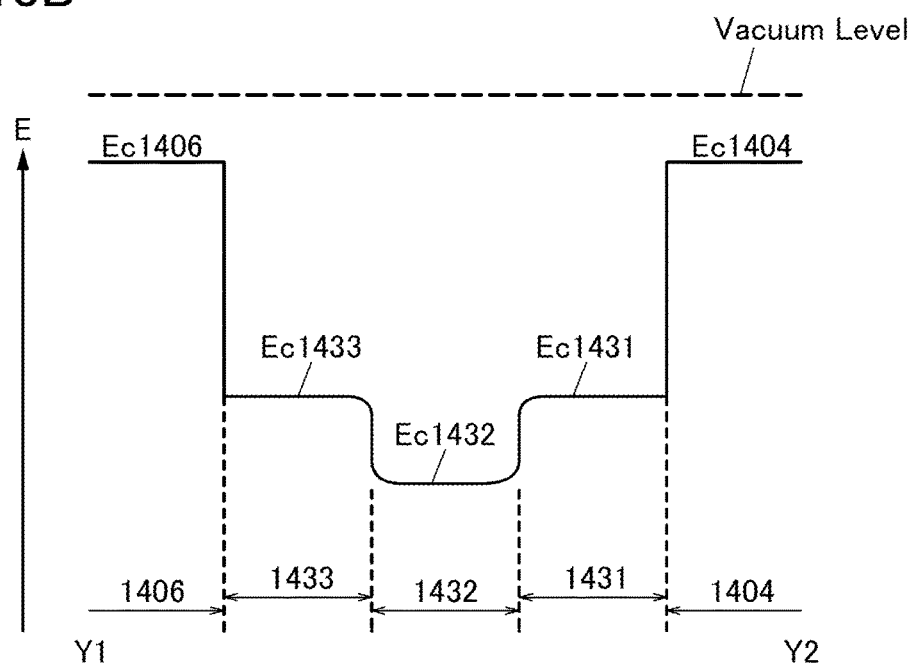

Next, the function and effect of the metal oxide 1430, which is a stack of the metal oxides 1431 to 1433, are described with reference to the energy band diagram in FIG. 18B. FIG. 18B illustrates an energy band structure of a portion taken along dashed line Y1-Y2 in FIG. 18A, that is, the energy band structure of the channel formation region of the transistor 1400a and the vicinity thereof.

In FIG. 18B, Ec1404, Ec1431, Ec1432, Ec1433, and Ec1406 indicate the conduction band minimum of the insulating film 1404, the metal oxide 1431, the metal oxide 1432, the metal oxide 1433, and the insulating film 1406, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as an ionization potential). Note that the energy gap can be measured using a spectroscopic ellipsometer. The energy difference between the vacuum level and the valence band maximum can be measured using an ultraviolet photoelectron spectroscopy (UPS) device.

Since the insulating films 1404 and 1406 are insulators, Ec1406 and Ec1404 are closer to the vacuum level (i.e., have a lower electron affinity) than Ec1431, Ec1432, and Ec1433.

As the metal oxide 1432, a metal oxide having higher electron affinity than those of the metal oxides 1431 and 1433 is used. A difference between the electron affinity of the metal oxide 1432 and the electron affinity of the metal oxide 1431 (or the metal oxide 1433) is, for example, greater than or equal to 0.07 eV and less than or equal to 1.3 eV, preferably greater than or equal to 0.1 eV and less than or equal to 0.7 eV, and further preferably greater than or equal to 0.15 eV and less than or equal to 0.4 eV.

An indium gallium oxide has low electron affinity and a high oxygen-blocking property. Therefore, the metal oxide 1433 is preferably an indium gallium oxide. The gallium atomic ratio [Ga/(In+Ga)] is, for example, higher than or equal to 70%, preferably higher than or equal to 80%, and further preferably higher than or equal to 90%.

At this time, when gate voltage is applied, a channel is formed in the metal oxide 1432 having the highest electron affinity among the metal oxides 1431 to 1433.

At this time, electrons move mainly in the metal oxide 1432, not in the metal oxides 1431 and 1433. Hence, the on-state current hardly varies even when the interface state density, which inhibits electron movement, is high at the interface between the metal oxide 1431 and the insulating film 1404 or at the interface between the metal oxide 1433 and the insulating film 1406. The metal oxides 1431 and 1433 function as an insulating film.

In some cases, there is a mixed region of the metal oxides 1431 and 1432 between the metal oxides 1431 and 1432. Furthermore, in some cases, there is a mixed region of the metal oxides 1432 and 1433 between the metal oxides 1432 and 1433. Because the mixed region has a low interface state density, a stack of the metal oxides 1431 to 1433 has a band structure where energy at each interface and in the vicinity of the interface is changed continuously (continuous junction).

As described above, the interface between the metal oxides 1431 and 1432 or the interface between the metal oxides 1432 and 1433 has a low interface state density. Hence, electron movement in the metal oxide 1432 is less likely to be inhibited and the on-state current of the transistor can be increased.

Electron movement in the transistor is inhibited, for example, in the case where physical unevenness in a channel formation region is large. To increase the on-state current of the transistor, for example, root mean square (RMS) roughness with a measurement area of 1 μm×1 μm of a top surface or a bottom surface of the metal oxide 1432 (a formation surface; here, the top surface of the metal oxide 1431) is less than 1 nm, preferably less than 0.6 nm, further preferably less than 0.5 nm, and still further preferably less than 0.4 nm. The average surface roughness (Ra) with the measurement area of 1 μm×1 μm is less than 1 nm, preferably less than 0.6 nm, further preferably less than 0.5 nm, and still further preferably less than 0.4 nm. The maximum difference (P-V) with the measurement area of 1 μm×1 μm is less than 10 nm, preferably less than 9 nm, further preferably less than 8 nm, and still further preferably less than 7 nm.

The electron movement is also inhibited in the case where the density of defect states is high in the channel formation region. For example, in the case where the metal oxide 1432 contains oxygen vacancies (Vo), donor levels are formed by entry of hydrogen into sites of oxygen vacancies in some cases. A state in which hydrogen enters sites of oxygen vacancies is denoted by VoH in the following description in some cases. VoH is a factor of decreasing the on-state current of the transistor because VoH scatters electrons. Note that sites of oxygen vacancies become more stable by entry of oxygen than by entry of hydrogen. Thus, by decreasing oxygen vacancies in the metal oxide 1432, the on-state current of the transistor can be increased in some cases.

For example, at a certain depth in the metal oxide 1432 or in a certain region of the metal oxide 1432, the concentration of hydrogen measured by secondary ion mass spectrometry (SIMS) is set to be higher than or equal to $1 \times 10^{16}$ atoms/cm$^3$ and lower than or equal to $2 \times 10^{20}$ atoms/cm$^3$, preferably higher than or equal to $1 \times 10^{16}$ atoms/cm$^3$ and lower than or equal to $5 \times 10^{19}$ atoms/cm$^3$, further preferably higher than or equal to $1 \times 10^{16}$ atoms/cm$^3$ and lower than or equal to $1 \times 10^{19}$ atoms/cm$^3$, and still further preferably higher than or equal to $1 \times 10^{16}$ atoms/cm$^3$ and lower than or equal to $5 \times 10^{18}$ atoms/cm$^3$.

To decrease oxygen vacancies in the metal oxide 1432, for example, there is a method in which excess oxygen contained in the insulating film 1404 is moved to the metal oxide 1432 through the metal oxide 1431. In that case, the metal oxide 1431 is preferably a layer having an oxygen-transmitting property (a layer through which oxygen passes or is transmitted).

Note that in the case where the transistor has an s-channel structure, a channel is formed in the entire metal oxide 1432. Therefore, as the metal oxide 1432 has larger thickness, a channel region becomes larger. In other words, the thicker the metal oxide 1432 is, the higher the on-state current of the transistor is.

Moreover, the thickness of the metal oxide 1433 is preferably as small as possible to increase the on-state current of the transistor. For example, the metal oxide 1433 has a region with a thickness of less than 10 nm, preferably less than or equal to 5 nm, and further preferably less than or equal to 3 nm. Meanwhile, the metal oxide 1433 has a function of blocking entry of elements other than oxygen (such as hydrogen and silicon) included in the adjacent insulator into the metal oxide 1432 where a channel is formed. Thus, the metal oxide 1433 preferably has a certain thickness. For example, the metal oxide 1433 may have a region with a thickness of greater than or equal to 0.3 nm, preferably greater than or equal to 1 nm, and further preferably greater than or equal to 2 nm. The metal oxide 1433 preferably has an oxygen blocking property to inhibit outward diffusion of oxygen released from the insulating film 1404 and the like.

To improve reliability, preferably, the thickness of the metal oxide 1431 is large and the thickness of the metal oxide 1433 is small. For example, the metal oxide 1431 has a region with a thickness of greater than or equal to 10 nm, preferably greater than or equal to 20 nm, further preferably greater than or equal to 40 nm, and still further preferably greater than or equal to 60 nm. An increase in the thickness of the metal oxide 1431 can increase the distance from the interface between the adjacent insulator and the metal oxide 1431 to the metal oxide 1432 where a channel is formed. Note that the metal oxide 1431 has a region with a thickness of, for example, less than or equal to 200 nm, preferably less than or equal to 120 nm, and further preferably less than or equal to 80 nm, otherwise the productivity of the semiconductor device might be decreased.

For example, a region in which the concentration of silicon is higher than or equal to $1\times10^{16}$ atoms/cm$^3$ and lower than $1\times10^{19}$ atoms/cm$^3$ is provided between the metal oxides 1432 and 1431. The concentration of silicon is preferably higher than or equal to $1\times10^{16}$ atoms/cm$^3$ and lower than $5\times10^{18}$ atoms/cm$^3$, and further preferably higher than or equal to $1\times10^{16}$ atoms/cm$^3$ and lower than $2\times10^{18}$ atoms/cm$^3$. A region in which the concentration of silicon is higher than or equal to $1\times10^{16}$ atoms/cm$^3$ and lower than $1\times10^{19}$ atoms/cm$^3$ is provided between the metal oxides 1432 and 1433. The concentration of silicon is preferably higher than or equal to $1\times10^{16}$ atoms/cm$^3$ and lower than $5\times10^{18}$ atoms/cm$^3$, and further preferably higher than or equal to $1\times10^{16}$ atoms/cm$^3$ and lower than $2\times10^{18}$ atoms/cm$^3$. The concentration of silicon can be measured by SIMS.

It is preferable to reduce the concentration of hydrogen in the metal oxides 1431 and 1433 in order to reduce the concentration of hydrogen in the metal oxide 1432. The metal oxides 1431 and 1433 each have a region in which the concentration of hydrogen is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$. The concentration of hydrogen can be measured by SIMS. It is also preferable to reduce the concentration of nitrogen in the metal oxides 1431 and 1433 in order to reduce the concentration of nitrogen in the metal oxide 1432. The metal oxides 1431 and 1433 each have a region in which the concentration of nitrogen is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $1\times10^{18}$ atoms/cm$^3$, and still further preferably higher than or equal to $1\times10^{16}$ atoms/cm$^3$ and lower than or equal to $5\times10^{17}$ atoms/cm$^3$. The concentration of nitrogen can be measured by SIMS.

The metal oxides 1431 to 1433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 1431 and 1432 are formed, first heat treatment is preferably performed. The first heat treatment can be performed at a temperature higher than or equal to 250° C. and lower than or equal to 650° C., preferably higher than or equal to 450° C. and lower than or equal to 600° C., and further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The crystallinity of the metal oxides 1431 and 1432 can be increased by the first heat treatment. Furthermore, impurities such as hydrogen and water can be removed by the first heat treatment.

The above three-layer structure is an example. For example, a two-layer structure without one of the metal oxides 1431 and 1433 may be employed. Alternatively, any one of the metal oxides 1431 to 1433 may be provided over or below the metal oxide 1431 or over or below the metal oxide 1433, i.e., a four-layer structure may be employed. Further alternatively, an n-layer structure (n is an integer of 5 or more) in which any one of the metal oxides 1431 to 1433 is provided at two or more of the following positions may be employed: over the metal oxide 1431, below the metal oxide 1431, over the metal oxide 1433, and below the metal oxide 1433.

<<Substrate>>

As the substrate 1450, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. The semiconductor substrate may be a silicon on insulator (SOI) substrate in which an insulating region is provided in the above semiconductor substrate. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 1450. As a method for providing a transistor over a flexible substrate, there is a method in which a transistor is formed over a non-flexible substrate, and then the transistor is separated and transferred to the substrate 1450 which is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 μm and less than or equal to 700 μm, preferably greater than or equal to 10 μm and less than or equal to 500 μm, and further preferably greater than or equal to 15 μm and less than or equal to 300 μm. When the substrate 1450 has a small thickness, the weight of the semiconductor device can be reduced. When the substrate 1450 has a small thickness, even in the case of using glass or the like, the substrate 1450 may have elasticity or a property of returning to its original shape when bending or pulling is stopped. Therefore, an impact applied to the semiconductor device over the substrate 1450, which is caused by dropping or the like, can be reduced. That is, a durable semiconductor device can be provided.

For the flexible substrate, metal, an alloy, a resin, glass, or fiber thereof can be used, for example. The flexible substrate preferably has a lower coefficient of linear expansion because deformation due to an environment is suppressed. The flexible substrate is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

<<Base Insulating Film>>

The insulating film 1401 has a function of electrically isolating the substrate 1450 from the conductive film 1414. The insulating film 1401 or 1402 is formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 1402 may be formed using silicon oxide with high step coverage which is formed by reacting tetraethyl orthosilicate (TEOS), silane, or the like with oxygen, nitrous oxide, or the like. After the insulating film 1402 is formed, the insulating film 1402 may be subjected to planarization treatment using a CMP method or the like to improve the planarity of the top surface thereof.

The insulating film 1404 preferably contains an oxide. In particular, the insulating film 1404 preferably contains an oxide material from which part of oxygen is released by heating. The insulating film 1404 preferably contains an oxide containing oxygen more than that in the stoichiometric composition. Part of oxygen is released by heating from an oxide film containing oxygen more than that in the stoichiometric composition. Oxygen released from the insulating film 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating film 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 1404.

To make the insulating film 1404 contain excess oxygen, the insulating film 1404 is formed in an oxygen atmosphere, for example. Alternatively, a region containing excess oxygen may be formed by introducing oxygen into the insulating film 1404 that has been formed. Both the methods may be combined.

For example, oxygen (at least including any of oxygen radicals, oxygen atoms, and oxygen ions) may be introduced into the insulating film 1404 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used for oxygen introducing treatment. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 1404 is formed, the insulating film 1404 may be subjected to planarization treatment using a CMP method or the like to improve the planarity of the top surface thereof.

The insulating film 1403 has a passivation function of preventing oxygen contained in the insulating film 1404 from decreasing by bonding to metal contained in the conductive film 1414.

The insulating film 1403 has a function of blocking oxygen, hydrogen, water, alkali metal, alkaline earth metal, and the like. Providing the insulating film 1403 can prevent outward diffusion of oxygen from the metal oxide 1430 and entry of hydrogen, water, or the like into the metal oxide 1430 from the outside.

The insulating film 1403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The threshold voltage of the transistor 1400a can be controlled by injecting electrons into a charge trap layer. The charge trap layer is preferably provided in the insulating film 1402 or the insulating film 1403. For example, when the insulating film 1403 is formed using hafnium oxide, aluminum oxide, tantalum oxide, aluminum silicate, or the like, the insulating film 1403 can function as a charge trap layer.

<<Gate Electrode>>

The conductive films 1411 to 1414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

<<Source Electrode and Drain Electrode>>

The conductive films 1421 to 1424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

The conductive films 1421 to 1424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<<Low-Resistance Region>>

The regions 1441 and 1442 are formed when, for example, the conductive films 1421 and 1423 take oxygen from the metal oxides 1431 and 1432. Oxygen is more likely to be extracted at higher temperatures. Oxygen vacancies are formed in the regions 1441 and 1442 through several heating steps in the manufacturing process of the transistor. In addition, hydrogen enters sites of the oxygen vacancies by heating, increasing the carrier concentration in the regions 1441 and 1442. As a result, the resistance of the regions 1441 and 1442 is reduced.

<<Gate Insulating Film>>

The insulating film 1406 preferably contains an insulator with a high relative dielectric constant. For example, the insulating film 1406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulating film 1406 preferably has a layered structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<<Interlayer Insulating Film and Protective Insulating Film>>

The insulating film 1405 preferably contains an insulator with a low relative dielectric constant. For example, the insulating film 1405 preferably contains silicon oxide, silicon oxynitride, silicon nitride oxide, silicon nitride, or a resin. Alternatively, the insulating film 1405 preferably has a layered structure containing silicon oxide or silicon oxynitride and a resin.

Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulating film 1407 has a function of blocking oxygen, hydrogen, water, alkali metal, alkaline earth metal, and the like. Providing the insulating film 1407 can prevent outward diffusion of oxygen from the metal oxide 1430 and entry of hydrogen, water, or the like into the metal oxide 1430 from the outside.

The insulating film 1407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 1407 because it is highly effective in preventing transmission of both oxygen and impurities such as hydrogen and moisture.

When the insulating film 1407 is formed using plasma containing oxygen by a sputtering method, a CVD method, or the like, oxygen can be added to side and top surfaces of the insulating films 1405 and 1406. It is preferable to perform second heat treatment at any time after the formation of the insulating film 1407. Through the second heat treatment, oxygen added to the insulating films 1405 and 1406 is diffused in the insulating films to reach the metal oxide 1430, whereby oxygen vacancies in the metal oxide 1430 can be reduced.

Figure 19A:
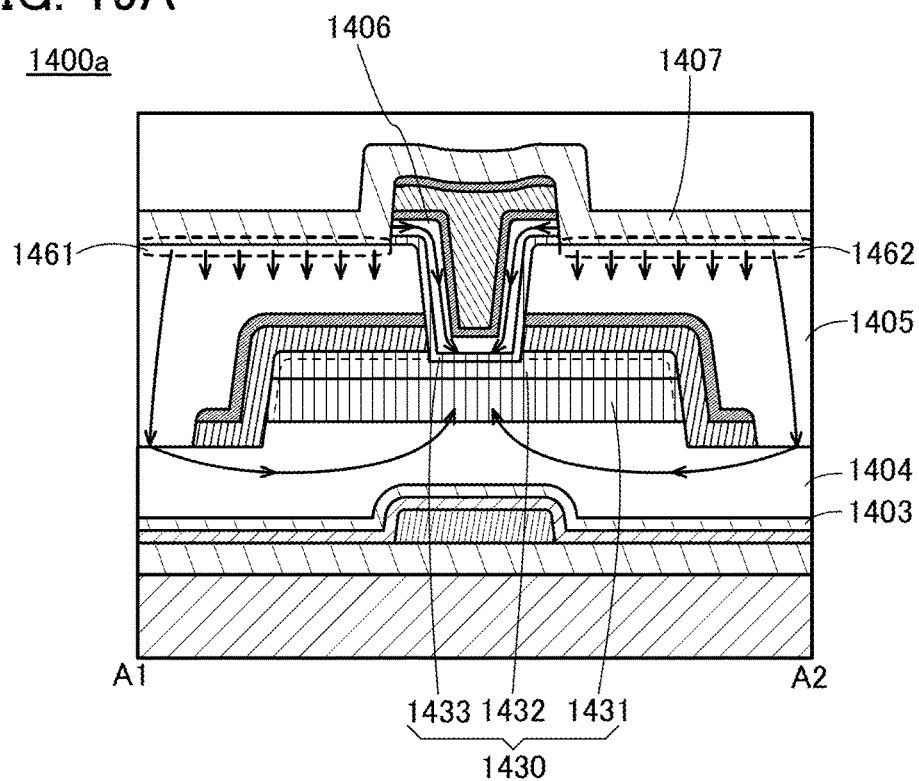
FIGS. 19A and 19B are cross-sectional views illustrating oxygen diffusion paths.
Figure 19B:
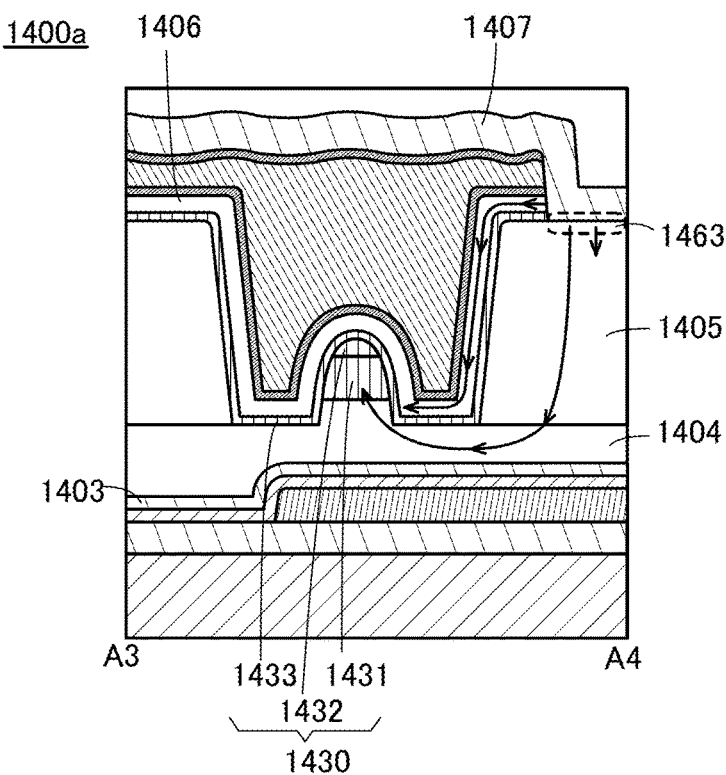

In schematic views of FIGS. 19A and 19B, oxygen added to the insulating films 1405 and 1406 in the formation of the insulating film 1407 is diffused in the insulating films through the second heat treatment and reaches the metal oxide 1430. In FIG. 19A, oxygen diffused in the cross-sectional view of FIG. 17B is indicated by arrows. In FIG. 19B, oxygen diffused in the cross-sectional view of FIG. 17C is indicated by arrows.

As illustrated in FIGS. 19A and 19B, oxygen added to the side surface of the insulating film 1406 is diffused in the insulating film 1406 and reaches the metal oxide 1430. A region 1461, a region 1462, and a region 1463 each containing excess oxygen are sometimes formed in the vicinity of the interface between the insulating films 1407 and 1405. Oxygen contained in the regions 1461 to 1463 reaches the metal oxide 1430 through the insulating films 1405 and 1404. In the case where the insulating film 1405 contains silicon oxide and the insulating film 1407 contains aluminum oxide, a mixed layer of silicon, aluminum, and oxygen is formed in the regions 1461 to 1463 in some cases.

The insulating film 1407 has a function of blocking oxygen and prevents oxygen from being diffused upward through the insulating film 1407. The insulating film 1403 also has a function of blocking oxygen and prevents oxygen from being diffused downward through the insulating film 1403.

Note that the second heat treatment may be performed at a temperature that allows oxygen added to the insulating films 1405 and 1406 to be diffused to the metal oxide 1430. For example, the description of the first heat treatment may be referred to for the second heat treatment. Alternatively, the temperature of the second heat treatment is preferably lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of oxygen from the insulating film 1404 can be inhibited. Note that the second heat treatment is not necessarily performed when heating during formation of the films can work as heat treatment comparable to the second heat treatment.

As described above, oxygen can be supplied to the metal oxide 1430 from above and below through the formation of the insulating film 1407 and the second heat treatment.

Alternatively, oxygen can be added to the insulating films 1405 and 1406 by forming a film containing indium oxide, e.g., an In-M-Zn oxide, as the insulating film 1407.

The insulating film 1408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, for the insulating film 1408, a resin such as a polyimide resin, a polyamide resin, an acrylic resin, a siloxane resin, an epoxy resin, or a phenol resin can be used. The insulating film 1408 may be a stack including any of the above materials.

Structure Example 2 of Transistor

The conductive film 1414 and the insulating films 1402 and 1403 can be omitted in the transistor 1400a illustrated in FIGS. 17A to 17C. An example of such a structure is illustrated in FIGS. 20A to 20C.

Figure 20A:
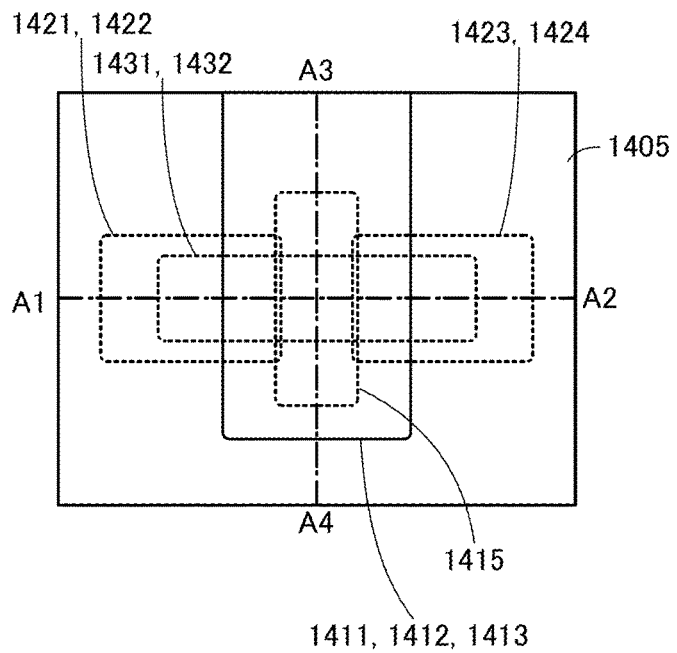
FIGS. 20A to 20C are a top view and cross-sectional views illustrating a structural example of a transistor.
Figure 20B:
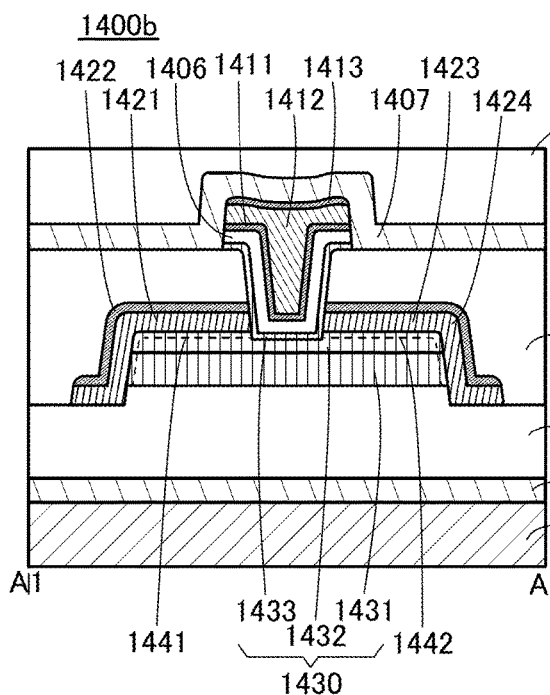
Figure 20C:
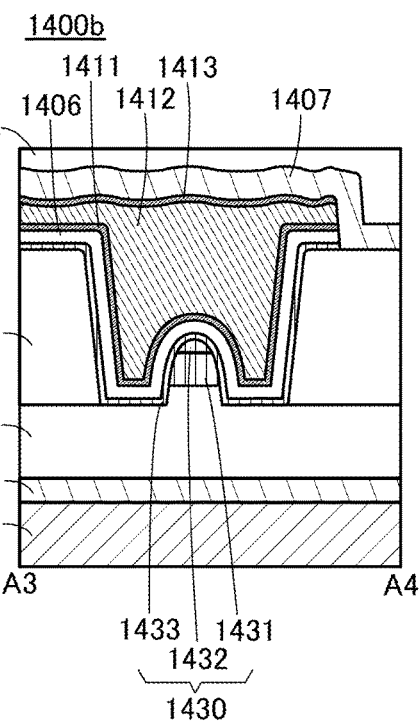

FIGS. 20A to 20C are a top view and cross-sectional views of a transistor 1400b. FIG. 20A is a top view. FIG. 20B is a cross-sectional view taken along dashed-dotted line A1-A2 in FIG. 20A, and FIG. 20C is a cross-sectional view taken along dashed-dotted line A3-A4 in FIG. 20A. Note that for simplification of the drawing, some components are not illustrated in the top view in FIG. 20A. Note that the dashed-dotted line A1-A2 and the dashed-dotted line A3-A4 are sometimes referred to as a channel length direction of the transistor 1400b and a channel width direction of the transistor 1400b, respectively.

Structure Example 3 of Transistor

In the transistor 1400a illustrated in FIGS. 17A to 17C, parts of the conductive films 1421 and 1423 that overlap with the gate electrode (the conductive films 1411 to 1413) can be reduced in thickness. An example of such a structure is illustrated in FIGS. 21A to 21C.

FIGS. 21A to 21C are a top view and cross-sectional views of a transistor 1400c. FIG. 21A is a top view. FIG. 21B is a cross-sectional view taken along dashed-dotted line A1-A2 in FIG. 21A, and FIG. 21C is a cross-sectional view taken along dashed-dotted line A3-A4 in FIG. 21A. Note that for simplification of the drawing, some components are not illustrated in the top view in FIG. 21A. Note that the dashed-dotted line A1-A2 and the dashed-dotted line A3-A4 are sometimes referred to as a channel length direction of the transistor 1400c and a channel width direction of the transistor 1400c, respectively.

In the transistor 1400c illustrated in FIG. 21B, part of the conductive film 1421 that overlaps with the gate electrode is reduced in thickness, and the conductive film 1422 covers the conductive film 1421. Part of the conductive film 1423 that overlaps with the gate electrode is also reduced in thickness, and the conductive film 1424 covers the conductive film 1423.

The transistor 1400c, which has the structure illustrated in FIG. 21B, can have an increased distance between the gate and source electrodes or between the gate and drain electrodes. This results in a reduction in the parasitic capacitance formed between the gate electrode and the source and drain electrodes. As a result, a transistor capable of high-speed operation can be obtained.

Structure Example 4 of Transistor

In the transistor 1400c illustrated in FIGS. 21A to 21C, the width of the metal oxides 1431 and 1432 can be increased in the A3-A4 direction. An example of such a structure is illustrated in FIGS. 22A to 22C.

Figure 22A:
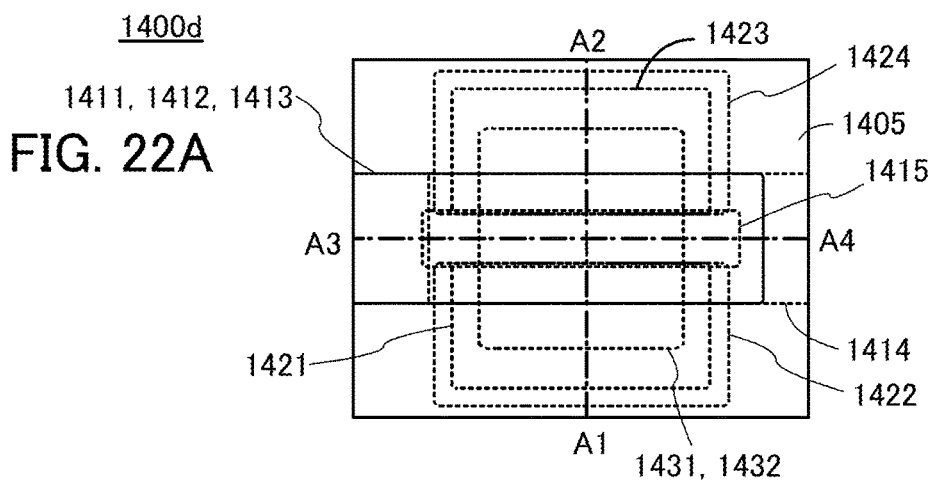
FIGS. 22A to 22C are a top view and cross-sectional views illustrating a structural example of a transistor.
Figure 22B:
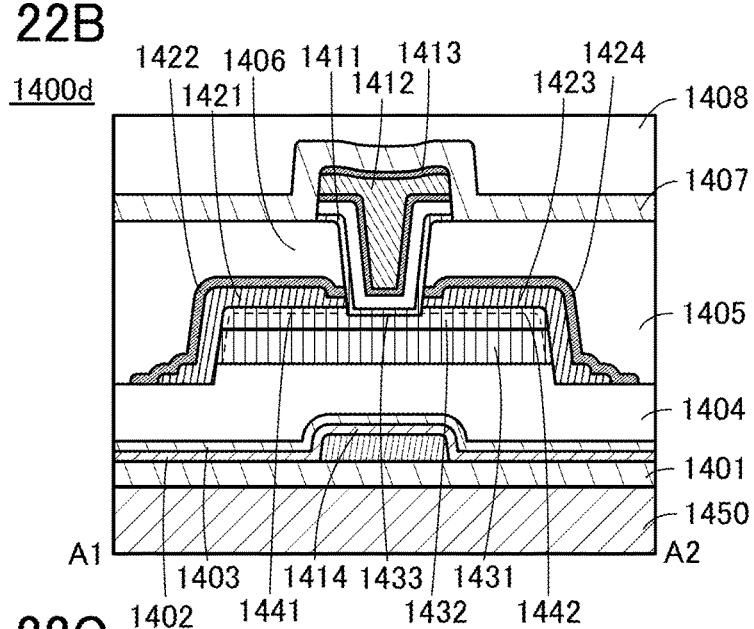
Figure 22C:
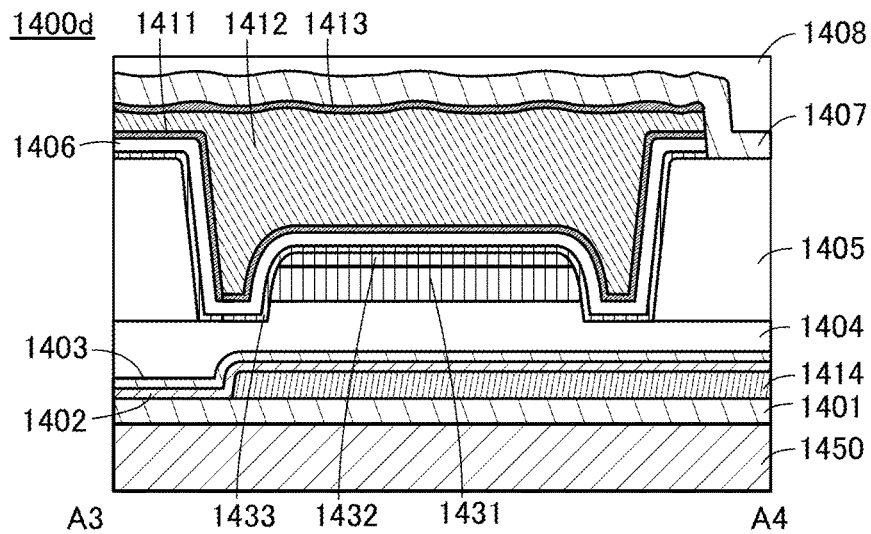

FIGS. 22A to 22C are a top view and cross-sectional views of a transistor 1400d. FIG. 22A is a top view. FIG. 22B is a cross-sectional view taken along dashed-dotted line A1-A2 in FIG. 22A, and FIG. 22C is a cross-sectional view taken along dashed-dotted line A3-A4 in FIG. 22A. Note that for simplification of the drawing, some components are not illustrated in the top view in FIG. 22A. Note that the dashed-dotted line A1-A2 and the dashed-dotted line A3-A4 are sometimes referred to as a channel length direction of the transistor 1400d and a channel width direction of the transistor 1400d, respectively.

The transistor 1400d, which has the structure illustrated in FIGS. 22A to 22C, can have an increased on-state current.

Structure Example 5 of Transistor

In the transistor 1400c illustrated in FIGS. 21A to 21C, a plurality of regions (fins) consisting of the metal oxides 1431 and 1432 may be provided in the A3-A4 direction. An example of such a structure is illustrated in FIGS. 23A to 23C.

Figure 23A:
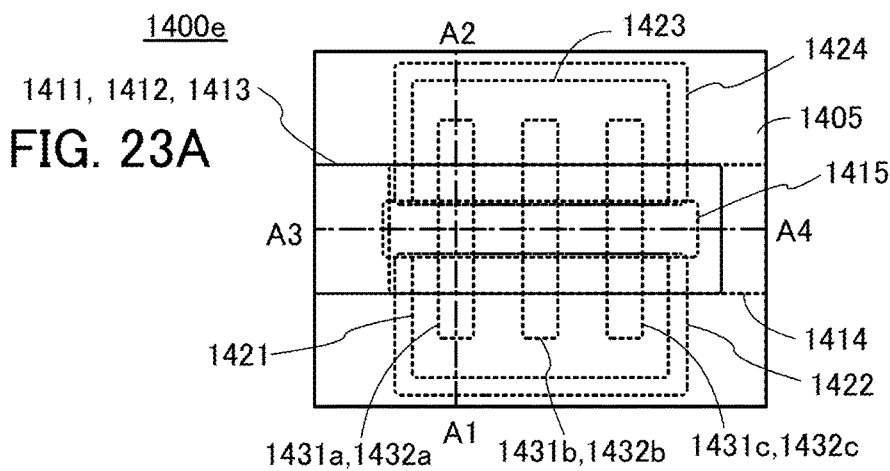
FIGS. 23A to 23C are a top view and cross-sectional views illustrating a structural example of a transistor.
Figure 23B:
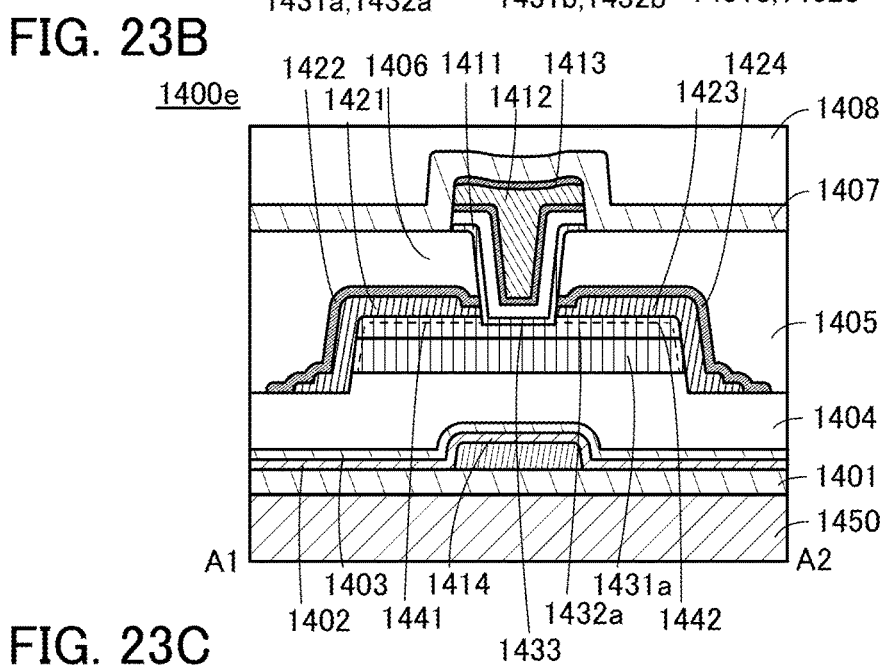
Figure 23C:
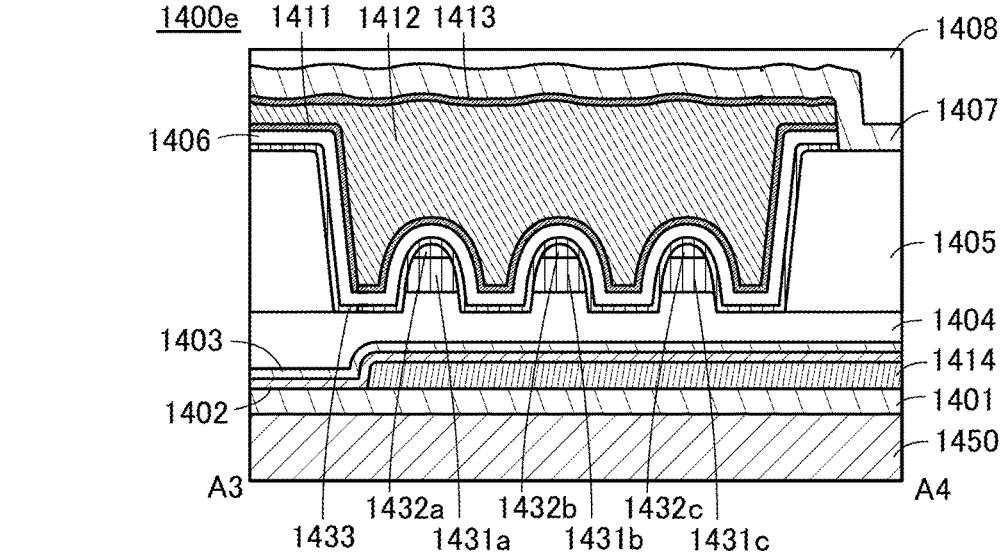

FIGS. 23A to 23C are a top view and cross-sectional views of a transistor 1400e. FIG. 23A is a top view. FIG. 23B is a cross-sectional view taken along dashed-dotted line A1-A2 in FIG. 23A, and FIG. 23C is a cross-sectional view taken along dashed-dotted line A3-A4 in FIG. 23A. Note that for simplification of the drawing, some components are not illustrated in the top view in FIG. 23A. Note that the dashed-dotted line A1-A2 and the dashed-dotted line A3-A4 are sometimes referred to as a channel length direction of the transistor 1400e and a channel width direction of the transistor 1400e, respectively.

The transistor 1400e includes a first fin consisting of metal oxides 1431a and 1432a, a second fin consisting of metal oxides 1431b and 1432b, and a third fin consisting of metal oxides 1431c and 1432c.

In the transistor 1400e, the metal oxides 1432a to 1432c where a channel is formed are surrounded by the gate electrode. Hence, a gate electric field can be applied to the entire channel, so that a transistor with a high on-state current can be obtained.

Structure Example 6 of Transistor

FIGS. 24A to 24D are a top view and cross-sectional views of a transistor 1400f. FIG. 24A is a top view of the transistor 1400f. FIG. 24B is a cross-sectional view taken along dashed-dotted line A1-A2 in FIG. 24A, and FIG. 24C is a cross-sectional view taken along dashed-dotted line A3-A4 in FIG. 24A. Note that the dashed-dotted line A1-A2 and the dashed-dotted line A3-A4 are sometimes referred to as a channel length direction and a channel width direction, respectively. The transistor 1400f has the s-channel structure like the transistor 1400a and the like. In the transistor 1400f, an insulating film 1409 is provided in contact with the side surface of the conductive film 1412 used as a gate electrode. The insulating film 1409 and the conductive film 1412 are covered with the insulating film 1407. The insulating film 1409 serves as a sidewall insulating film of the transistor 1400f. As in the transistor 1400a, the gate electrode may be a stack of the conductive films 1411 to 1413.

The insulating film 1406 and the conductive film 1412 overlap with the conductive film 1414 and the metal oxide 1432 at least partly. The side edge of the conductive film 1412 in the channel length direction is preferably approximately aligned with the side edge of the insulating film 1406 in the channel length direction. Here, the insulating film 1406 serves as a gate insulating film of the transistor 1400f, and the conductive film 1412 serves as a gate electrode of the transistor 1400f.

The metal oxide 1432 has a region that overlaps with the conductive film 1412 with the metal oxide 1433 and the insulating film 1406 positioned therebetween. Preferably, the outer edge of the metal oxide 1431 is approximately aligned with the outer edge of the metal oxide 1432, and the outer edge of the metal oxide 1433 is outside of the outer edges of the metal oxides 1431 and 1432. However, the shape of the transistor in this embodiment is not limited to that where the outer edge of the metal oxide 1433 is outside of the outer edge of the metal oxide 1431. For example, the outer edge of the metal oxide 1431 may be outside of the outer edge of the metal oxide 1433, or the side edge of the metal oxide 1431 may be approximately aligned with the side edge of the metal oxide 1433.

FIG. 24D is an enlarged view of part of FIG. 24B. As illustrated in FIG. 24D, a region 1461a, a region 1461b, a region 1461c, a region 1461d, and a region 1461e are formed in the metal oxide 1430. The regions 1461b to 1461e have a higher concentration of dopant and therefore have a lower resistance than the region 1461a. Furthermore, the regions 1461b and 1461c have a higher concentration of hydrogen and therefore have a much lower resistance than the regions 1461d and 1461e. The concentration of a dopant in the region 1461a is, for example, less than or equal to 5%, less than or equal to 2%, or less than or equal to 1% of the maximum concentration of a dopant in the region 1461b or 1461c. Note that the dopant may be rephrased as a donor, an acceptor, an impurity, or an element.

As illustrated in FIG. 24D, in the metal oxide 1430, the region 1461a largely overlaps with the conductive film 1412, and the regions 1461b to 1461e are the regions other than the region 1461a. In the regions 1461b and 1461c, the top surface of the metal oxide 1433 is in contact with the insulating film 1407. In the regions 1461d and 1461e, the top surface of the metal oxide 1433 is in contact with the insulating film 1409 or 1406. That is, as illustrated in FIG. 24D, the boundary between the regions 1461b and 1461d overlaps with the boundary between side edges of the insulating films 1407 and 1409. The same applies to the boundary between the regions 1461c and 1461e. Here, part of the regions 1461d and 1461e preferably overlaps with part of a region (channel formation region) where the metal oxide 1432 and the conductive film 1412 overlap with each other. For example, the side edges of the regions 1461d and 1461e are each preferably located inward from the side edge of the conductive film 1412 by a distance d in the channel length direction. In that case, the thickness $t_{406}$ of the insulating film 1406 and the distance d preferably satisfy $0.25t_{406} < d < t_{406}$.

In the above manner, the regions 1461d and 1461e are formed in part of the region where the metal oxide 1430 and the conductive film 1412 overlap with each other. Accordingly, the channel formation region of the transistor 1400f is in contact with the low-resistance regions 1461d and 1461e and a high-resistance offset region is not formed between the region 1461a and each of the regions 1461d and 1461e, so that the on-state current of the transistor 1400f can be increased. Furthermore, since the side edges of the regions 1461d and 1461e in the channel length direction are formed so as to satisfy the above range, the regions 1461d and 1461e can be prevented from being formed too deeply in the channel formation region and always conducted.

The regions 1461b to 1461e are formed by ion doping treatment such as an ion implantation method. Therefore, as illustrated in FIG. 24D, the positions of the side edges of the regions 1461d and 1461e in the channel length direction are sometimes shifted to the side edge of the metal oxide 1430 in the channel length direction in a deeper area from the top surface of the metal oxide 1433. The distance d in that case is the distance between the side edge of the conductive film 1412 in the channel length direction and each of the side edges of the regions 1461d and 1461e that are closest to the inner part of the conductive film 1412.

In some cases, for example, the regions 1461d and 1461e in the metal oxide 1431 do not overlap with the conductive film 1412. In that case, at least part of the regions 1461d and 1461e in the metal oxide 1431 or 1432 is preferably formed in a region overlapping with the conductive film 1412.

In addition, low-resistance regions 1451 and 1452 are preferably formed in the metal oxide 1431, the metal oxide 1432, and the metal oxide 1433 in the vicinity of the interface with the insulating film 1407. The low-resistance regions 1451 and 1452 contain at least one of elements included in the insulating film 1407. Preferably, part of the low-resistance regions 1451 and 1452 is substantially in contact with or overlaps partly with the region (the channel formation region) where the metal oxide 1432 and the conductive film 1412 overlap with each other.

Since a large part of the metal oxide 1433 is in contact with the insulating film 1407, the low-resistance regions 1451 and 1452 are likely to be formed in the metal oxide 1433. The low-resistance regions 1451 and 1452 in the metal oxide 1433 contain a higher concentration of elements included in the insulating film 1407 than the other regions of the metal oxide 1433 (e.g., the region of the metal oxide 1433 that overlaps with the conductive film 1412).

The low-resistance regions 1451 and 1452 are formed in the regions 1461*b* and 1461*c*, respectively. Ideally, the metal oxide 1430 has a structure in which the concentration of added elements is the highest in the low-resistance regions 1451 and 1452, the second highest in the regions 1461*b* to 1461*e* other than the low-resistance regions 1451 and 1452, and the lowest in the region 1461*a*. The added elements refer to a dopant for forming the regions 1461*b* and 1461*c* and an element added from the insulating film 1407 to the low-resistance regions 1451 and 1452.

Although the low-resistance regions 1451 and 1452 are formed in the transistor 1400*f*, the electronic device described in this embodiment is not limited to this structure. For example, the low-resistance regions 1451 and 1452 are not necessarily formed in the case where the regions 1461*b* and 1461*c* have a sufficiently low resistance.

Structure Example 7 of Transistor

Figure 25A:
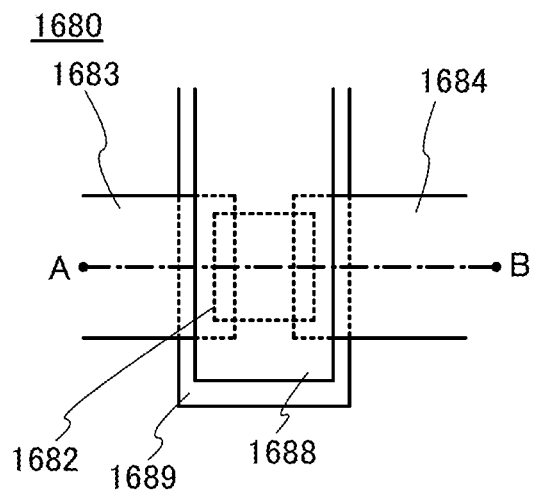
FIGS. 25A and 25B are a top view and a cross-sectional view illustrating a structural example of a transistor.
Figure 25B:
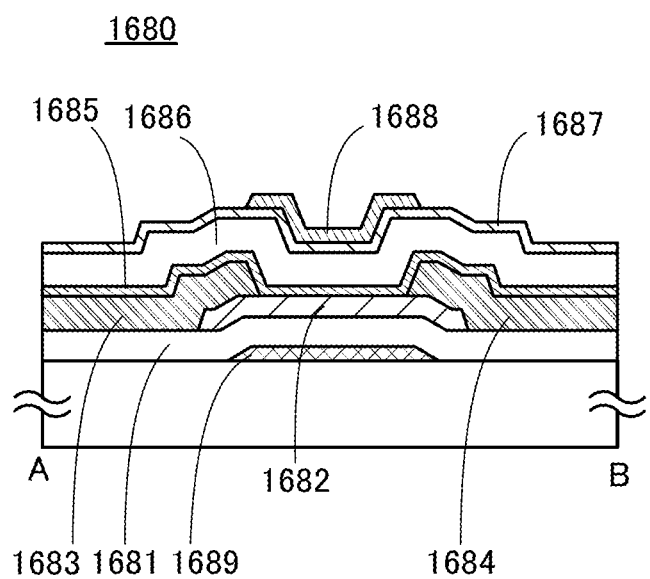

FIGS. 25A and 25B are a top view and a cross-sectional view of a transistor 1680. FIG. 25A is a top view, and FIG. 25B is a cross-sectional view taken along dashed-dotted line A-B in FIG. 25A. Note that for simplification of the drawing, some components are increased or reduced in size, or omitted in FIGS. 25A and 25B. Note that the dashed-dotted line A-B is sometimes referred to as a channel length direction.

The transistor 1680 illustrated in FIG. 25B includes a conductive film 1689 serving as a first gate, a conductive film 1688 serving as a second gate, a semiconductor 1682, a conductive film 1683 and a conductive film 1684 serving as a source and a drain, an insulating film 1681, an insulating film 1685, an insulating film 1686, and an insulating film 1687.

The conductive film 1689 is on an insulating surface. The conductive film 1689 overlaps with the semiconductor 1682 with the insulating film 1681 provided therebetween. The conductive film 1688 overlaps with the semiconductor 1682 with the insulating films 1685, 1686, and 1687 provided therebetween. The conductive films 1683 and 1684 are connected to the semiconductor 1682.

The description of the conductive films 1411 to 1414 in FIGS. 17A to 17C can be referred to for the details of the conductive films 1689 and 1688.

The conductive films 1689 and 1688 may be supplied with different potentials, or may be supplied with the same potential at the same time. Owing to the conductive film 1688 serving as the second gate electrode in the transistor 1680, threshold voltage can be stable. Note that the conductive film 1688 is not necessarily provided.

The description of the metal oxide 1432 in FIGS. 17A to 17C can be referred to for the details of the semiconductor 1682. The semiconductor 1682 may be a single layer or a stack including a plurality of semiconductor layers.

The description of the conductive films 1421 to 1424 in FIGS. 17A to 17C can be referred to for the details of the conductive films 1683 and 1684.

The description of the insulating film 1406 in FIGS. 17A to 17C can be referred to for the details of the insulating film 1681.

The insulating films 1685 to 1687 are sequentially stacked over the semiconductor 1682 and the conductive films 1683 and 1684 in FIG. 25B; however, an insulating film provided over the semiconductor 1682 and the conductive films 1683 and 1684 may be a single layer or a stack including a plurality of insulating films.

In the case of using an oxide semiconductor as the semiconductor 1682, the insulating film 1686 preferably contains oxygen at a proportion higher than or equal to that in the stoichiometric composition and has a function of supplying part of oxygen to the semiconductor 1682 by heating. Note that in the case where the provision of the insulating film 1686 directly on the semiconductor 1682 causes damage to the semiconductor 1682 at the time of formation of the insulating film 1686, the insulating film 1685 is preferably provided between the semiconductor 1682 and the insulating film 1686, as illustrated in FIG. 25B. The insulating film 1685 preferably allows oxygen to pass therethrough, and causes little damage to the semiconductor 1682 when the insulating film 1685 is formed compared with the case of the insulating film 1686. If the insulating film 1686 can be formed directly on the semiconductor 1682 while damage to the semiconductor 1682 is reduced, the insulating film 1685 is not necessarily provided.

For the insulating films 1685 and 1686, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 1687 preferably has an effect of blocking diffusion of oxygen, hydrogen, and water. Alternatively, the insulating film 1687 preferably has an effect of blocking diffusion of hydrogen and water.

As an insulating film has higher density and becomes denser or has a fewer dangling bonds and becomes more chemically stable, the insulating film has a more excellent blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 1687 has an effect of blocking diffusion of water, hydrogen, and the like, impurities such as water and hydrogen can be prevented from entering the semiconductor 1682. In the case where an oxide semiconductor is used as the semiconductor 1682, part of water or hydrogen that enters the oxide semiconductor serves as a donor. Thus, the use of the insulating film 1687 having the blocking effect can prevent a shift in the threshold voltage of the transistor 1680 due to generation of donors.

In addition, in the case where an oxide semiconductor is used as the semiconductor 1682 and the insulating film 1687 having an effect of blocking diffusion of oxygen is provided, oxygen diffusion from the oxide semiconductor to the outside can be prevented. Accordingly, oxygen vacancies in the oxide semiconductor that serve as donors are reduced, so that a shift in the threshold voltages of the transistor 1680 due to generation of donors can be prevented.

Note that this embodiment can be combined with any of the other embodiments in this specification as appropriate.

Embodiment 6

In this embodiment, structure examples of a device that can be applied to the electronic device described in the above embodiments will be described with reference to FIGS. 26A and 26B, FIGS. 27A and 27B, and FIGS. 28A to 28D.

<Cross-Sectional View 1>

FIGS. 26A and 26B each illustrate part of a cross-sectional view of an electronic device. FIG. 26A illustrates a cross-sectional view of transistors included in a memory cell array and an R/W circuit of the electronic device in the channel length direction, and FIG. 26B illustrates a cross-sectional view of the transistors in the channel width direction.

The semiconductor device SCD illustrated in FIGS. 26A and 26B includes a tier L1, a tier L2, a tier L3, a tier L4, a tier L5, a tier L6, a tier L7, a tier L8, a tier L9, a tier L10, a tier L11, a tier L12 in order from the bottom.

The tier L1 includes a substrate 1700, a transistor TrA formed using the substrate 1700, an element isolation layer 1701, and a plurality of conductors such as a conductor 1710 and a conductor 1711.

The tier L2 includes a plurality of wirings such as a wiring 1730 and a wiring 1731.

The tier L3 includes a plurality of conductors such as a conductor 1712 and a conductor 1713 and a plurality of wirings (not illustrated).

The tier L4 includes an insulator 1706, a transistor TrB, an insulator 1702, an insulator 1703, and a plurality of conductors such as a conductor 1714 and a conductor 1715.

The tier L5 includes a plurality of wirings such as a wiring 1732 and a wiring 1733.

The tier L6 includes a plurality of conductors such as a conductor 1716.

The tier L7 includes a transistor TrC, an insulator 1704, an insulator 1705, and a plurality of conductors such as a conductor 1717.

The tier L8 includes a plurality of wirings such as a wiring 1734 and a wiring 1735.

The tier L9 includes a plurality of conductors such as a conductor 1718 and a plurality of wirings (not illustrated).

The tier L10 includes a plurality of wirings such as a wiring 1736.

The tier L11 includes a capacitor C1 and a plurality of conductors such as a conductor 1719. The capacitor C1 includes a first electrode 1751, a second electrode 1752, and an insulator 1753.

The tier L12 includes a plurality of wirings such as a wiring 1737.

The OS transistor described in Embodiment 5 is preferably used as the transistors TrB and TrC. In FIGS. 26A and 26B, the transistor 1400c illustrated in FIGS. 21A and 21B is used as the transistors TrB and TrC.

The transistor TrA is preferably formed using a semiconductor material different from that for the transistors TrB and TrC. In FIGS. 26A and 26B, a Si transistor is used as the transistor TrA.

That is, the R/W circuit is preferably in the tiers L1 and L2. The memory cell array is preferably in the tiers L4 to L11. In the case where OS transistors are used as the switch SW0a, the switch SW0c, and the switch SW0e of the R/W circuit, they may be provided in the tiers L4 to L7.

As the substrate 1700, a single crystal semiconductor substrate or a polycrystalline semiconductor substrate of silicon or silicon carbide, a compound semiconductor substrate of silicon germanium, an SOI substrate, or the like can be used.

For example, a glass substrate, a quartz substrate, a plastic substrate, a metal substrate, a flexible substrate, an attachment film, paper including a fibrous material, or a base film may be used as the substrate 1700. Alternatively, a semiconductor element may be formed using one substrate, and then transferred to another substrate. In FIGS. 26A and 26B, as an example, a single crystal silicon wafer is used as the substrate 1700.

Figure 28A:
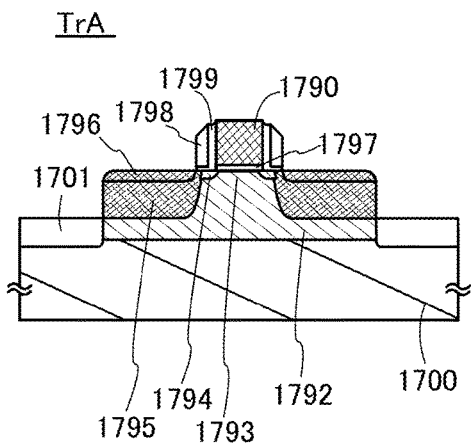
FIGS. 28A to 28D are cross-sectional views illustrating a structural example of a transistor.
Figure 28B:
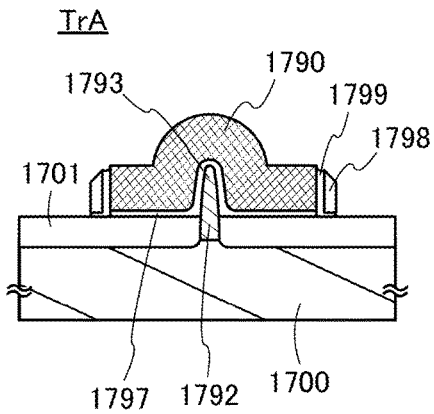

The transistor TrA is described in detail with reference to FIGS. 28A and 28B. FIG. 28A is a cross-sectional view of the transistor TrA in the channel length direction and FIG. 28B is a cross-sectional view of the transistor TrA in the channel width direction. The transistor TrA includes a channel formation region 1793 formed in a well 1792, low concentration impurity regions 1794 and high concentration impurity regions 1795 (also collectively referred to as an impurity region simply), conductive regions 1796 provided in contact with the impurity region, a gate insulating film 1797 provided over the channel formation region 1793, a gate electrode 1790 provided over the gate insulating film 1797, and sidewall insulating layers 1798 and 1799 provided on side surfaces of the gate electrode 1790. Note that the conductive regions 1796 can be formed using metal silicide or the like.

In the transistor TrA in FIG. 28B, the channel formation region 1793 has a projecting portion, and the gate insulating film 1797 and the gate electrode 1790 are provided along side and top surfaces of the channel formation region 1793. The transistor with such a shape is referred to as a FIN-type transistor. Although the projecting portion is formed by processing part of the semiconductor substrate in this embodiment, a semiconductor layer with a projecting portion may be formed by processing an SOI substrate.

Figure 28C:
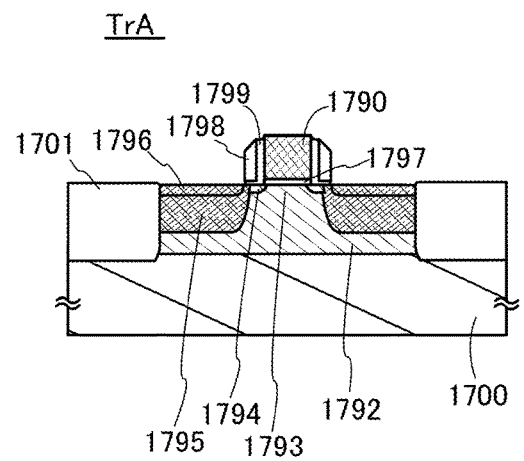
Figure 28D:
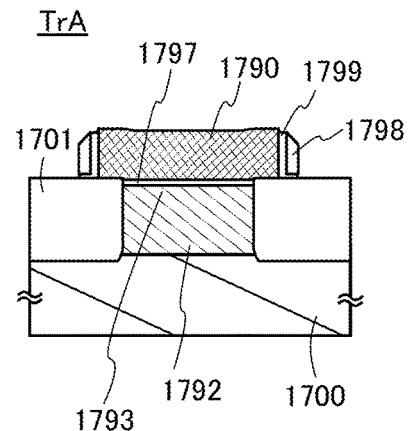

Note that the transistor TrA is not limited to the FIN-type transistor, and may be a planar-type transistor illustrated in FIGS. 28C and 28D. FIG. 28C is a cross-sectional view of the transistor TrA in the channel length direction and FIG. 28D is a cross-sectional view of the transistor TrA in the channel width direction. The reference numerals in FIGS. 28C and 28D are the same as those illustrated in FIGS. 28A and 28B.

In FIGS. 26A and 26B, the insulators 1702 to 1706 preferably have a blocking effect against hydrogen, water, and the like. Water, hydrogen, and the like are factors that generate carriers in an oxide semiconductor; thus, providing such a blocking layer against hydrogen, water, and the like can improve the reliability of the transistors TrB and TrC. Examples of the insulator having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The wirings 1730 to 1737 and the conductors 1710 to 1719 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. It is also preferable to use a low-resistance conductive material such as aluminum or copper. The use of a Cu—Mn alloy is further preferable, in which case manganese oxide formed at the interface with an insulator containing oxygen has a function of preventing Cu diffusion.

In FIGS. 26A and 26B, regions without reference numerals and hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in the regions, an organic resin such as a polyimide resin, a polyamide resin, an acrylic resin, a siloxane resin, an epoxy resin, or a phenol resin can be used. Note that in this specification, an oxynitride refers to a compound that contains more oxygen than nitrogen, and a nitride oxide refers to a compound that contains more nitrogen than oxygen.

<Cross-Sectional View 2>

Figure 27A:
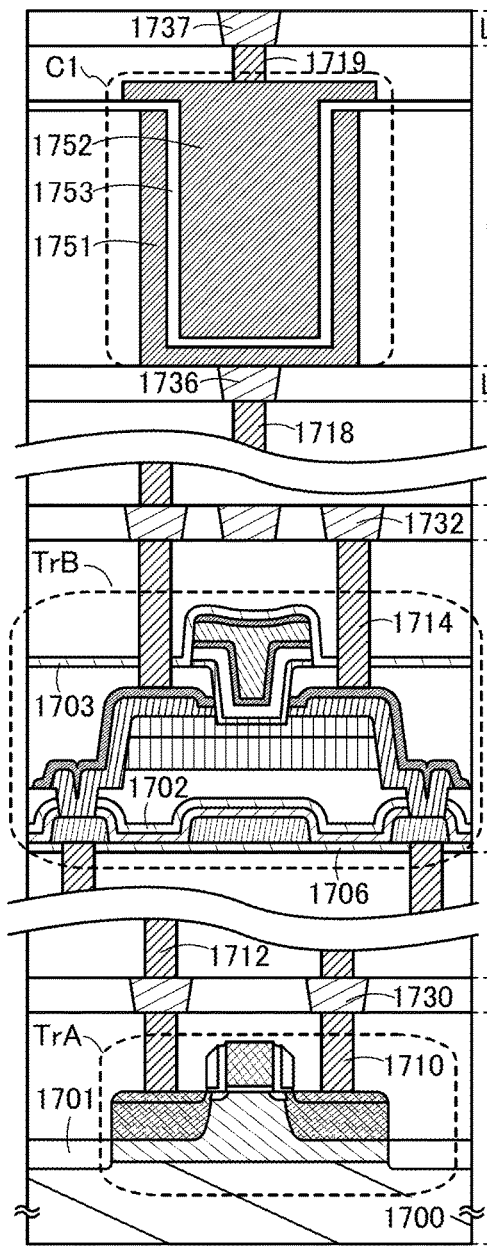
FIGS. 27A and 27B are cross-sectional views illustrating a structural example of a transistor.
Figure 27B:
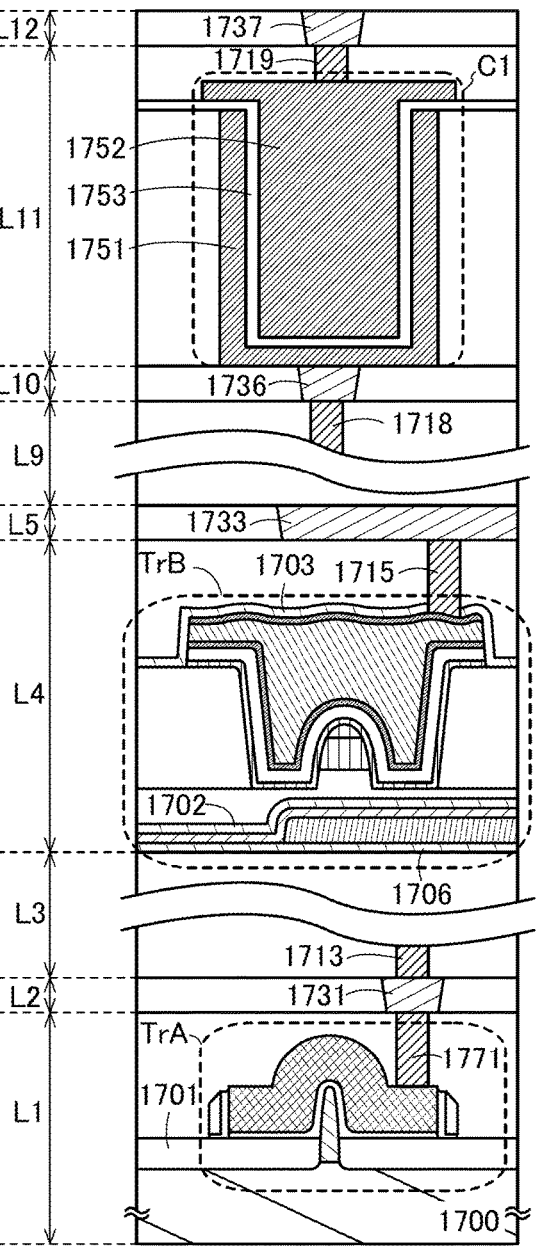

All OS transistors in an electronic device may be formed in the same tier. An example of such a case is illustrated in FIGS. 27A and 27B. Similarly to FIGS. 26A and 26B, FIG. 27A illustrates a cross section in a channel length direction of transistors included in the memory cell MC of the electronic device, and FIG. 27B illustrates a cross section in a channel width direction of the transistors included in the memory cell array MC of the electronic device.

The cross-sectional views of FIGS. 27A and 27B are different from those of FIGS. 26A and 26B in that the tiers L6 to L8 are omitted and the tier L9 is formed on the tier L5. For the other details in FIGS. 27A and 27B, the description of FIGS. 26A and 26B is referred to.

Embodiment 7

In this embodiment, an example of an electronic component and application examples of an electronic device including the electronic component will be described with reference to FIGS. 29A and 29B and FIGS. 30A to 30F.

<Electronic Component>

Figure 29A:
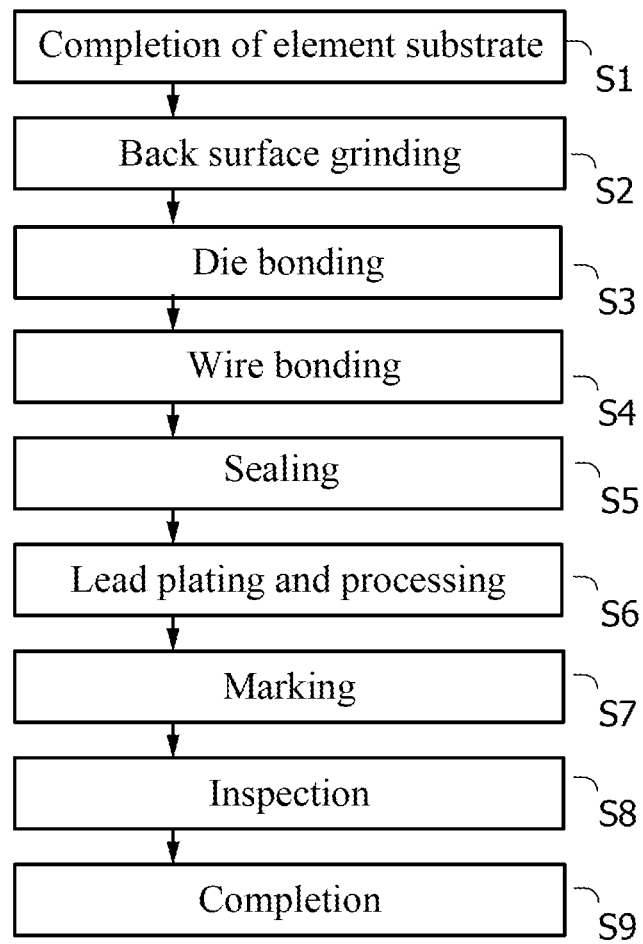
FIGS. 29A and 29B are a flow chart illustrating manufacturing steps of an electronic device and an example of a perspective view of the electronic device.

FIG. 29A illustrates an example of an electronic component. Note that the electronic component is also referred to as a semiconductor package or an IC package. This electronic component has various standards and names depending on the direction and the shape of terminals. Therefore, an example of the electronic component will be described in this embodiment.

The electronic component is completed through an assembly process (post-process) of integrating detachable components on a printed board.

The post-process can be completed through the steps in FIG. 29A. Specifically, after an element substrate obtained in the preceding process is completed (Step S1), a back surface of the substrate is ground (Step S2). The substrate is thinned in this step to reduce substrate warpage or the like caused in the preceding process and to reduce the size of the component.

After the back surface of the substrate is ground, a dicing step is performed to divide the substrate into a plurality of chips. Then, the divided chips are separately picked up, placed on a lead frame, and bonded thereto in a die bonding step (Step S3). In the die bonding step, the chip is bonded to the lead frame by an appropriate method depending on products, for example, bonding with a resin or a tape. Note that in the die bonding step, a chip may be placed on and bonded to an interposer.

Note that in this embodiment, when an element is formed on a surface of a substrate, the other surface is referred to as a back surface (a surface on which the element is not formed).

Next, wire bonding for electrically connecting a lead of the lead frame and an electrode on the chip through a metal wire is performed (Step S4). As the metal wire, a silver wire or a gold wire can be used. Ball bonding or wedge bonding can be used as the wire bonding.

The wire-bonded chip is subjected to a molding step of sealing the chip with an epoxy resin or the like (Step S5). Through the molding step, the inside of the electronic component is filled with a resin, whereby damage to a mounted circuit portion and wire caused by external mechanical force as well as deterioration of characteristics due to moisture or dust can be reduced.

Subsequently, the lead of the lead frame is plated. Then, the lead is cut and processed (Step S6). This plating process prevents rust of the lead and facilitates soldering at the time of mounting the chip on a printed board in a later step.

Next, printing (marking) is performed on a surface of the package (Step S7). After a final testing step (Step S8), the electronic component is completed (Step S9).

Figure 29B:
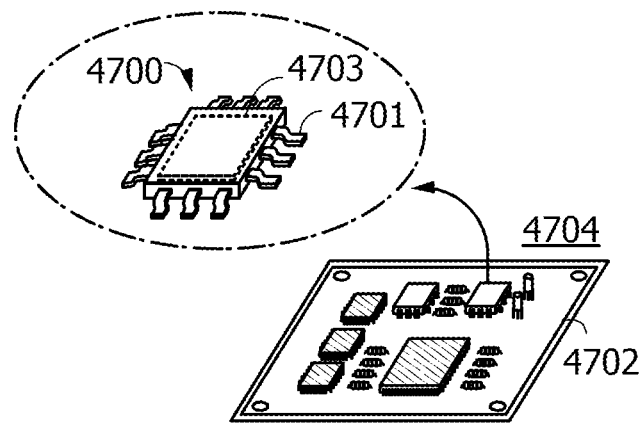

FIG. 29B is a perspective schematic diagram illustrating a quad flat package (QFP) as an example of the completed electronic component. An electronic component 4700 in FIG. 29B includes a lead 4701 and a circuit portion 4703. The electronic component 4700 in FIG. 29B is mounted on a printed board 4702, for example. A plurality of electronic components 4700 which are combined and electrically connected to each other over the printed board 4702 can be mounted on an electronic device. A completed circuit board 4704 is provided in an electronic device or the like.

<Electronic Device>

Next, electronic devices including the aforementioned electronic component will be described.

Examples of the disclosed electronic device are display devices, personal computers, or image reproducing devices provided with recording media (typically, devices that reproduce the content of recording media such as digital versatile discs (DVDs) and have displays for displaying the reproduced images). Other examples of the disclosed electronic devices are cellular phones, game machines including portable game machines, portable information terminals, e-book readers, cameras such as video cameras and digital still cameras, goggle-type displays (head-mounted displays), navigation systems, audio reproducing devices (e.g., car audio systems and digital audio players), copiers, facsimiles, printers, multifunction printers, automated teller machines (ATM), vending machines, and medical devices. FIGS. 30A to 30F illustrate specific examples of these electronic devices.

Figure 30A:
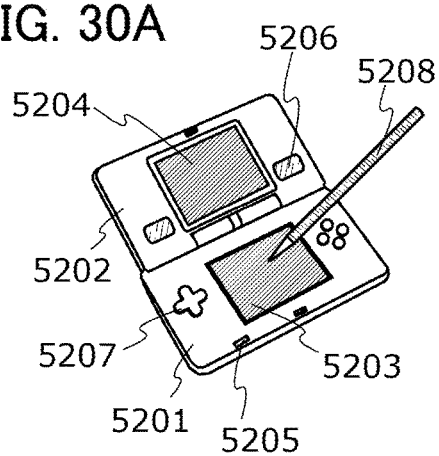
FIGS. 30A to 30F illustrate examples of electronic devices.

FIG. 30A illustrates a portable game machine which includes a housing 5201, a housing 5202, a display portion 5203, a display portion 5204, a microphone 5205, a speaker 5206, an operation key 5207, a stylus 5208, and the like. Although the portable game machine in FIG. 30A has the two display portions 5203 and 5204, the number of display portions included in a portable game machine is not limited to two.

Figure 30B:
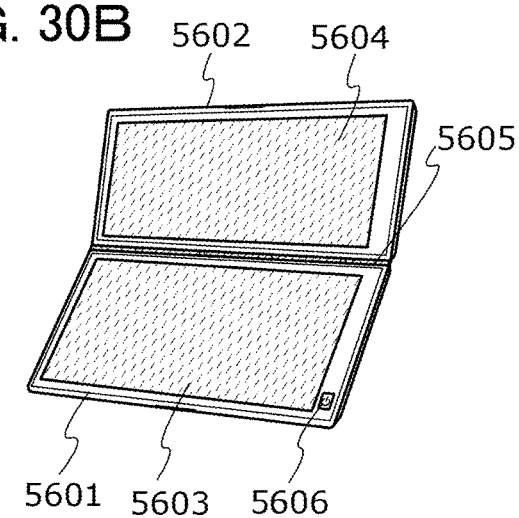

FIG. 30B illustrates a portable information terminal which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as the first display portion 5603 and/or the second display portion 5604. Note that the position input function can be added by providing a touch panel in a display device. Alternatively, the position input function can be added by providing a photoelectric conversion element called a photosensor in a pixel portion of a display device.

Figure 30C:
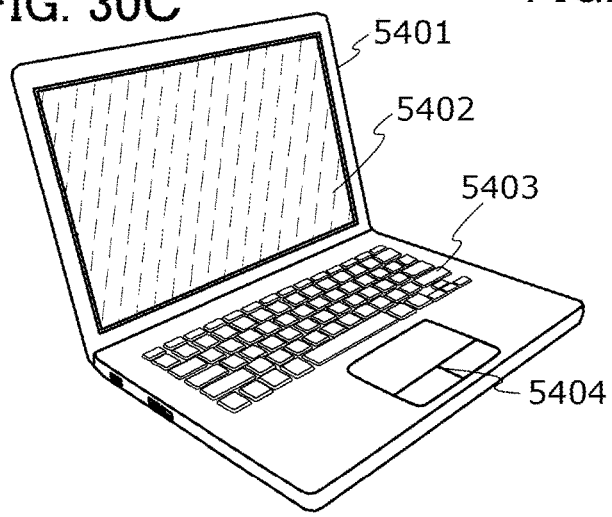

FIG. 30C illustrates a notebook personal computer which includes a housing 5401, a display portion 5402, a keyboard 5403, a pointing device 5404, and the like.

Figure 30D:
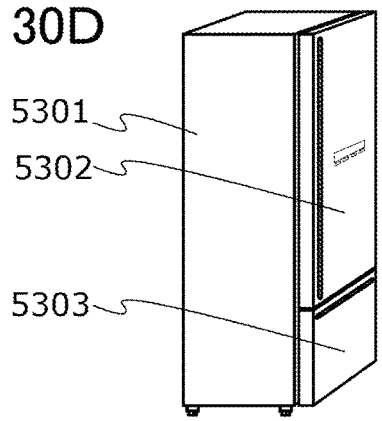

FIG. 30D illustrates an electric refrigerator-freezer which includes a housing 5301, a refrigerator door 5302, a freezer door 5303, and the like.

Figure 30E:
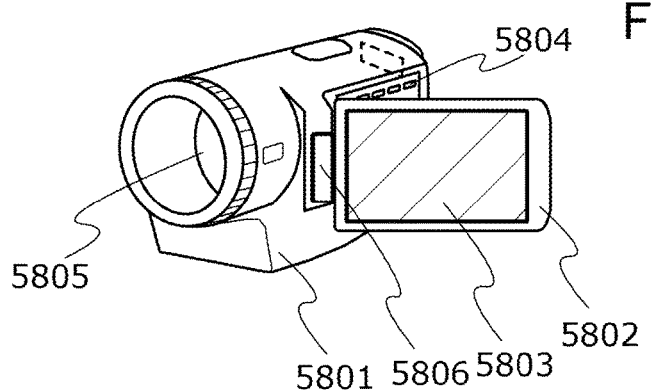

FIG. 30E illustrates a video camera which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 30F:
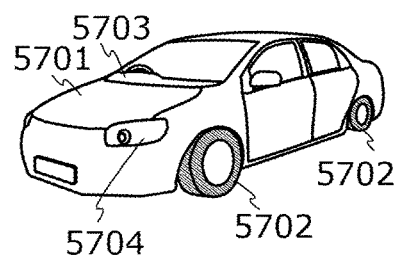

FIG. 30F illustrates a car which includes a car body 5701, wheels 5702, a dashboard 5703, lights 5704, and the like.

This application is based on Japanese Patent Application serial no. 2015-099677 filed with Japan Patent Office on May 15, 2015, the entire contents of which are hereby incorporated by reference.

What is claimed is:
1. An electronic device comprising:
a bit line;
first to N-th switching elements; and
first to N-th sense amplifier regions,
wherein the first to the N-th sense amplifier regions each include a first terminal,
wherein the first to the (N−1)-th sense amplifier regions each include a second terminal,
wherein a first terminal of an n-th sense amplifier region, a second terminal of an n-th sense amplifier region, a first terminal of an (n+1)-th sense amplifier region, and a second terminal of an (n+1)-th sense amplifier region are arranged in this order in a circuit diagram,
wherein the first switching element is between the bit line and the first terminal of the first sense amplifier region,
wherein the first switching element is configured to electrically connect or electrically isolate the bit line and the first terminal of the first sense amplifier region,
wherein an (n+1)-th switching element is between the second terminal of the n-th sense amplifier region and the first terminal of the (n+1)-th sense amplifier region,
wherein the (n+1)-th switching element is configured to electrically connect or electrically isolate the second terminal of the n-th sense amplifier region and the first terminal of the (n+1)-th sense amplifier region,
wherein the first to the N-th sense amplifier regions each comprise a sense amplifier and a switch that operates in accordance with an output of the sense amplifier,
wherein the switch is configured to electrically connect or electrically isolate the first terminal and the second terminal,
wherein at the time when the sense amplifiers terminate an amplification process, (A) the bit line is electrically connected to the first terminal of an m-th sense amplifier region and the first terminal and the second terminal are electrically isolated from each other in each of the m-th to the (N−1)-th sense amplifier regions, or (B) the bit line is electrically connected to the first terminal of the N-th sense amplifier region,
wherein a potential of the bit line corresponds to a read potential, and
wherein N is an integer greater than or equal to 2, n is an integer greater than or equal to 1 and less than or equal to (N−1), and m is an integer that is determined in accordance with the read potential and is greater than or equal to 1 and less than or equal to (N+1).

2. The electronic device according to claim 1, wherein each of the first to the (N−1)-th sense amplifier regions is configured to supply a write potential to the first terminal in accordance with one of or both a first output signal and a second output signal of the sense amplifier.

3. The electronic device according to claim 2, wherein each of the first to the (N−1)-th sense amplifier regions is configured to electrically connect or electrically isolate the first terminal and the second terminal in accordance with one of or both a first output signal and a second output signal of the sense amplifier.

4. The electronic device according to claim 2, wherein each of the first to the (N−1)-th sense amplifier regions is configured such that the first terminal and the second terminal are electrically isolated from each other when the write potential is supplied to the first terminal.

5. The electronic device according to claim 2, wherein a write potential of the n-th sense amplifier region is configured to be higher than a write potential of the (n+1)-th sense amplifier region.

6. The electronic device according to claim 2,
wherein a potential of the first terminal is configured to be input to a first input terminal of the sense amplifier in a first period,
wherein a reference potential is configured to be input to a second input terminal of the sense amplifier in a second period, and
wherein the first period and the second period overlap with each other.

7. The electronic device according to claim 2, wherein a reference potential of the n-th sense amplifier region is configured to be higher than a write potential of the (n+1)-th sense amplifier region.

8. The electronic device according to claim 2, wherein a write potential of each of the first to the (N−1)-th sense amplifier regions is configured to be equal to the first output signal of the sense amplifier.

9. An electronic device comprising:
a bit line;
a transistor;
a capacitor;
first to N-th switching elements; and
first to N-th sense amplifier regions, wherein a first terminal of the transistor is electrically connected to the bit line,
wherein a second terminal of the transistor is electrically connected to the capacitor,
wherein the transistor comprises an oxide semiconductor material,
wherein the first to the N-th sense amplifier regions each comprise a first terminal, a sense amplifier, and a switching element,
wherein the first to an (N−1)-th sense amplifier regions each comprise a second terminal,
wherein a first terminal of the first switching element is electrically connected to the bit line,
wherein a second terminal of the first switching element is electrically connected to the first terminal of the first sense amplifier region,
wherein a first terminal of an (n+1)-th switching element is electrically connected to a second terminal of an n-th sense amplifier region,
wherein a second terminal of the (n+1)-th switching element is electrically connected to a first terminal of an (n+1)-th sense amplifier region,
wherein a first terminal of a switching element of an n-th sense amplifier region is electrically connected to a first terminal of the n-th sense amplifier region,
wherein a second terminal of the switching element of the n-th sense amplifier region is electrically connected to the second terminal of the n-th sense amplifier region,
wherein a sense amplifier of the n-th sense amplifier region is electrically connected to the first terminal of the n-th sense amplifier region,
wherein the sense amplifier of the n-th sense amplifier region is electrically connected to the first terminal of the switching element of the n-th sense amplifier region, and
wherein N is an integer greater than or equal to 2, and n is an integer greater than or equal to 1 and less than or equal to (N−1).

10. The electronic device according to claim 9, wherein a write potential of the n-th sense amplifier region is configured to be higher than a write potential of the (n+1)-th sense amplifier region.

11. The electronic device according to claim 9, wherein a reference potential of the n-th sense amplifier region is configured to be higher than a write potential of the (n+1)-th sense amplifier region.

12. The electronic device according to claim 9, wherein the first to N-th switching elements comprise an oxide semiconductor.

13. The electronic device according to claim 9, wherein the oxide semiconductor comprises In, Ga, or Zn.

14. An electronic device comprising:
a bit line;
a transistor;
a capacitor;
first to N-th switching elements; and
first to N-th sense amplifier regions,
wherein a first terminal of the transistor is electrically connected to the bit line,
wherein a second terminal of the transistor is electrically connected to the capacitor,
wherein the transistor comprises an oxide semiconductor material,
wherein the first to the N-th sense amplifier regions each comprise a first terminal, a sense amplifier, and a switching element,
wherein the first to an (N−1)-th sense amplifier regions each comprise a second terminal,
wherein a first terminal of the first switching element is electrically connected to the bit line,
wherein a second terminal of the first switching element is electrically connected to the first terminal of the first sense amplifier region,
wherein a first terminal of an (n+1)-th switching element is electrically connected to a second terminal of an n-th sense amplifier region,
wherein a second terminal of an (n+1)-th switching element is electrically connected to a first terminal of an (n+1)-th sense amplifier region,
wherein a first terminal of a switching element of the n-th sense amplifier region is electrically connected to a first terminal of the n-th sense amplifier region,
wherein a second terminal of the switching element of the n-th sense amplifier region is electrically connected to the second terminal of the n-th sense amplifier region,
wherein a sense amplifier of the n-th sense amplifier region is electrically connected to the first terminal of the n-th sense amplifier region,
wherein the sense amplifier of the n-th sense amplifier region is electrically connected to the first terminal of the switching element of the n-th sense amplifier region,
wherein (A) the bit line is electrically connected to a first terminal of an m-th sense amplifier region and a switching element of each of the m-th to the N-th sense amplifier regions is off, or (B) a switching element of each of the first to the N-th sense amplifier regions is on, and
wherein N is an integer greater than or equal to 2, n is an integer greater than or equal to 1 and less than or equal to (N−1), and m is an integer that is determined in accordance with a read potential and is greater than or equal to 1 and less than or equal to (N+1).

15. The electronic device according to claim 14, wherein a write potential of the n-th sense amplifier region is configured to be higher than a write potential of the (n+1)-th sense amplifier region.

16. The electronic device according to claim 14, wherein a reference potential of the n-th sense amplifier region is configured to be higher than a write potential of the (n+1)-th sense amplifier region.

17. The electronic device according to claim 14, wherein the first to N-th switching elements comprise an oxide semiconductor.

18. The electronic device according to claim 14 wherein the oxide semiconductor comprises In, Ga, or Zn.

* * * * *